(12) United States Patent
Barabi et al.

(10) Patent No.: US 9,229,049 B2
(45) Date of Patent: Jan. 5, 2016

(54) SYSTEMS AND METHODS FOR CONFORMING TEST TOOLING TO INTEGRATED CIRCUIT DEVICE PROFILES WITH COMPLIANT PEDESTALS

(71) Applicant: ESSAI, INC., Fremont, CA (US)

(72) Inventors: Nasser Barabi, Lafayette, CA (US); Chee Wah Ho, Fremont, CA (US); Joven R. Tienzo, Fremont, CA (US); Oksana Kryachek, San Francisco, CA (US); Elena V. Nazarov, San Mateo, CA (US)

(73) Assignee: Essai, Inc., Fremont, CA (US)

( * ) Notice: Subject to any disclaimer, the term of this patent is extended or adjusted under 35 U.S.C. 154(b) by 195 days.

(21) Appl. No.: 13/935,439

(22) Filed: Jul. 3, 2013

(65) Prior Publication Data

US 2014/0015556 A1    Jan. 16, 2014

Related U.S. Application Data

(63) Continuation-in-part of application No. 13/830,633, filed on Mar. 14, 2013, now Pat. No. 9,007,080, which is a continuation-in-part of application No. 13/562,305, filed on Jul. 30, 2012, now Pat. No. 8,981,802, which is a continuation-in-part of application No. 13/081,439, filed on Apr. 6, 2011, now Pat. No. 8,653,842, which is a continuation-in-part of application No. 12/957,306, filed on Nov. 30, 2010, now Pat. No. 8,508,245.

(60) Provisional application No. 61/265,285, filed on Nov. 30, 2009.

(51) Int. Cl.
*G01R 31/00* (2006.01)
*G01R 31/28* (2006.01)
*G01R 1/04* (2006.01)

(52) U.S. Cl.
CPC .......... *G01R 31/2874* (2013.01); *G01R 1/0458* (2013.01)

(58) Field of Classification Search
CPC .......... G01R 31/26; G01R 31/02; G01R 1/04; G01R 31/2891; G01R 1/0458; G01R 31/2874; G01R 1/0466; G01R 31/2865
USPC .............................. 324/750.03–750.09, 755, 324/760.01–765.01, 756.02, 756.04
See application file for complete search history.

(56) References Cited

U.S. PATENT DOCUMENTS

| | | | |
|---|---|---|---|
| 6,360,544 B1 * | 3/2002 | Albertson | 62/3.7 |
| 2007/0042880 A1 * | 2/2007 | Ratner | 482/121 |
| 2009/0321901 A1 * | 12/2009 | Lopez et al. | 257/675 |

* cited by examiner

*Primary Examiner* — Son Le
(74) *Attorney, Agent, or Firm* — Kang S. Lim

(57) ABSTRACT

A test socket assembly, useful in association with a thermal control unit used to maintain a set point temperature on an IC device under test, has at least one compliant pedestal is configured to facilitate the testing of integrated circuits where the device under test comprises a substrate having multiple IC chips with different heights and testing requirements.

12 Claims, 46 Drawing Sheets

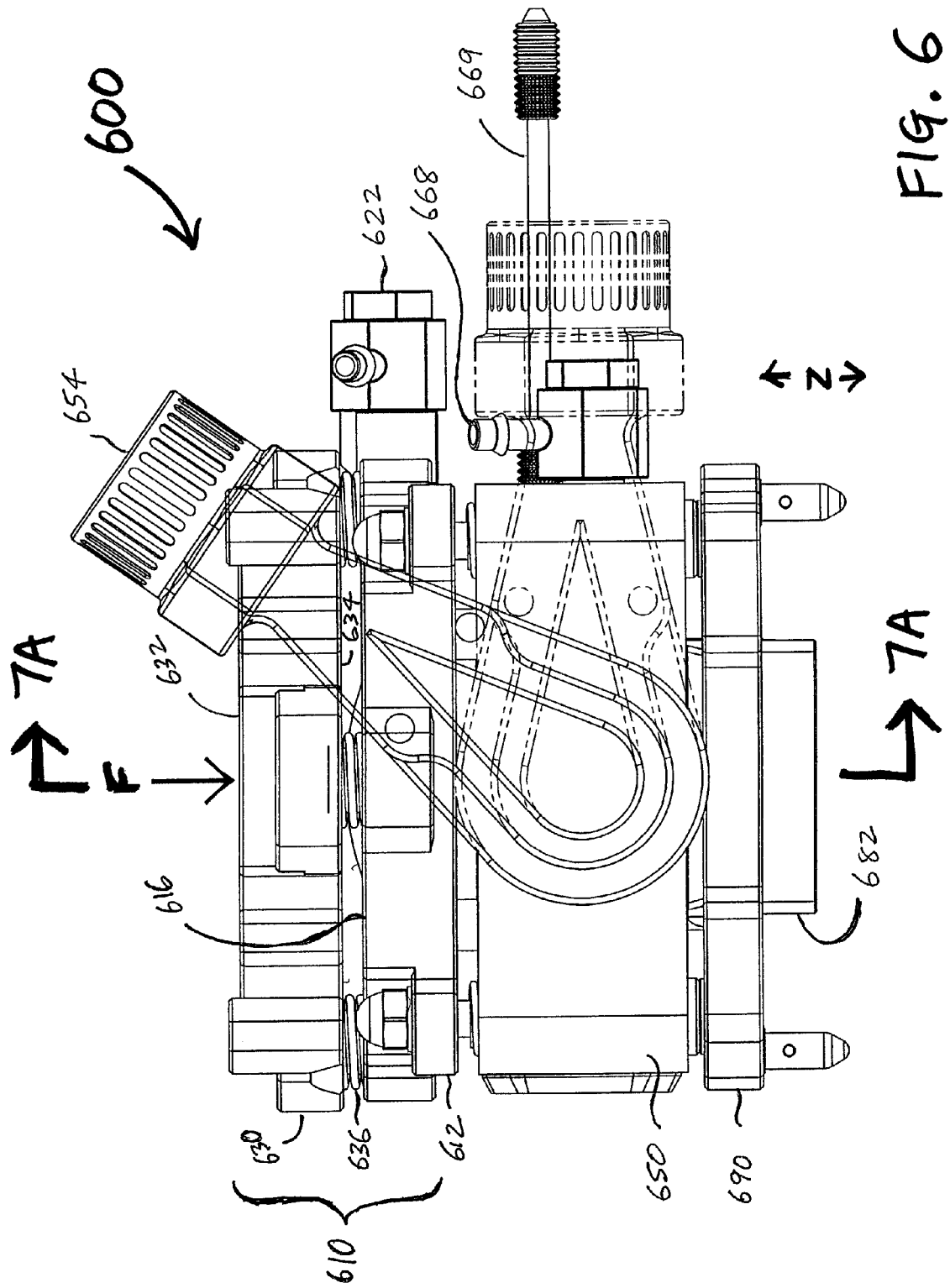

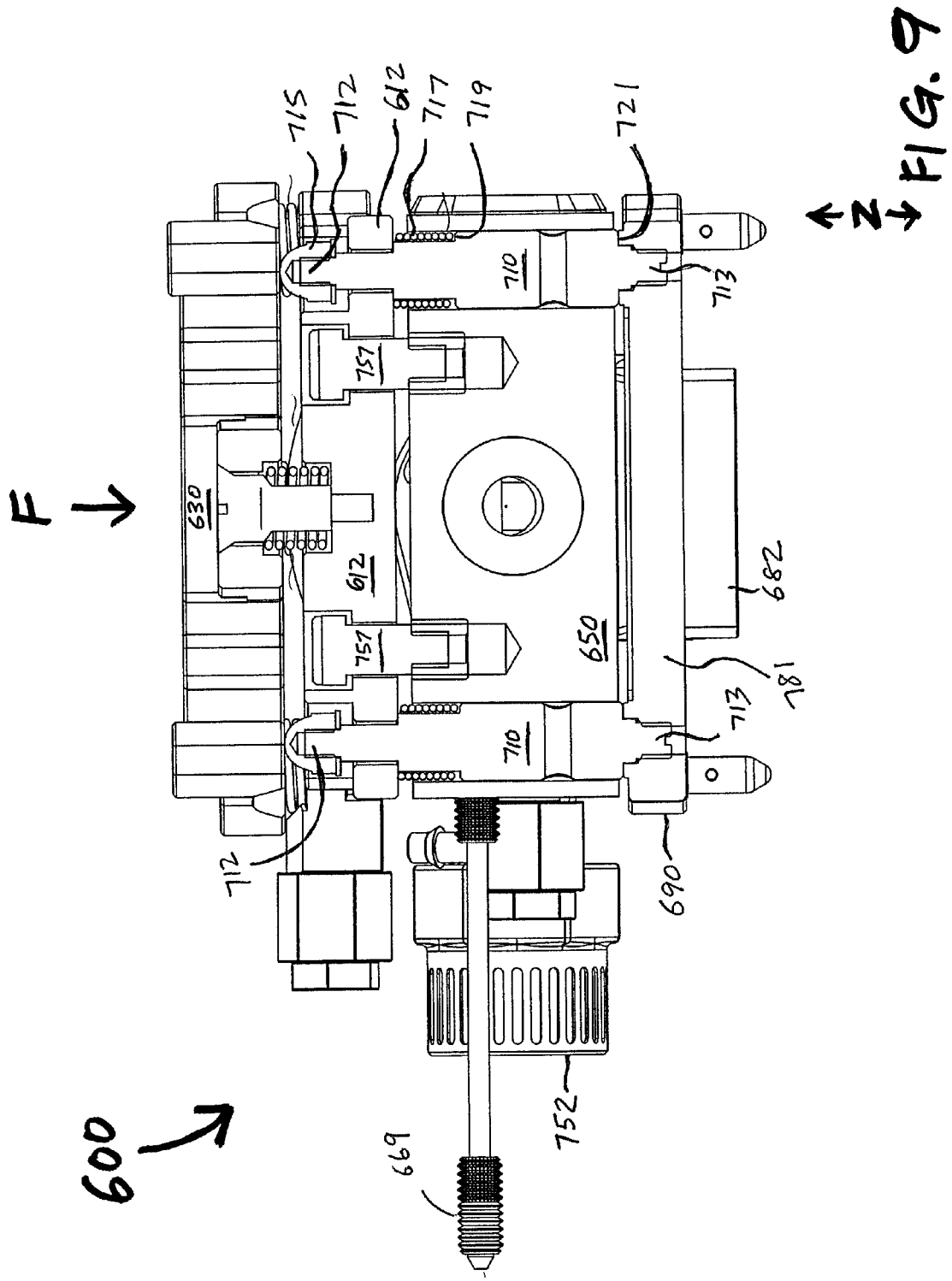

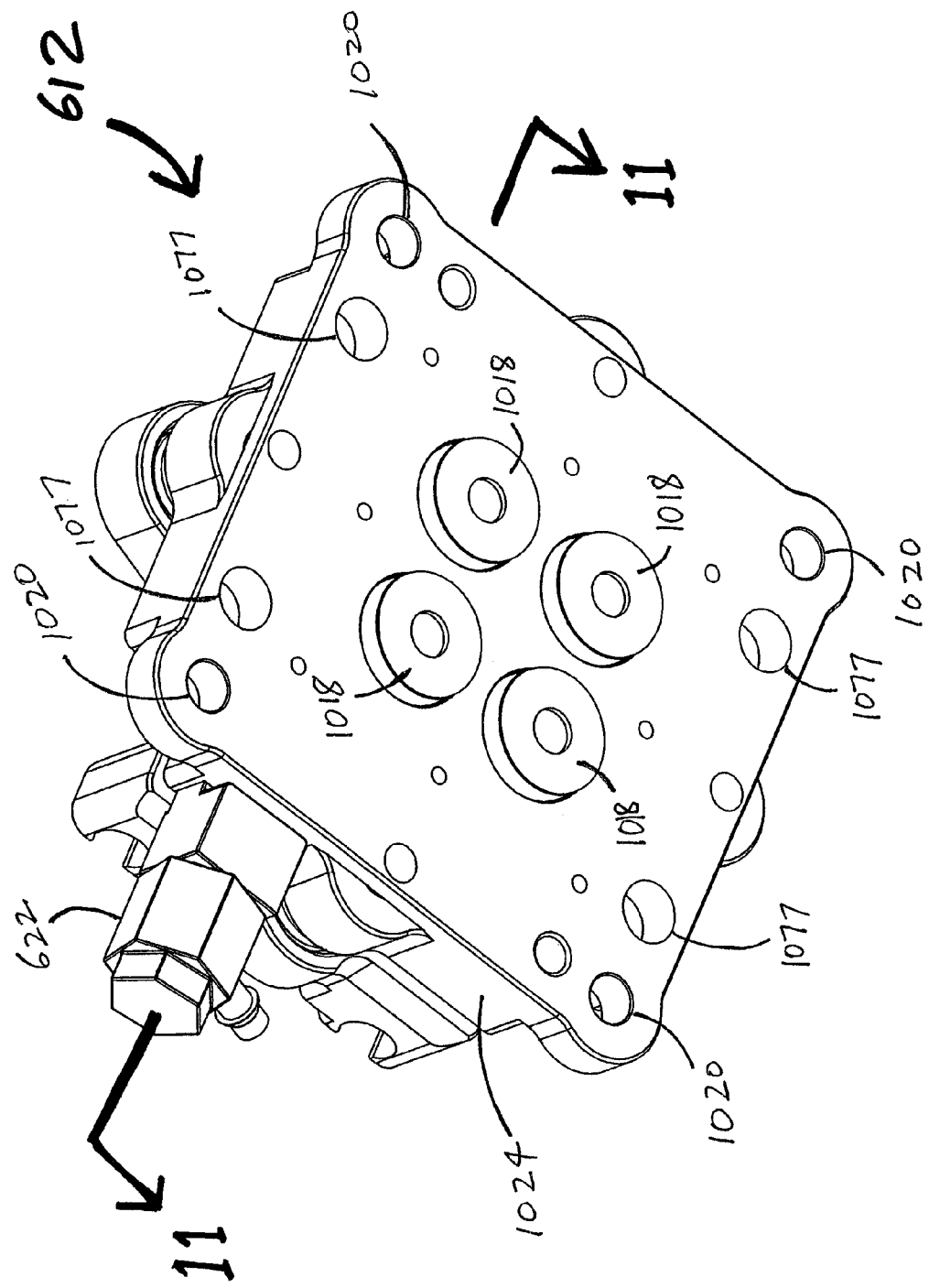

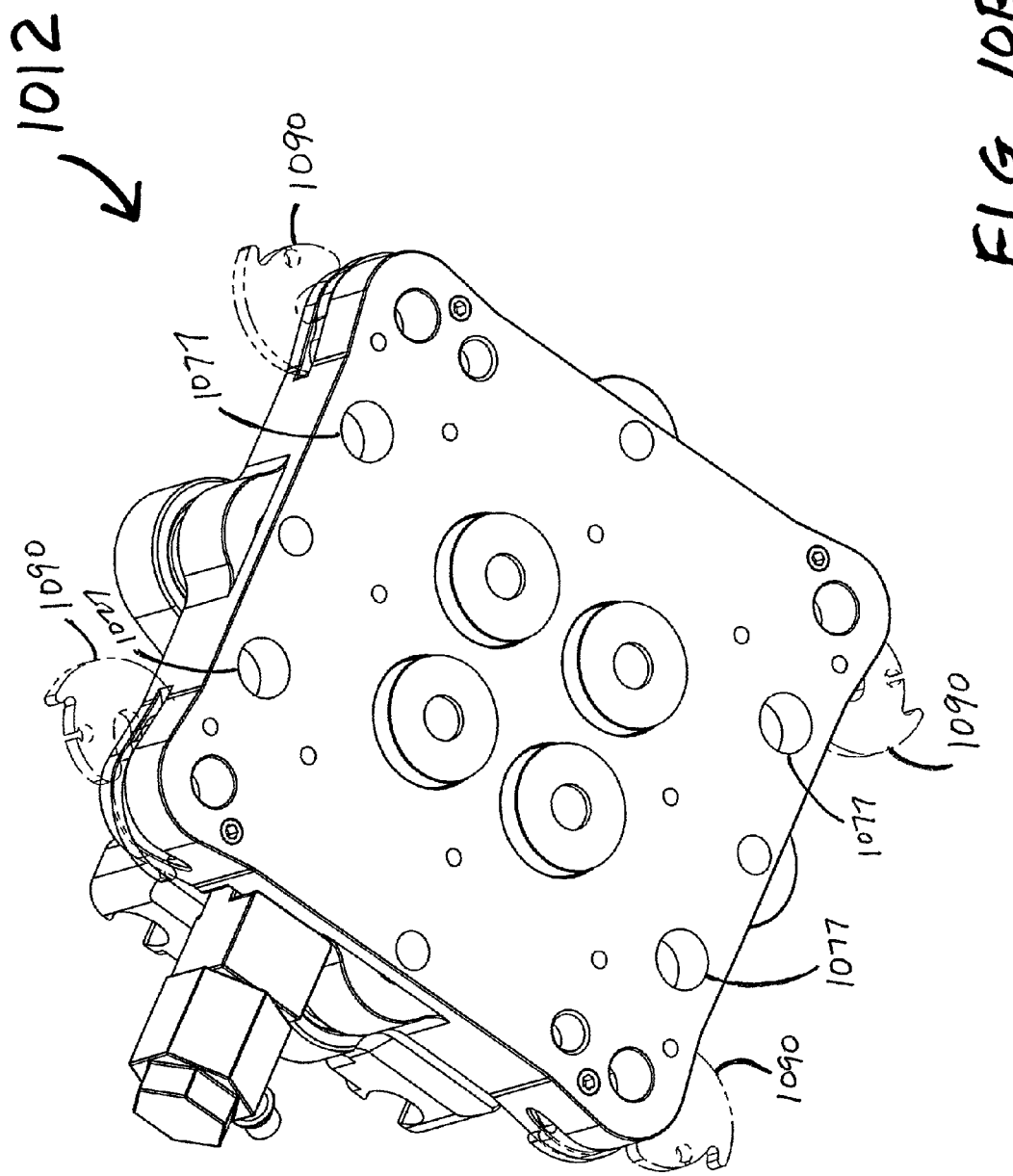

Rest Condition

Test Condition

SYSTEMS AND METHODS FOR CONFORMING TEST TOOLING TO INTEGRATED CIRCUIT DEVICE PROFILES WITH COMPLIANT PEDESTALS

CROSS REFERENCE TO RELATED APPLICATIONS

This is a continuation-in-part and claims benefit of U.S. application Ser. No. 13/830,633 filed on Mar. 14, 2013, entitled "Systems and Methods for Conforming Device Testers to Integrated Circuit Device Profiles with Feedback Temperature Control", which is a continuation-in-part and claims benefit of U.S. application Ser. No. 13/562,305 filed on Jul. 30, 2012, entitled "Systems and Methods for Conforming Device Testers to Integrated Circuits Device Profiles", which is a continuation-in-part and claims benefit of U.S. application Ser. No. 13/081,439 filed on Apr. 6, 2011, entitled "Systems and Methods for Thermal Control of Integrated Circuits during Testing", which in turn is a continuation-in-part and claims benefit of U.S. application Ser. No. 12/957,306 filed on Nov. 30, 2010, entitled "Improved Thermal Control Unit Used to Maintain the Temperature of IC Devices Under Test", which claims benefit of U.S. Provisional Patent Application No. 61/265,285 filed Nov. 30, 2009, all applications are hereby fully incorporated by reference.

BACKGROUND

The present invention generally relates to the testing of IC devices such as packaged semiconductor chips (also referred to as packaged dies), and more particularly relates to device testers configured to conform to the shape of integrated circuit (IC) devices under test (DUTs).

Conventional integrated circuit devices include a die, incorporating the IC, attached a substrate. The die is bonded electrically (e.g. solder) and physically (e.g. epoxy) to the top of the substrate, at an elevated temperature sufficient to melt solder and to cure the epoxy.

Initially, before they are bonded to each other, both the substrate and the die are flat. However as illustrated by the simplified and exaggerated cross-sectional view (not to scale) of FIG. 12A, during the cooling process after heated bonding process, device 1280A becomes slightly curved (slightly bowed like the top of a mushroom) because of a mismatch of expansion and contraction coefficients of the die and the substrate.

The curvature of the device at room temperature (after cooling) should not be a problem because during the assembly of the device to a motherboard, at the elevated reflow temperature (sufficient to melt solder paste) inside a surface mount technology (SMT) reflow oven, the reheated device should become substantially flat again, thereby ensuring satisfactory electrical bonds between the device pads and the motherboard contacts.

Ideally, the curvature of the device should be preserved prior to assembly to the motherboard. However, these devices need to be tested for proper functionality at different temperatures prior to assembly to the motherboard. Typical device testers are designed with the assumption that the devices under test (DUTs) are flat. As a consequence, the flat profiles of the pedestal, the substrate pusher and the test socket result in undue pressure being exerted on the curved DUT, especially on the die, during testing.

This undue pressure problem is exacerbated by the existence of other components, in addition to the die, on the same substrate. So in a typical tester, the pedestal and the substrate pusher only contact the die and the perimeter of the substrate, respectively, leaving the remaining surface of the substrate, where the other components reside, unsupported.

As a result, after testing the surface of the device is somewhat flattened due to the undue pressure from the pedestal and the pusher, and often uneven, due to the uneven pressure between the supported and unsupported surfaces of the DUT. FIG. 12B is a simplified and exaggerated cross-section view (not to scale) of one such exemplary post-testing uneven, e.g., wavy, device 1280B.

Hence there is an urgent need for improved device tester designs that do not unduly deform the DUTs, especially for devices with thinner substrates needed for manufacturing compact portable electronic devices such as smart phones and tablets.

SUMMARY

To achieve the foregoing and in accordance with the present invention, systems and methods for testing of IC devices such as packaged semiconductor chips, while conforming to the shape of the IC device under test (DUT).

In one embodiment, an IC device tester configured to maintain a set point temperature on the DUT having a substrate having a die attached to an upper surface thereof, and also configured to conform to the profile of the DUT. The device tester includes a thermal control unit and a test socket assembly.

The thermal control unit includes a pedestal assembly with a heat-conductive pedestal having a bottom end configured to contact the die of the DUT, a temperature-control fluid circulation block, a thermally-conductive heater having a fuse coupled to a heating element, a substrate pusher configured to contact the substrate of the DUT, and a controllable force distributor for receiving a z-axis force and controllably distribute such z-axis force between the pedestal assembly and the substrate pusher. The test socket assembly includes a test socket operatively coupled to a socket insert for supporting the DUT. The socket insert has a shaped profile substantially conforming to a corresponding profile of the DUT.

In some embodiments, the test socket assembly has an elevator mechanism that includes a plurality of spring-loaded suspension support pins for supporting the socket insert. The test socket assembly may also include a plurality of spring-loaded test pins. The support pins enable the test pins to be withdrawn while in a rest condition and further enable the test pins to protrude during a test condition.

In a further embodiment, the test socket assembly has at least one compliant pedestal configured to facilitate the testing of integrated circuits where the DUT comprises a substrate having multiple IC chips with different testing requirements in terms of forces applied and temperatures of testing.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which:

FIG. 6 is a side view of another exemplary embodiment of a thermal control unit in accordance with the present invention;

FIG. 7A is cross-sectional view thereof taken along section lines 7A-7A in FIG. 6, while

FIG. 9 is another cross-sectional view thereof taken along section lines 9-9 in FIG. 7A;

FIG. 10A is a bottom perspective view of an exemplary z-axis load distributor actuator block for the z-axis force distribution system of the TCU 600 shown in FIGS. 6-9;

FIG. 10B is a bottom perspective view of an alternative embodiment of the z-axis load distributor actuator block of FIG. 10A;

DETAILED DESCRIPTION

Figure 1:
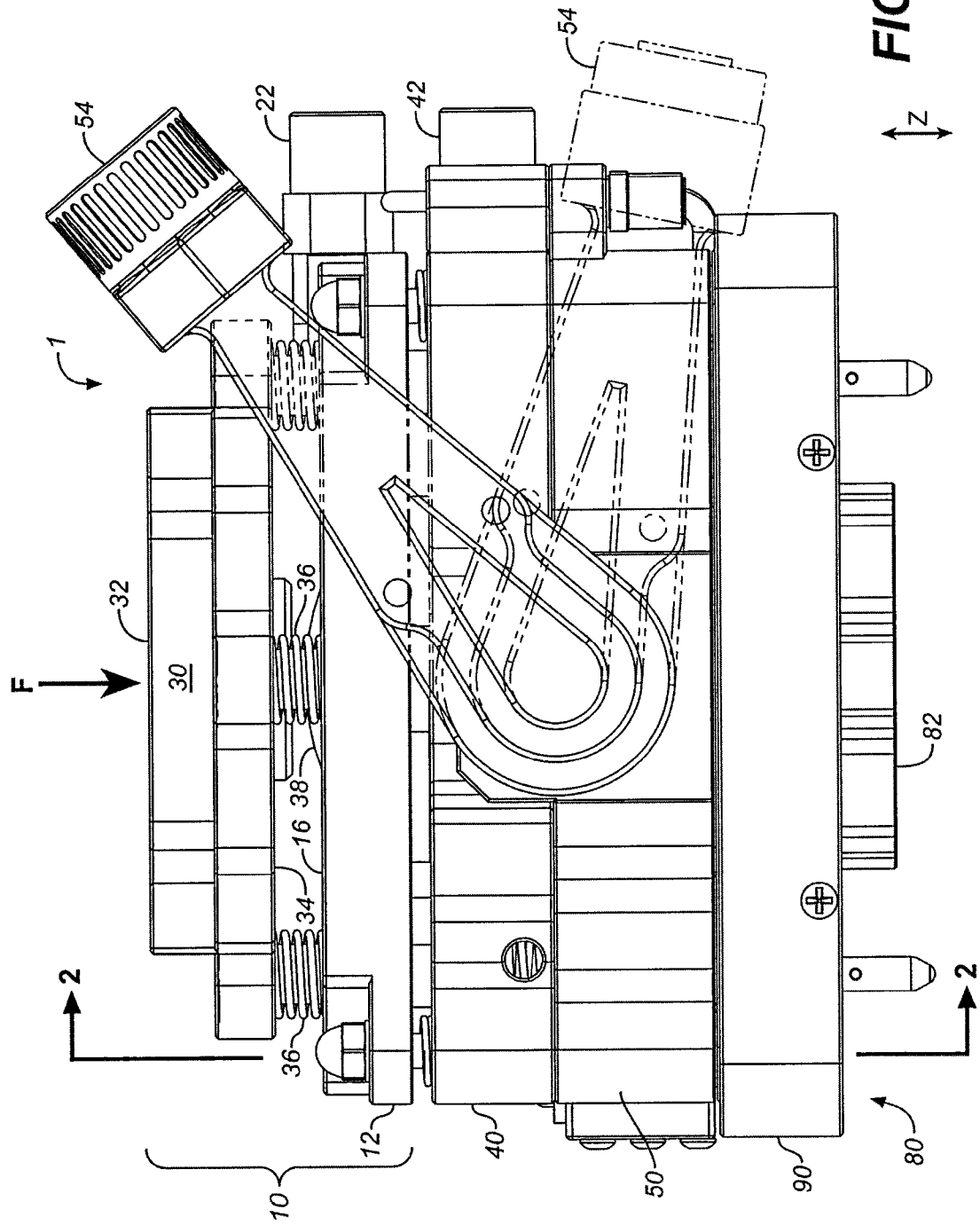
FIG. 1 is a side view of an exemplary thermal control unit that includes a z-axis force balancing mechanism in accordance with one aspect of the invention.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute terms, such as, for example, "will," "will not," "shall," "shall not," "must," and "must not," are not meant to limit the scope of the present invention as the embodiments disclosed herein are merely exemplary.

Before describing the present invention in detail, it is to be understood that the invention is not limited to the TCU illustrated herein. It is also to be understood that the terminology used herein is for describing particular embodiments only, and is not intended to be limiting.

In addition, as used in this specification and the appended claims, the singular article forms "a," "an," and "the" include both singular and plural referents unless the context of their usage clearly dictates otherwise. Thus, for example, reference to "a piston" includes a plurality of springs as well as a single piston, reference to "an outlet" includes a single outlet as well as a collection of outlets, and the like.

In general, the invention relates to thermal control units (TCUs) that may be used to maintain a set point temperature on an IC device under test (DUT). The TCU can suitably include features common to those described in U.S. Pat. No. 7,663,388, which is incorporated herein by reference. Such features would include, in a z-axis stacked arrangement, a heat-conductive pedestal for contacting the DUT and containing a thermal sensor, a fluid circulation block, and a thermoelectric module (a Peltier device) or heater between the heat-conductive pedestal and the fluid circulation block for pumping heat away from the DUT and into the fluid circulating block (or for pumping heat into DUT). The common features would also include in the z-stack arrangement a spring loaded pusher mechanism for exerting a z-axis force compliant force that holds the fluid block, thermoelectric module (or heater) and heat conducting pedestal tightly together.

The present invention also relates to systems and methods for testing of IC devices such as packaged semiconductor chips (also referred to as packaged dies) while preserving the devices' original specifications, especially with respect to the IC devices physical characteristic.

The TCUs in accordance with the invention may be used on DUTs of different constructions. For example, the TCU may be used with IC devices having a lidded package that employs an integrated heat spreader (IHS) or with IC devices having a bare die chip package.

One aspect of the invention is directed to TCUs having different pushers used to push against different parts of a chip package. In this aspect of the invention, a z-axis load distribution system is provided for controllably distributing the total z-axis force applied to from the top of the TCU between different pushers so that a desired balance can be achieved for the exerted by the different pushers. For example, when a die pusher/pedestal and a substrate pusher are used in conjunction with bare die chip packages, the z-axis forces applied the die pusher/pedestal can be adjusted relative to with the pushing force applied by the substrate pusher to balance the loads on the die and substrate of the bare die package.

In another and separate aspect of the invention, at least one and preferably both the fluid inlet and/or fluid outlet for the fluid circulation block are swivelable, preferably about a swivel axis that is substantially perpendicular to the z-axis of the TCU. The swivel capability of the fluid inlet and outlet acts to reduce instability of the thermal control unit in response to z-axis movement of the temperature-control fluid block.

In a further and separate aspect of the invention, a means for abating condensation is provided. Such means includes a condensation-abating gas inlet and condensation-abating gas transporting passageways in the thermal control unit near surfaces of the thermal control unit on which condensation may occur.

An exemplary embodiment of a TCU in accordance with the invention is illustrated by FIGS. 1-5.

The thermal control unit 1 includes the following basic sections arranged in stacked relationship along the z-axis of the TCU: a force transmitting section 10 for transmitted a z-axis force denoted by the arrow F in FIG. 1 to the TCU's DUT contacting pushers as hereinafter described; an inner spring loaded pusher block section 40; a fluid circulation block section 50; a thermoelectric module (hereinafter Peltier device) section 60; and a heat conductive pedestal section 72 having a pusher end 76, which contains a temperature sensor 78, for contacting and pushing against a thermally active central portion of an IC chip, such as the die 104 of a bare die chip package 100. An outer pusher structure is also provided. This pusher structure, denoted by the numeral 80, includes a rigid bottom pusher plate 81 and is suitably fabricated of a metal material, such as aluminum, for rigidity. The bottom pusher plate has a center opening to allow the pusher end of the heat conducting pedestal to project through the pusher plate. A second DUT contacting pusher 82 extends from the bottom of the pusher plate around this center opening. This second pusher extends in the z-axis direction in parallel with the pusher end of the pedestal and contacts and pushes against another part of the IC chip, such as the substrate 102 of the bare die chip package.

The outer pusher structure additional includes a skirt 90 secured around the outer perimeter of the bottom pusher plate 81 and that extends upward in the z-axis direction.

Figure 3:
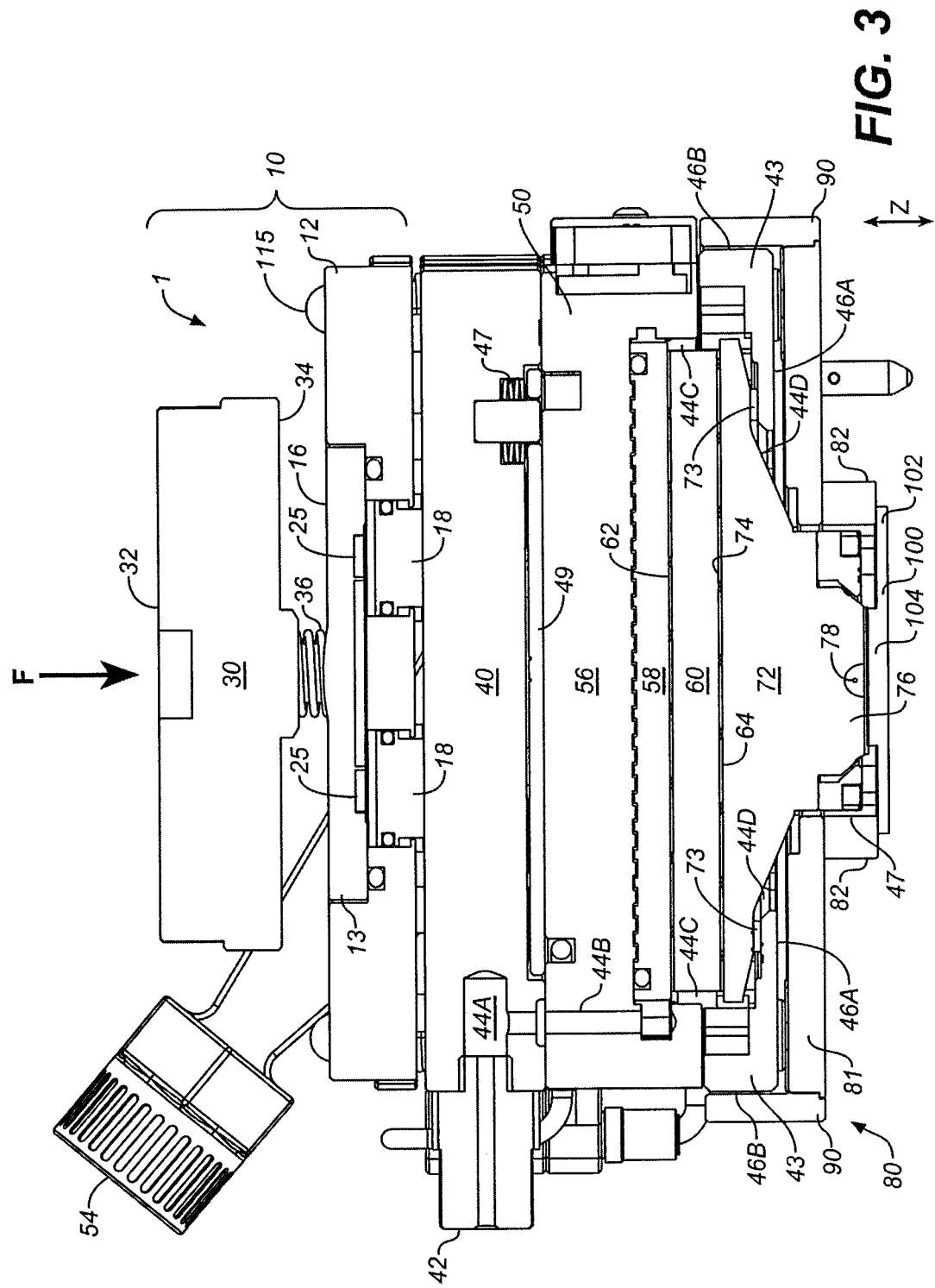
FIG. 3 is another cross-sectional view thereof taken along section lines 3-3 in FIG. 2.

Referring to FIG. 3, the fluid circulation block section 50 is seen to have a lower contact plate 58 at the bottom of block's main body 56. This lower contact plate is made of a good heat conductor such as copper and is suitable provided to achieve efficient heat conduction between the fluid circulation block section and the thermoelectric module 60. The upper section 56 of the may be formed from material that does not conduct heat as well as copper or other metals.

The force transmitting section 10 of the TCU includes a force distribution block 12 and can additionally include a gimbal adapter 30 above the force distribution block to form a gimbal. The gimbal adapter 30 includes a top coupler part 32 having upper and lower surfaces 32 and 34, with the upper surface of the coupler part being positioned to receive the indicated z-axis force F. The gimbal adaptor further includes springs 36 positioned beneath the lower surface of the top coupler part of the gimbal adaptor at the corners of the coupler part. Springs 36 are held in compression between the adaptor's coupler part and the upper surface 16 of the force distribution block 12 for preload gimbal stability.

Figure 2:
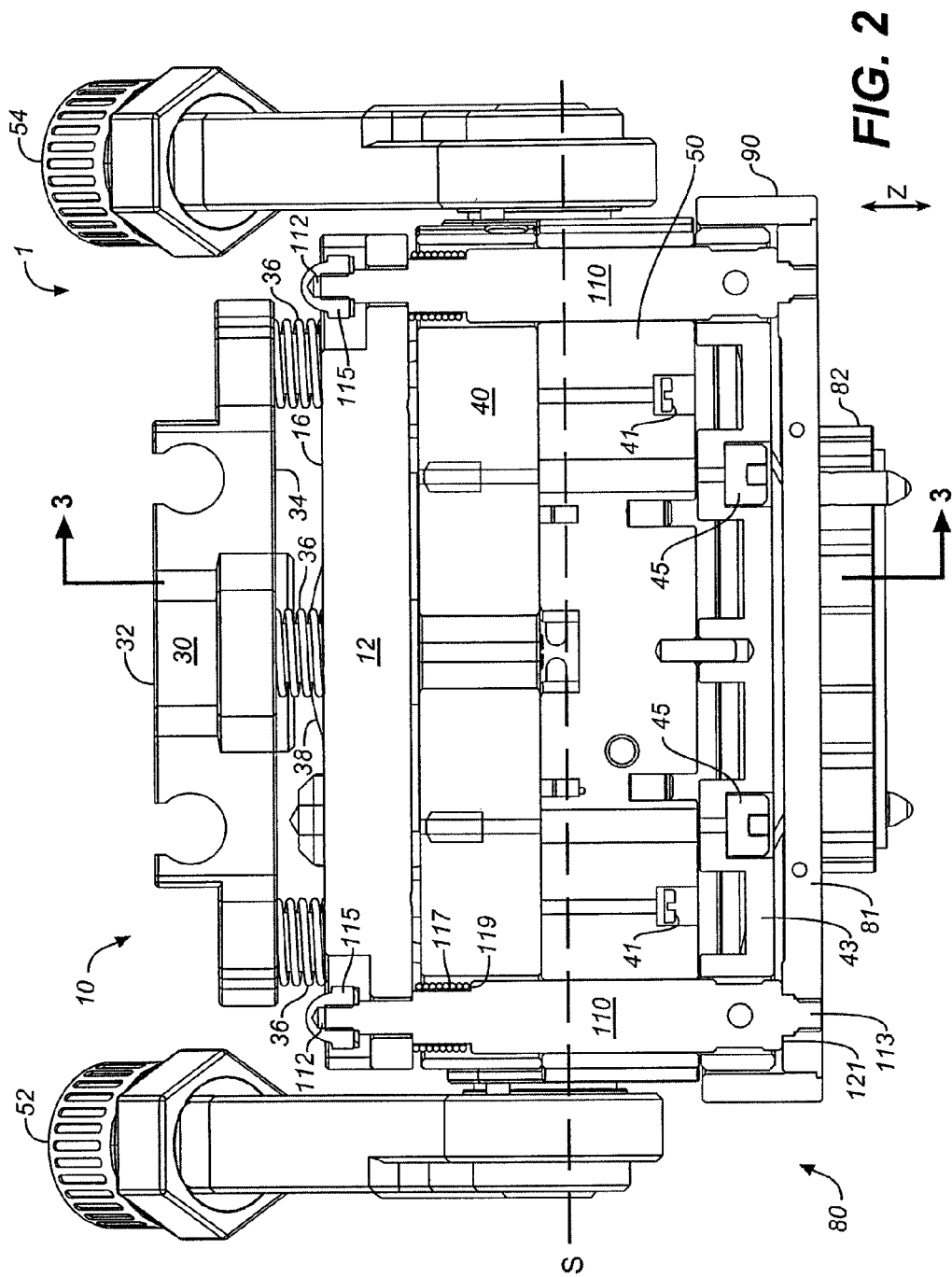
FIG. 2 is a cross-sectional view thereof taken along section lines 2-2 in FIG. 1.

As best seen in FIG. 2, the outer pusher structure is secured to the force distribution block 12 by force transfer shafts 110. These shafts freely pass through suitably sized holes in the inner spring loaded pusher block and fluid circulation block sections 40, 50. The bottom ends 113 of shafts 110 are suitably anchored to the pusher plate 81 near the outer perimeter of the plate, such as by threaded engagement, while the top ends 112 of the shafts extend through openings 20 (shown in FIG. 4) in the corners of the force distribution block and are topped by cap nuts 115, or any other captive mechanism that allows z-movement to retain the force distribution block on the shafts. As shown in FIG. 2, the force distribution block is compliantly supported on springs 117 provided around the recessed portion of the shaft beneath the force distribution block and which set on shoulders 119 presented by the recessed portion of the shaft. A z-axis force F applied to the force transmitting section 10 will thus be compliantly transmitted to pusher 82 of the outer pusher structure, and thus to the substrate 102 of bare die chip package 100. The springs can be used to pre-load the force distribution block to the inner pusher spring loaded block 40.

It is noted that bottom shoulders 121 are provided near the bottom end 113 of each of the force transfer shafts 110. These shoulders rest against the rigid pusher plate 81 to maintain the perpendicularity of the shafts.

The z-axis force F is transmitted to the die 104 of bare die chip package 100 through the stacked thermal control sections of the TCU, namely, the inner spring loaded pusher block section 40, the fluid circulation block section 50, the Peltier device 60, and the heat conductive pedestal section 72, all of which must be secured together. As best seen in FIG. 2, the fluid circulation block section 50 can be pre-attached to the inner pusher block section by suitable fasteners such as screw fasteners 41. A pedestal retainer ring 43 can be provided at the bottom of the stacked thermal control sections, and retaining fasteners, such as screw fasteners 45, can be used in conjunction with this retainer ring to tie the pedestal 72 and the other thermal control sections 40, 50 and 60 together. As generally described in U.S. Pat. No. 7,663,388, this creates a stacked assemblage of thermal control sections held in tight thermal contact with one another by the compliant z-axis force exerted by springs (such as the spring 47 shown in FIG. 3) captured in the inner pusher block 40 behind the block's pusher plate 49. As shown in FIG. 3, the pedestal 72 sets into retainer ring 43 on top of insulation ring 73. This insulation ring can have notches or passages that allow a condensation abatement gas to flow through the insulation ring as hereinafter described.

The force transmitted to the pusher end of pedestal 72 is uniquely controlled by means in the force distribution block 12, which can be actuated to change the force transmitted to the thermally active part of the DUT through the pedestal relative to the force transmitted to another part of the DUT through the outer pusher structure parts 80, 82.

Figure 4:
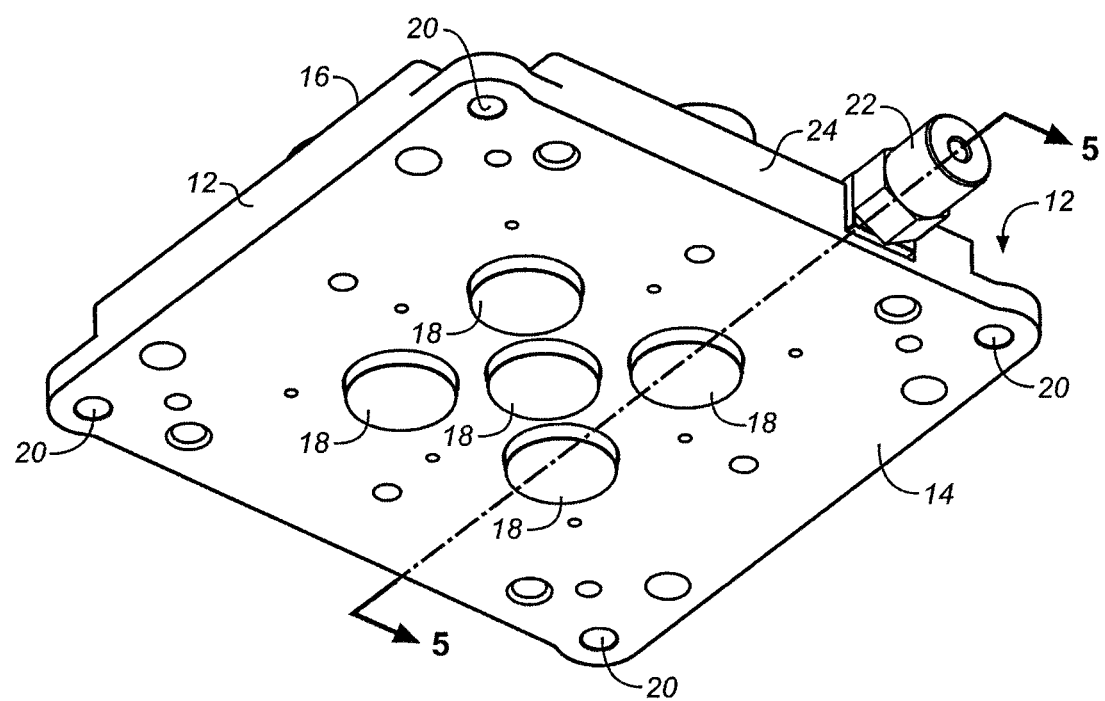
FIG. 4 is a bottom perspective view of the z-axis load distributor actuator block of the z-axis force distribution system of the TCU shown in FIGS. 1-4.
Figure 5:
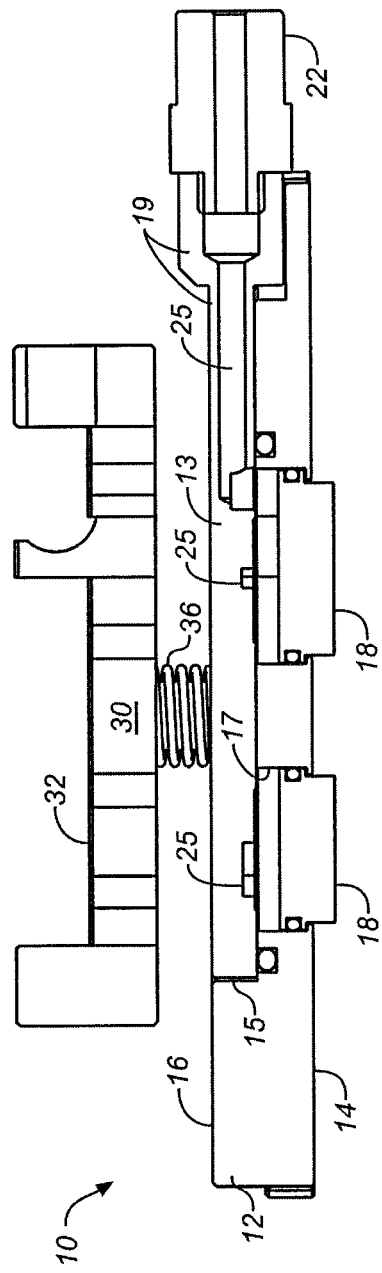
FIG. 5 is a cross-sectional view of the load distributor actuator block shown in FIG. 4 along the line 5-5, in combination with a spring loaded gimbal.

Referring to FIGS. 4 and 5, the force changing actuation means for the force distribution block can be provided in the form of at least one and preferably a plurality of pistons 18 nested in bottom surface 14 of the z-axis force distribution block 12. Pistons 18, which are preferably evenly spaced in a grouping centered in the bottom to the force distribution block 12, protrude from piston holes 17 in the bottom of block and can be actuated in the z-axis direction by altering fluid pressure behind the pistons. Fluid pressure is provided to the pistons from inlet 22 which protrudes from a side wall 24 of the force distribution block 12.

As shown in FIG. 5, the inlet 22 fluidly communicates with the pistons 18 via fluid passageways 25 within the force distribution block 12. The inlet may be connected to a source of pressured gas or fluid to effect pneumatic actuation of the pistons. Although pressured air is typically used, the pressured fluid may be nongaseous as well. For example, oils, water, or aqueous solutions may be used to actuate the piston. The result is pistons that produce a z-axis force that can be adjusted on the fly. By adjusting the pressures behind the pistons, the force transferred to the heat conducting pedestal 72 relative to the force transmitted to the outer pusher 82 can be modified during testing of the DUT without unloading or disassembling the thermal control unit. Alternatively, the adjustable pistons may be preset before use.

The z-axis force distribution block 12 can be constructed for ease of loading the pistons 18 in the block by providing a top cover plate 13 that fits in a recess 15 in the top surface 16 of the block. The top cover plate 16 can be secured in this recess by any suitable means such as by screw fasteners. The fluid passageways that are in communication with the piston holes 17 can be formed on the underside of the block. The fluid inlet 22 can be a fluid line coupler attached, such as by a threaded attachment, to a fluid inlet extension 19 of top cover plate 13.

The fluid circulation block 50 constructed fluid passages that enable fluids to be circulated through the block and carry heat away from the pedestal that contacts the thermally active part of the DUT, such as described in U.S. Pat. No. 7,663,388. In accordance with one aspect of the invention, fluid is introduced into and is evacuated from the fluid circulation block by fluid inlet and outlet arms 52, 54 swiveably attached to the sides of the TCU generally at or near the position of the fluid circulation block. Swivel attachments to the fluid inlet and outlet arms, in conjunction with compliant mounting of force distribution block 12 and the corner shafts 110, reduce instability of the thermal control unit due to external forces exerted on the TCU, and particularly due to biasing forces exerted by external hoses connected to the fluid inlet and outlet of the fluid circulation block. FIG. 1 depicts the exemplary range of motion for the swivel attachment of fluid outlet 54. The inlet and outlet arms preferably swivel about a common swivel axis S (shown in FIG. 2), and suitably have a swivel axis that is perpendicular to the z-axis of the TCU. While the fluid inlet arm 52 and fluid outlet arm 54 are shown attached opposite each other on opposite sides of the TCU, it is not intended that this swivel arm attachment aspect of the invention be limited to opposed swivel arms.

Thus, in accordance with this aspect of the invention, should any uncontrolled forces arise from hoses connected to the fluid inlet and outlet arms 52, 54 of the TCU, during a test cycle, the swivel action of the fluid inlet and outlet arms 52, 54 relative to the TCU will relieve these forces and cause z-axis alignment of the parts of the TCU to be maintained.

Any of a number of fluids may be circulated through fluid circulation block 50. Preferably, the fluids are provided in liquid form, but gaseous fluids may be used on occasion. Liquids having a relatively high heat capacity are particularly useful in certain application. In addition, the temperature-control fluids may be chosen according to desired conditions. For example, for testing of DUTs at ambient or elevated temperatures, e.g. 20° C. to about 65° C., water may serve as a temperature-control fluid. In contrast, cold testing of DUTs at −20° C., −5° C., 0° C., or temperatures therebetween may involve the use of aqueous solutions containing, methanol, ethylene glycol, or propylene glycol or nonaqueous liquids.

In still another aspect of the invention the thermal control unit 1 includes a condensation-abating system. The condensation-abating system includes a condensation-abating gas inlet 42, which can suitably be located at one edge of the inner spring loaded pusher block section 40 of the TCU. As shown in FIG. 3, gas inlet 42 connects to gas transporting passageways that extend around the pedestal 72, between the pedestal and the pedestal retaining ring 43, and between the pedestal retaining ring, pedestal and the outer pusher structure 80. The gas transporting passageways are denoted by the numerals 44A, 44B, 44C, 44D, 46A, 46B and 47. The condensation-abating system in further described below.

In use, the illustrated thermal control unit 1 may be placed over a test socket (not shown) containing a bare die chip package 100. A z-axis force is applied to the gimbal adapter 30, such as by a pneumatic press of an automated chip tester. The z-axis force is transferred by the force distribution block 12 of the self-centering gimbal 10 to pedestal 72 through the stack of thermal control blocks 40, 50 and 60 to the heat conducting pedestal 72, and to the outer pusher structure 80 though the force transfer shafts 110. The two pushers to which this z-axis force is transferred are the pusher end 76 of the pedestal which contacts the die 104 of the bare die chip package and the substrate pusher 72 of the outer pusher structure. The exerted z-axis force is controllably distributed between these pushers by the force distribution block 12. The force exerted on the die relative to the force exerted on the substrate can be adjusted by adjusting the pressure behind the pistons 18 of the force distribution block, which acts a z-axis force actuation means. The force distribution may be preset or adjusted on the fly such that the die force does not exceed a desired or predetermined upper limit to ensure that the die force does not damage the die.

It is noted that the z-axis distance between the pedestal pusher end 76 and the bottom substrate pusher end 82 should be calibrated to ensure the substrate force does not fall below a desire or predetermined lower limit to ensure proper engagement between electrical pads of the DUT and the probes of the test socket. For example, a manufacturer of a particular IC device in bare-die packaging may specify that the particular IC device be cold tested with the application of at least a 55 pound load to the substrate. However, the specification may also prohibit the die from experiencing a load of 15 pounds or greater. In such a case, a total load of 70 pounds may be applied to the DUT with the die pusher adjusted to limit the load applied to the die not to exceed 15 pounds.

When so engaged, testing may begin. The thermal measurement and control elements of the thermal control unit act to monitor and maintain the DUT's set point temperature. The DUT temperature may be monitored by the sensor 78 in the pedestal pusher end 76. A desired electrical signal is supplied to the Peltier device 60 from an external power source to generate the heat flow needed to maintain a desired set point temperature for the DUT in the test socket. Heat transfer between the pedestal and fluid circulating block 50 can be regulated in accordance with the temperature of the DUT as detected by the sensor 78, with heat being removed from the pedestal to the temperature-control fluid being circulated through the fluid block 50 when it is desired to lower the DUT temperature, and with heat being added to the pedestal 72 from the circulating fluid if the DUT temperature needs to be raised. In short, the heat is either carried away or supplied by the temperature-control fluid which is passed through the fluid passage within the fluid circulating block 50.

To help achieve an efficient interface, a thermal interface material, such as a thermal grease or foil, is optionally provided between the pedestal's top surface 74 and the Peltier device 60, and between the Peltier device and the fluid circulating block 50.

Regarding the condensation-abatement aspect of the invention, the DUTs of the invention may be used to carry out cold testing of DUTs. During such cold testing, temperature-control fluid may be chilled to temperatures of 0° C. or below. If such testing is carried out under uncontrolled ambient conditions, water or ice may accumulate on surface of the TCUs, DUTs, and test sockets. Such condensation may short or otherwise interfere with the proper functioning of the electronic components of TCUs, DUTs and test sockets.

A number of techniques known in the art have been used to address the condensation problems associated with cold testing. For example, high-volume cold testing of IC devices have been carried out in controlled environments, e.g., within rooms having a low level of atmospheric humidity. In some low-volume cold testing facilities, IC devices may be tested within an enclosure that maintains a low-humidity. In addition or in the alternative, plastic form of other material having a low thermal conductivity may be applied to surfaces of TCUs to address condensation problems associated with the chilling of components of TCUs engaged in cold testing.

In accordance with the condensation abatement aspect of the invention, provides a new and efficient approach to abatement of condensation on TCU and chip surfaces, which is integrated into the TCU. A condensation-abating gas is introduced under pressure into the TCU through gas inlet 42. The abating gas flushes through the TCU so as to pass over surfaces on which condensation is likely to occur. In particular, in illustrated embodiment and as shown in FIG. 3 the gas introduced at inlet 42 flows into horizontal passageway 44A and down through vertical passageway 44B and from there flushes through passageways 44C and 44D around the pedestal (including openings in the pedestal insulating ring 73), and exiting the TCU through two exit routes: through passageways 46A, 46B between parts of the outer pusher structure 80 and the pedestal retainer 43, which is preferably stainless steel, and through passageway 47 between the pusher end 76 of the pedestal 72 and the substrate pusher 82 of the outer pusher structure.

It will be appreciated that gas passageways may be provided in ways other than as shown. For example, passageway 44A extends generally horizontally through inner spring loaded pusher block 40 until it joins with passageway 44B in a fluid-communicating manner. Passageway 44B extends in a z-axis direction through a portion of block 40, as well as both the upper section 56 and lower section 58 of the fluid circulation block 50. Passageways 44C, 44D, 46A, 46B, and 47 are shown downstream from passageway 44B and located between the skirt 90 and the pedestal 72. Optionally, one or more additional passageways may be formed by placing a first surface having one or more channels formed therein against a second surface, the surfaces in combination defining the one or more additional passageways. For example, condensation abating gas transporting passageways may be integrated within or interposed between the modules of the inventive TCU.

In operation, a condensation-abating gas source (not shown) may be connected with inlet 42. Condensation-abating gas is introduced through the inlet 42, and flushed through the gas passageways as above-described, and flows over surfaces on which condensation may occur. As the pedestal 72 is necessarily cold during cold testing, skirt 90 may help direct condensation-abating gas over exposed surfaces of the pedestal prone to collect moisture or ice.

Any of a number of gases may be used. For example, any dry inert gas, e.g., nitrogen, helium, argon, etc. may be used. In particular, commercially available, dry, oil-free air has been demonstrated to abate condensation on the inventive TCU. TCUs having the above-described integrated means for abating condensation do not experience condensation-related problems during cold testing in uncontrolled atmospheric conditions, whereas the same TCU may suffer from condensation-related problems during cold testing when no condensation-abating gas is used.

In addition to the use of condensation-abating gas, appropriate measures should be taken to address heat conduction issues. For example, different components of the temperature control unit should be thermally isolated from one another whenever possible to inhibit chilling of water sensitive components of TCUs. In addition, material of low thermal conductivity should be used whenever possible. For example, metals should generally be avoided for components that do not have to conduct heat. As discussed above, portions of the temperature-control fluid block may be made from a metal such as copper for efficient heat conduction. However, other portions of the temperature-control fluid-block, e.g., those exposed to the surrounding ambient environment, may be formed from a material that does not conduct heat, e.g., plastic, to deter the formation of condensation thereon.

To facilitate discussion, FIGS. 6-11 illustrate another exemplary embodiment of a thermal control unit (TCU) 600 in accordance with the present invention. Advantages of this embodiment include a fast thermal response of 40° C./second for an IC device under test (DUT) have a test surface area of approximately 16 mm×16 mm, with a resulting watt density of approaching 1000 watts per square inch. In addition, TCU 600 has an operating range of −60° C. to 160° C.

Figure 7A:
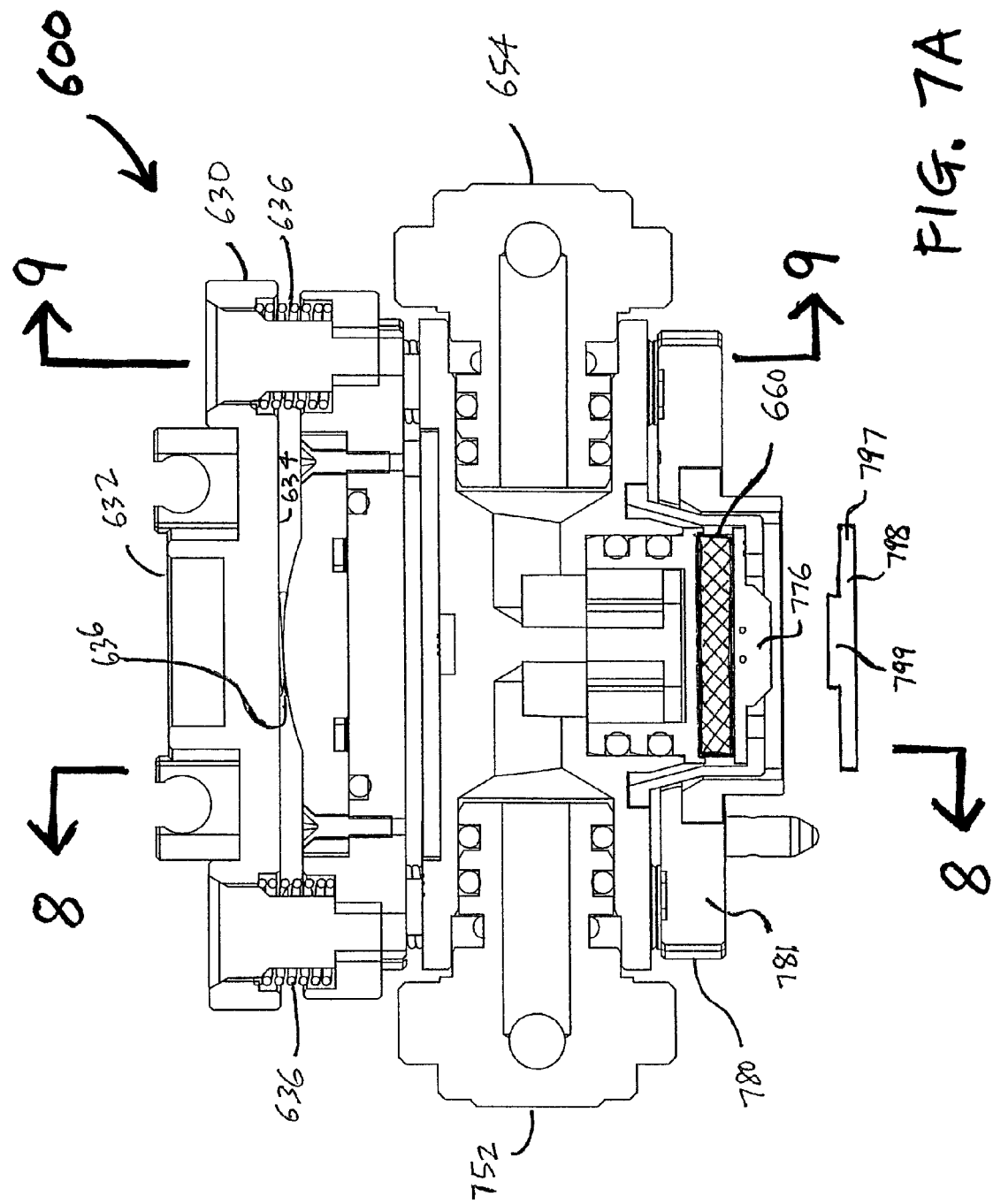
Figure 7B:
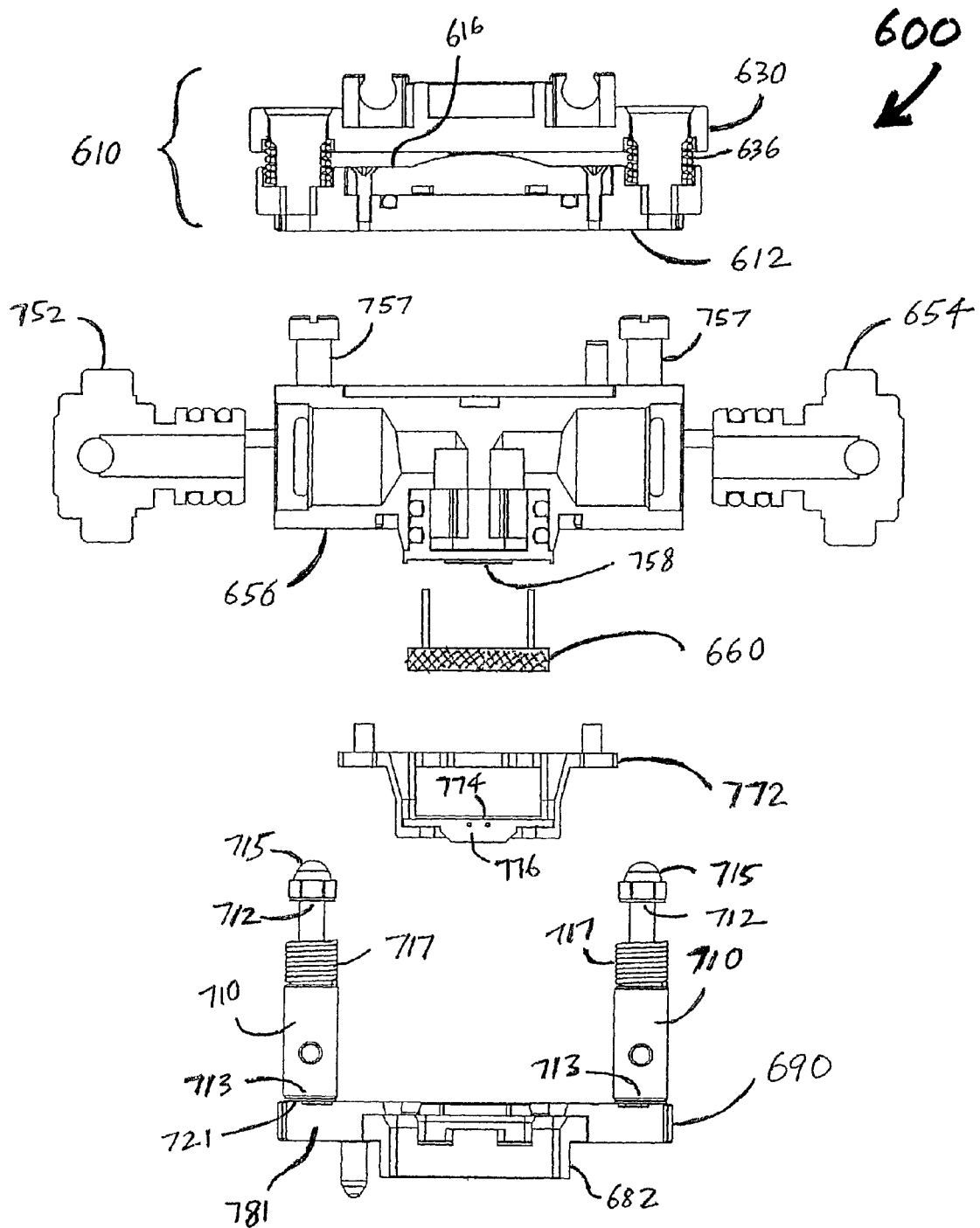
FIG. 7B is an exploded view of FIG. 7A.
Figure 8:
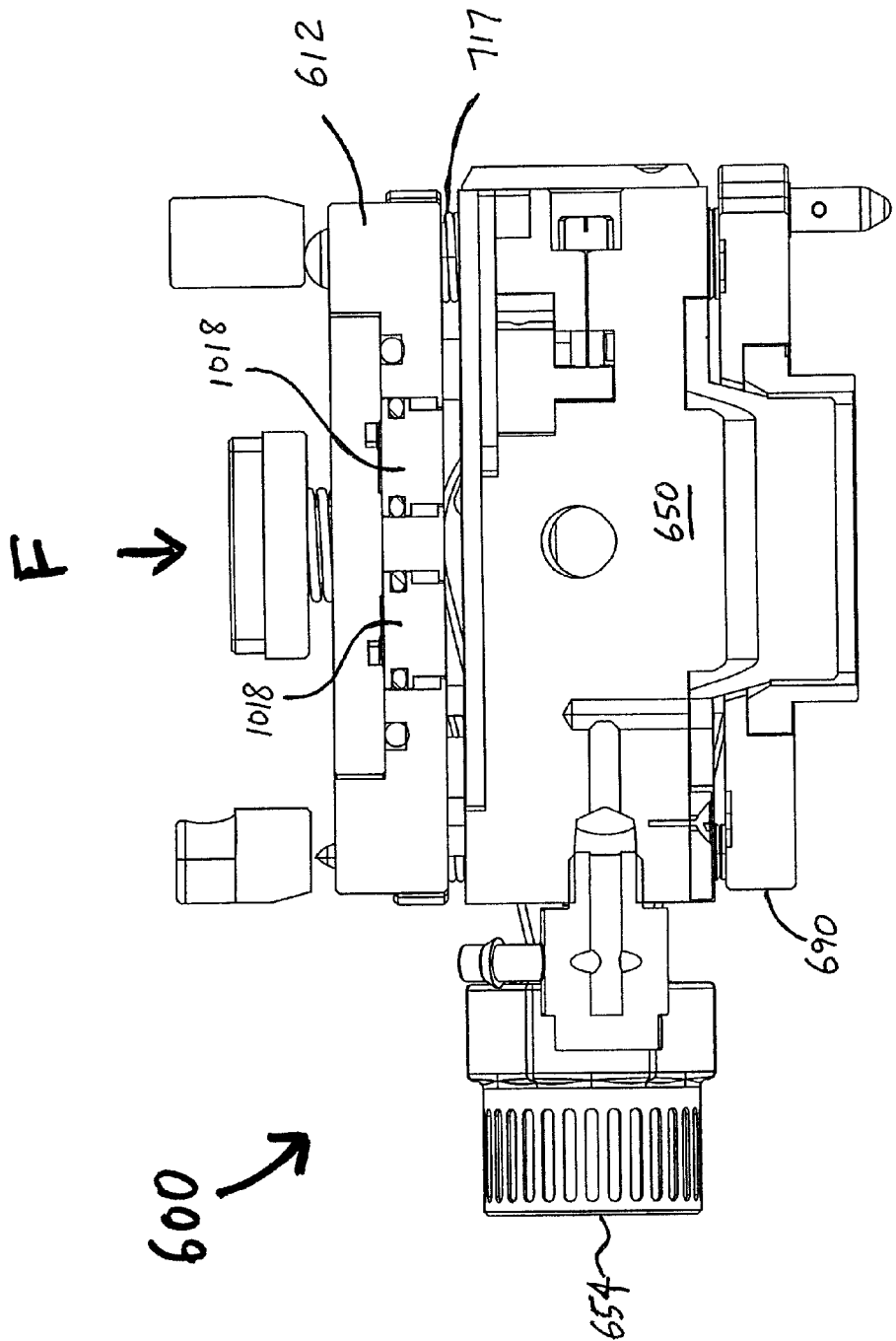
FIG. 8 is another cross-sectional view thereof taken along section lines 8-8 in FIG. 7A.
Figure 11:
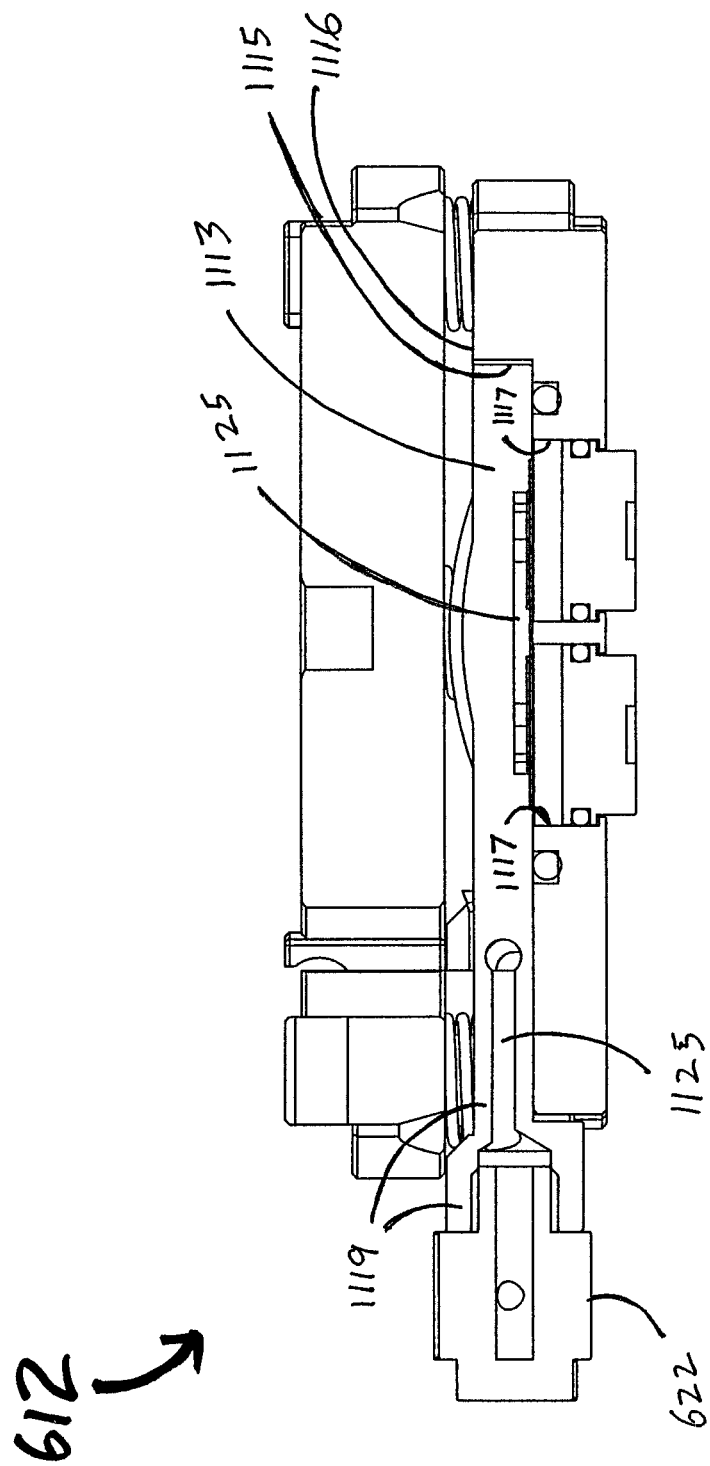
FIG. 11 is a cross-sectional view of the load distributor actuator block shown in FIG. 10A along the line 11-11, in combination with a spring loaded gimbal.

The superior thermal performance of TCU 600 is made possible by several key design features such as choices of thermal conductive materials, fluid and electrical pathways and thermal sensor locations, these design features described in greater detail below. Briefly, FIG. 6 is a side view of thermal control unit 600. FIG. 7A is cross-sectional view thereof taken along section lines 7A-7A in FIG. 6, while FIG. 7B is an exploded view of FIG. 7B illustrating the components of TCU 600, including force transmitting assembly 610, fluid circulation block (heat exchanger with thermally-conductive plate) 650, heater 660, pedestal 772, and substrate pusher 690. FIGS. 8 and 9 cross-sectional views thereof taken along section lines 8-8 and 9-9, respectively, in FIG. 7A. FIGS. 10A and 10B are bottom perspective views of two exemplary z-axis load distributor actuator blocks for the z-axis force distribution system of the TCU 600, while FIG. 11 is a cross-sectional view along the line 11-11 in FIG. 10A.

As shown in FIGS. 6-9, the thermal control unit (TCU) 600 includes the following basic sections arranged in stacked relationship along the z-axis of the TCU 600: a force transmitting assembly 610 for transmitted a z-axis force denoted by the arrow F (see FIG. 6) to the TCU's IC device under test (DUT) contacting pushers as hereinafter described; a fluid circulation block 650; a heater 660; and a heat conductive pedestal 772 having a pusher end 776, which includes at least one pedestal temperature sensor, for contacting and pushing against a thermally active central portion of an IC chip, such as the die 799 of a bare die chip package 797.

An outer pusher structure 780 is also provided. Pusher 780 includes a rigid bottom pusher plate 781 and is suitably fabricated of a metal material, such as aluminum, for rigidity. The bottom pusher plate 781 has a center opening to allow the pusher end of the heat conducting pedestal to project through the pusher plate. A second DUT contacting pusher 682 extends from the bottom of the pusher plate around this center opening. This second pusher 682 extends in the z-axis direction in parallel with the pusher end of the pedestal and contacts and pushes against another part of the IC chip, such as the substrate 798 of the bare die chip package 797.

Referring to FIG. 7A, the fluid circulation block (also known as the chiller block) 650 is seen to have a lower contact plate 758 at the bottom of block's main body 656. This lower contact plate 758 is made of a good heat conductor such as copper and is suitable provided to achieve efficient heat conduction between the fluid circulation block 650 and the heater 660. Hence the block's main body 656 of the may be formed from material that does not conduct heat as well as copper or other metals. Suitable materials for main body 656 include thermoplastics such as Peek™, Ultem™ or Torbn™, capable of withstanding repeated rapid thermal shock cycles and also reducing condensation abatement needs, during multiple rapid heating/cooling cycles of TCU 600.

To prevent thermal runaway and resulting damage to TCU 600, fluid circulation block 650 preferably includes at least one chiller temperature sensor, enabling TCU 600 to sense when permitted operating range has been exceeded and triggering an appropriate thermal cut off.

Referring also to FIG. 6, the force transmitting assembly 610 of the TCU 600 includes a force distribution block 612 and can additionally include a gimbal adapter 630 above the force distribution block 612 to form the force transmitting assembly 610. The gimbal adapter 630 includes upper and lower surfaces 632 and 634, with the upper surface 632 being positioned to receive the indicated z-axis force F. The gimbal adaptor 630 further includes springs 636 positioned beneath the lower surface 634. Springs 636 are held in compression between the gimbal adaptor 630 and the upper surface 616 of the force distribution block 612 for preload gimbal stability.

As shown in FIGS. 7A, 7B, 9 and 10A, the outer pusher structure 780 is secured to the force distribution block 612 by force transfer shafts 710. These shafts freely pass through suitably sized holes in the fluid circulation block 650. The bottom ends 713 of shafts 710 are suitably anchored to the pusher plate 781 near the outer perimeter of the plate, such as by threaded engagement, while the top ends 712 of the shafts extend through openings 1020 (shown in FIG. 10A) in the corners of the force distribution block and are topped by cap nuts 715 to retain the force distribution block on the shafts 710.

In addition, gimbal block 612 also includes suitably sized holes 1077 for coupling with a corresponding set of alignment pins 757 protruding vertically from the top surface of fluid circulation block 650.

FIGS. 7A and 9 both show the force distribution block 612 compliantly supported on springs 717 provided around the recessed portion of the shaft 710 beneath the force distribution block and which set on shoulders 719 presented by the recessed portion of the shaft 710. A z-axis force F applied to the force transmitting assembly 610 will thus be compliantly transmitted to pusher 682 of the outer pusher structure, and thus to the substrate 798 of bare die chip package 797. The springs 717 can be used to pre-load the force distribution block (gimbal block) 612 to the main body 656 of fluid circulation block 650.

It is noted that bottom shoulders 721 are provided near the bottom end 713 of each of the force transfer shafts 710. These shoulders rest against the rigid pusher plate 781 to maintain the perpendicularity of the shafts.

The z-axis force F is transmitted to the die 799 of bare die chip package 797 through the stacked thermal control sections of the TCU 600, namely, the fluid circulation block 650, heater 660, and the heat conductive pedestal 772, all of which must be secured together. The force transmitted to the pusher end of pedestal 772 is uniquely controlled by means in the force distribution block 612, which can be actuated to change the force transmitted to the thermally active part of the DUT through the pedestal relative to the force transmitted to another part of the DUT through the outer pusher structure parts 780, 682.

Referring to FIGS. 10A and 11, the force changing actuator for the force distribution block 612 (also known as the gimbal block), can be provided in the form of at least one and preferably a plurality of pistons 1018 nested in bottom surface 1014 of a gimbal block 612 for distributing the z-axis force. Pistons 1018, which are preferably evenly spaced in a grouping centered in the bottom to the force distribution block 612, protrude from piston holes 1117 in the bottom of gimbal block 612 and can be actuated in the z-axis direction by altering fluid pressure behind the pistons 1018. Fluid pressure is provided to the pistons from fluid inlet 622 which protrudes from a side wall 1024 of gimbal block 612.

As shown in FIG. 11, the inlet 622 fluidly communicates with the pistons 1018 via fluid passageway 1125 within the gimbal block 612. The inlet 622 may be connected to a source of pressured gas or fluid to effect pneumatic actuation of the pistons 1018. Although pressured air is typically used, the pressured fluid may be nongaseous as well. For example, oils, water, or aqueous solutions may be used to actuate the pistons 1018. The result is pistons that produce a z-axis force that can be adjusted on the fly. By adjusting the pressures behind the pistons 1018, the force transferred to the heat conducting pedestal 772 relative to the force transmitted to the outer pusher 682 can be modified during testing of the DUT without unloading or disassembling the thermal control unit. Alternatively, the adjustable pistons may be preset before use.

The gimbal block 612 can be constructed for ease of loading the pistons 1018 in the block by providing a top cover plate 1113 that fits in a recess 1115 in the top surface 1116 of the block 612. The top cover plate 1113 can be secured in this recess 1115 by any suitable means such as by screw fasteners. The fluid passageways that are in communication with the piston holes 1117 can be formed on the underside of the block 612. The fluid inlet 622 can be a fluid line coupler attached, such as by a threaded attachment, to a fluid inlet extension 1119 of top cover plate 1113.

FIG. 10b shows an alternate embodiment of the gimbal block 1012, wherein instead of machine screws, pivoted latches 1090 are used to secure the stacked components of TCU 600 to each other without the need for tools.

Referring to both FIGS. 6 and 7A, the fluid circulation block 650 constructed fluid passages that enable fluids to be circulated through the block and carry heat away from the pedestal that contacts the thermally active part of the DUT, such as described in U.S. Pat. No. 7,663,388. In accordance with one aspect of the invention, fluid is introduced into and is evacuated from the fluid circulation block by fluid inlet and outlet arms 752, 654 swivelably attached to the sides of the TCU 600 generally at or near the position of the fluid circulation block. Swivel attachments to the fluid inlet and outlet arms, in conjunction with compliant mounting of force distribution block 612 and the corner shafts 710, reduce instability of the thermal control unit due to external forces exerted on the TCU 600, and particularly due to biasing forces exerted by external hoses connected to the fluid inlet and outlet of the fluid circulation block. FIG. 6 depicts the exemplary range of motion for the swivel attachment of fluid outlet arm 654. The inlet and outlet arms 752, 654 preferably swivel about a common swivel axis S (shown in FIG. 7A), and suitably have a swivel axis that is perpendicular to the z-axis of the TCU 600. While the fluid inlet arm 752 and fluid outlet arm 654 are shown attached opposite each other on opposite sides of the TCU 600, it is not intended that this swivel arm attachment aspect of the invention be limited to opposed swivel arms.

Thus, in accordance with this aspect of the invention, should any uncontrolled forces arise from hoses connected to the fluid inlet and outlet arms 752, 654 of the TCU 600, during a test cycle, the swivel action of the fluid inlet and outlet arms 752, 654 relative to the TCU 600 will relieve these forces and cause z-axis alignment of the parts of the TCU to be maintained.

Any of a number of fluids may be circulated through fluid circulation block 650. Preferably, the fluids are provided in liquid form, but gaseous fluids may be used on occasion. Liquids having a relatively high heat capacity are particularly useful in certain application. In addition, the temperature-control fluids may be chosen according to desired conditions. For example, for testing of DUTs at ambient or elevated temperatures, e.g. 20° C. to about 65° C., water may serve as a temperature-control fluid. In contrast, cold testing of DUTs at −20° C., −5° C., 0° C., or temperatures therebetween may involve the use of aqueous solutions containing, methanol, ethylene glycol, or propylene glycol or nonaqueous liquids.

In still another aspect of the invention the thermal control unit (TCU) 600 includes a condensation-abating system. During cold testing, temperature-control fluid may be chilled to temperatures of 0° C. or below. If such testing is carried out under uncontrolled ambient conditions, water or ice may accumulate on surface of the TCUs, DUTs, and test sockets. Such condensation may short or otherwise interfere with the proper functioning of the electronic components of TCUs, DUTs and test sockets.

Accordingly, the condensation-abating system includes a condensation-abating gas inlet 668, which can suitably be located at one edge of the fluid circulation block 650. As shown in FIGS. 6 and 7A, gas inlet 668 connects to gas transporting passageways that extend around the pedestal 772, in a manner similar to that of the other embodiment of TCU 1 described above, thereby enabling the approach to abatement of condensation on TCU and chip surfaces, described above for TCU 1 to be integrated into the TCU 600.

In addition to the use of condensation-abating gas, appropriate measures should be taken to address heat conduction issues. For example, different components of the temperature control unit should be thermally isolated from one another whenever possible to inhibit chilling of water sensitive components of TCUs. In addition, material of low thermal conductivity should be used whenever possible. For example, metals should generally be avoided for components that do not have to conduct heat. As discussed above, portions of the temperature-control fluid block may be made from a metal such as copper for efficient heat conduction. However, other portions of the temperature-control fluid-block, e.g., those exposed to the surrounding ambient environment, may be formed from a material that does not conduct heat, e.g., plastic, to deter the formation of condensation thereon.

In use, the illustrated thermal control unit 600 may be placed over a test socket (not shown) containing a bare die chip package 797. A z-axis force is applied to the gimbal adapter 630, such as by a pneumatic press of an automated chip tester. The z-axis force is transferred by the force distribution block 612 of the self-centering gimbal 610 to pedestal 772 through the stack of thermal control subassemblies 650 and 660 to the heat conducting pedestal 772, and to the outer pusher structure 780 though the force transfer shafts 710. The two pushers to which this z-axis force is transferred are the pusher end 776 of the pedestal which contacts the die 798 of the bare die chip package 799 and the substrate pusher 690 of the outer pusher structure.

The exerted z-axis force is controllably distributed between these pushers by the force distribution block 612. The force exerted on the die 799 relative to the force exerted on the substrate 798 can be adjusted by adjusting the pressure behind the pistons 1018 of the force distribution block, which acts a z-axis force actuation means. The force distribution may be preset or adjusted on the fly such that the die force does not exceed a desired or predetermined upper limit to ensure that the die force does not damage the die 799. In other words, the total z-axis force exerted by force distribution block 612 is equal to a sum of the force exerted on the substrate 798 and the force exerted on the die 799. This force distribution between the substrate 798 and the die 799 is carefully controlled so that no undue internal structural stress, caused by harmful bending forces, is transmitted by the TCU 600 to the DUT, while maintaining efficient thermal conductivity between the TCU 600 and the DUT during the test.

It is noted that the z-axis distance between the pedestal pusher end 776 and the bottom substrate pusher end 682 should be calibrated to ensure the substrate force does not fall below a desire or predetermined lower limit to ensure proper engagement between electrical pads of the DUT and the probes of the test socket. For example, a manufacturer of a particular IC device in bare-die packaging may specify that the particular IC device be cold tested with the application of at least a 55 pound load to the substrate 798. However, the specification may also prohibit the die 799 from experiencing a load of 15 pounds or greater. In such a case, a total load of 70 pounds may be applied to the DUT with the die pusher 776 adjusted to limit the load applied to the die not to exceed 15 pounds.

When so engaged, testing may begin. The thermal measurement and control elements of the thermal control unit act to monitor and maintain the DUT's set point temperature. The DUT temperature may be monitored by the pedestal thermal sensor in the pedestal pusher end 776.

A desired electrical current is supplied to the heater 660 from an external power source to generate the heat flow needed to maintain a desired set point temperature for the DUT in the test socket. Heat transfer between the pedestal 772 and fluid circulating block 650 can be regulated in accordance with the temperature of the DUT as detected by the thermal sensor, with heat being removed from the pedestal 772 to the temperature-control fluid being circulated through the fluid block 650 when it is desired to lower the DUT temperature. It is also possible to add supplement heat generated by the heater 660 to the pedestal 772 with additional heat from the circulating fluid if the DUT temperature needs to be raised rapidly. In short, the heat is either carried away or supplied by the temperature-control fluid which is passed through the fluid passage within the fluid circulating block 650.

As discussed above, although fluid circulating block 650 can be made from a suitable thermo-plastic to reduce condensation, while the thermally-conductive plate 758 is made from a relatively-thin (low-mass) and highly-conductive material, such as nickel-plated copper, for superior thermal transfer performance. Similarly, the electrically-resistive heater 660 can be made from suitable materials, including ceramic materials such as AlN (aluminum nitride), which is has suitable thermally-conductive properties.

To further improve the efficiency of the various thermal interfaces, a suitable thermal interface material, such as a thermal grease or foil, e.g., "Artic-Silver™ thermal compound, can be provided between the pedestal's top surface 774 the heater 660, and between the heater 660 and the thermally-conductive plate 758 located at the bottom of fluid circulating block 650. This thermal interface material, typically about one mil in thickness, fills out minor imperfections and voids, thereby enhancing thermal conductivity and efficiency of the respective interfaces. In addition, the thermal interface material also accommodates the different expansion coefficients of the corresponding components made from different materials, namely, the plate 758, the heater 660 and the pedestal 772 during rapid heating and cooling cycles.

In some embodiments, in order to improve the thermal efficiency of interface between the pedestal pusher end 776 and the die 799, a suitable liquid thermal interface material (LTIM), for example water and glycerin, is injected under pressure into the pedestal/die interface from one or more perforations located at the bottom of pedestal pusher end 776. Subsequently, after the testing of the DUT, residual LTIM is removed under suction from the same bottom perforations of the pedestal pusher end 776. The LTIM is supplied to and removed from pedestal pusher end 776 via a corresponding set of LTIM input and output 669 shown in FIGS. 6 and 9.

As discussed above, typical device testers are designed with the assumption that the devices under test (DUTs) are flat. As a consequence, the flat profiles of the pedestal, the substrate pusher and the test socket result in undue pressure being exerted on curved DUTs, especially by the pedestal on the die, during testing. In addition, the pedestal and the substrate pusher exert pressure on the selected surface areas of the substrate. Hence, after testing, the surface of the device is somewhat flattened due to the undue pressure from the pedestal and the pusher, and often uneven, due to the uneven pressure between the supported and unsupported surfaces of the DUT.

The uneven pressure problem on the DUTs can be partially mitigated by introducing adjustable touchdown coverage that attempts to increase the supported top surface area of the DUTs. This is accomplished by providing additional surface support between the pedestal and the substrate pusher, i.e., on the surrounding components surrounding the die on the substrate, such as resistors, capacitors and I/O drivers. However, the adjustable touchdown coverage does not solve the more serious, undesirable and unintended device flattening problem.

Figure 12A:
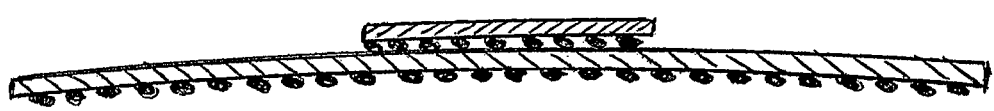
FIG. 12A is a cross-sectional view of a slightly curved IC device prior to testing.
Figure 12B:
FIG. 12B is a cross-sectional view of an IC device deformed by testing.

The device flattening problem becomes more pronounced as the substrate thickness decreases. With today's portable devices, device substrate thicknesses have steadily decreased from about 800 microns to about 100-200 microns. Unlike thicker, e.g., 800 microns, devices, capable of resuming its original curvature after being flattened by the device tester, today thinner devices are much more likely to become permanently deformed as exemplified by device 1280B of FIG. 12B.

Figure 13A:
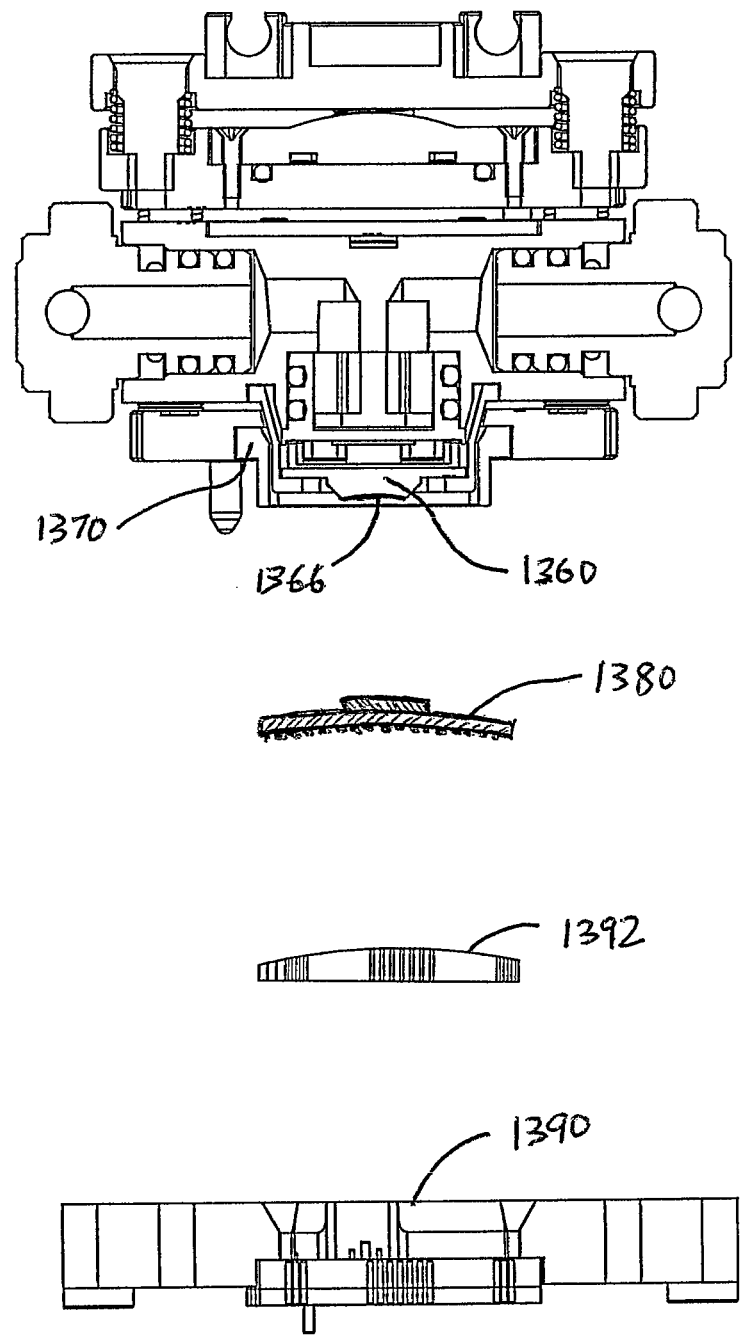
FIGS. 13A and 13B are cross-sectional views illustrating embodiments of a pedestal, a substrate pusher and the test socket in accordance with the present invention.

To minimize this undesirable flattening problem, in some embodiments of the device testers, as illustrated by FIG. 13A (not to scale), the pedestal 1360, the substrate pusher 1370 and the socket insert 1392 of test socket 1390 are configured to accommodate the curved device 1380. Accordingly, the pusher end 1366 of pedestal 1360 is slighted concave in order to substantially match the curvature of the surface of die 1384 of device 1380. Similarly, the top surface of socket insert 1392 is slightly convex in order to substantial match the curvature of the bottom of substrate 1380 of device 1380.

Figure 13B:
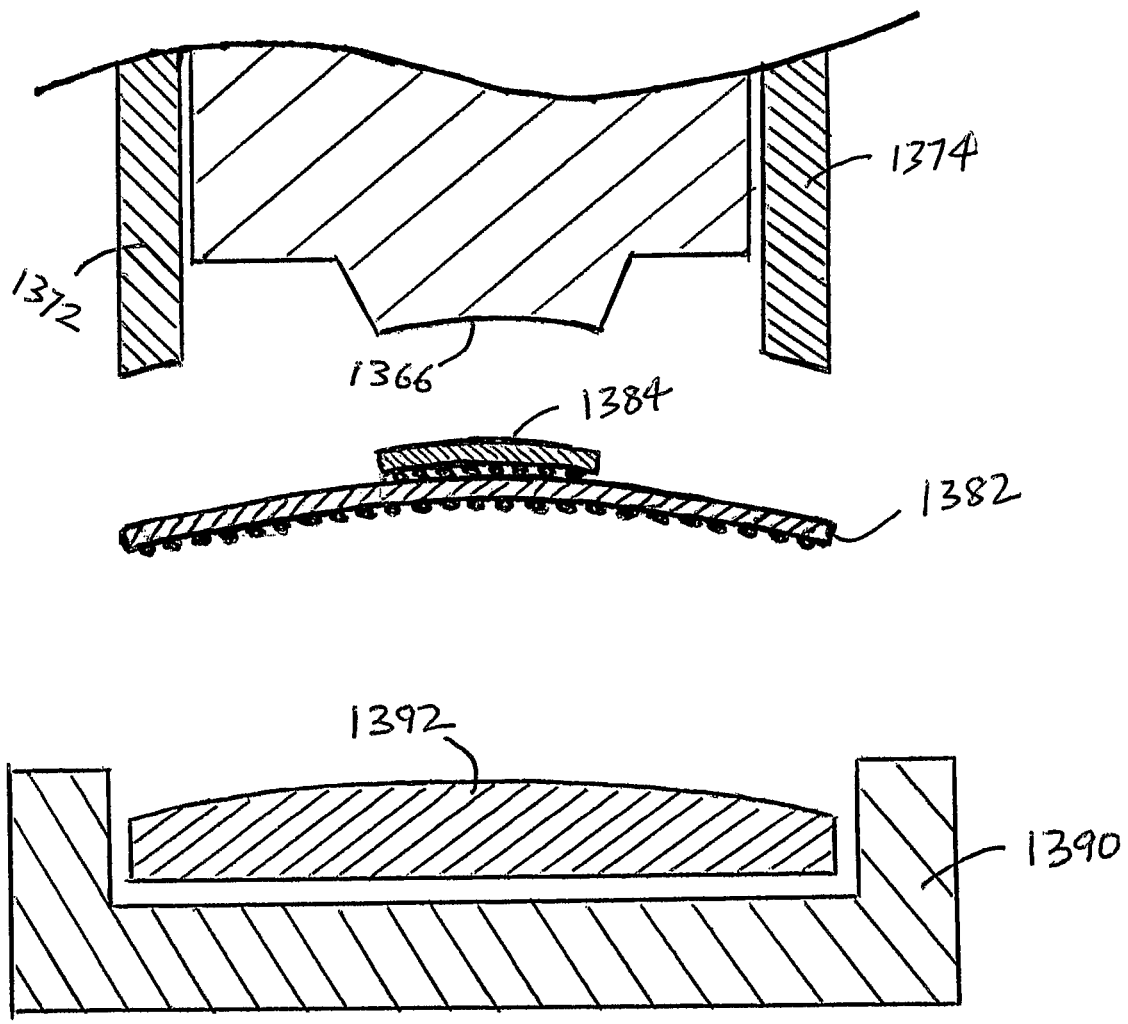

For illustrative purposes, FIG. 13B is a simplified and exaggerated (not to scale) cross-sectional view showing in greater detail the respective curved profiles of pedestal pusher end 1366, die 1384, substrate pusher ends 1372, 1374, substrate 1382, and socket insert 1392.

Hence, depending on the sizes and thicknesses of the DUTs, wide variations of curved shapes for the socket inserts and/or pusher ends, alone and in combination, are contemplated, including circular, elliptical, spherical, faceted (like a cut jewel) and compound shapes and combinations thereof. It should also be appreciated that irregularities, such as depressions and/or bumps, may also be intentionally introduced into selected portion(s) of the socket inserts and/or pusher ends depending on the particular DUT profile and construction.

Figure 13C:
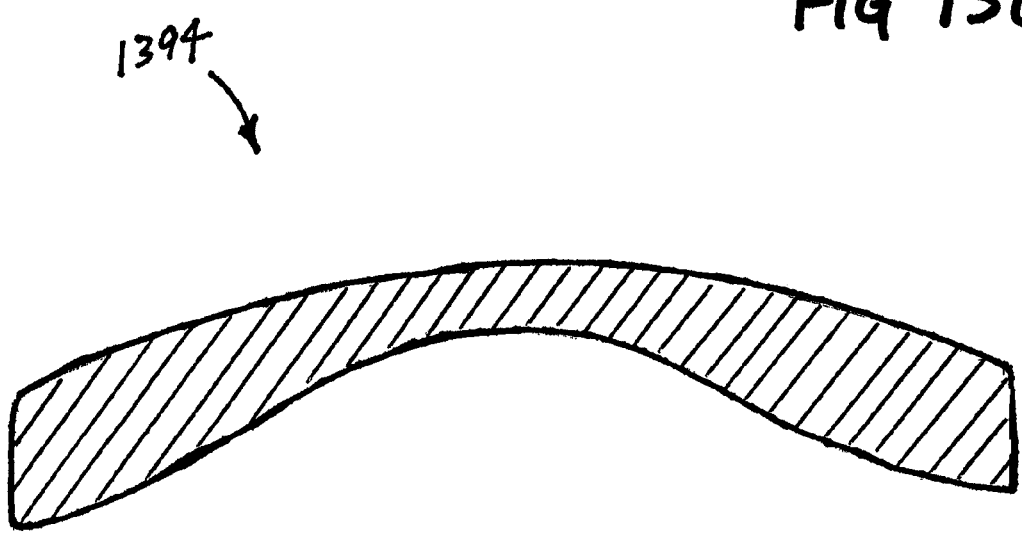
FIGS. 13C and 13D are cross-sectional views of additional embodiments of the test socket inserts.
Figure 13D:
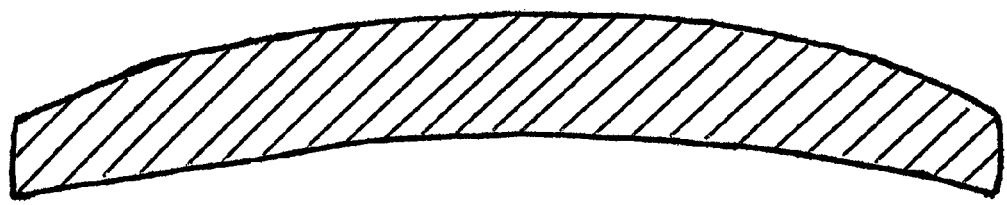
Figure 13E:
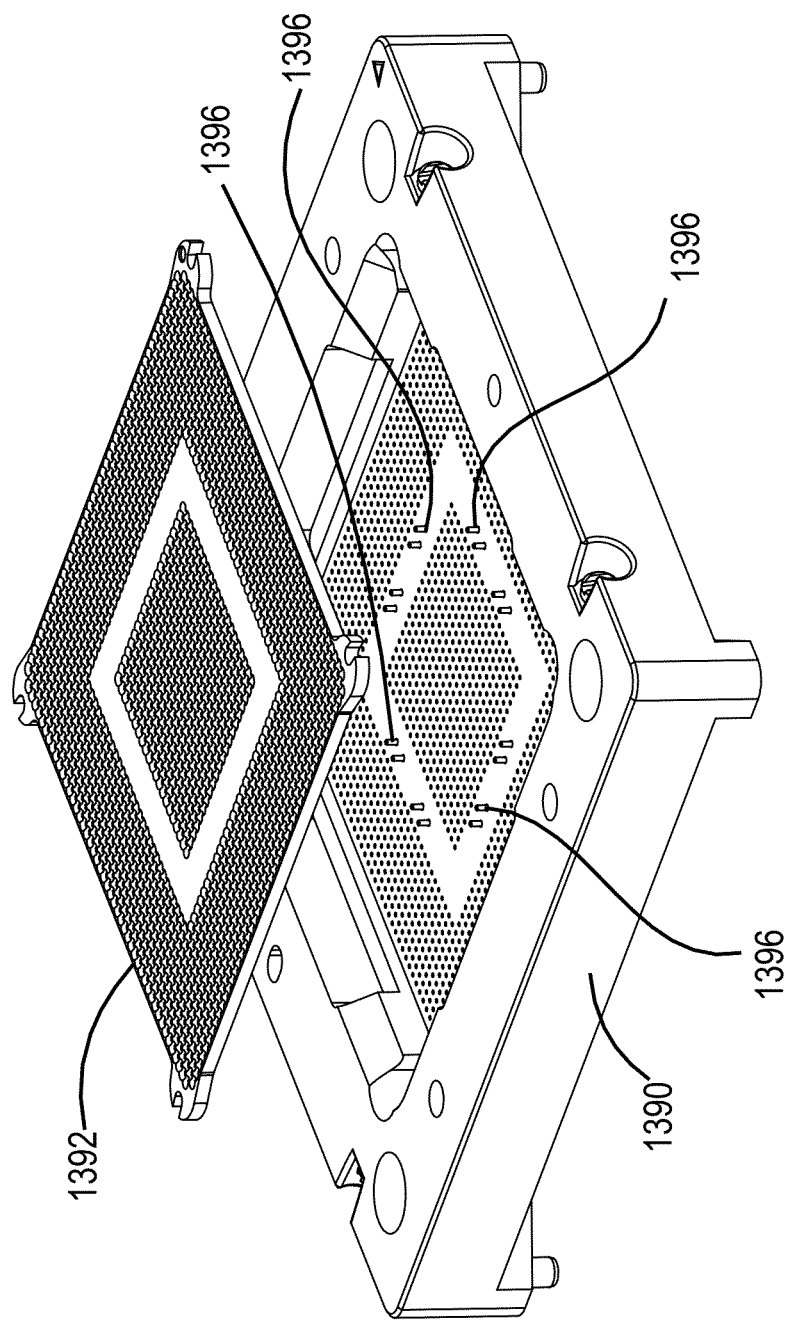
FIG. 13E is a perspective view of the test socket and test socket insert for the embodiment of FIG. 13A.
Figure 13F:
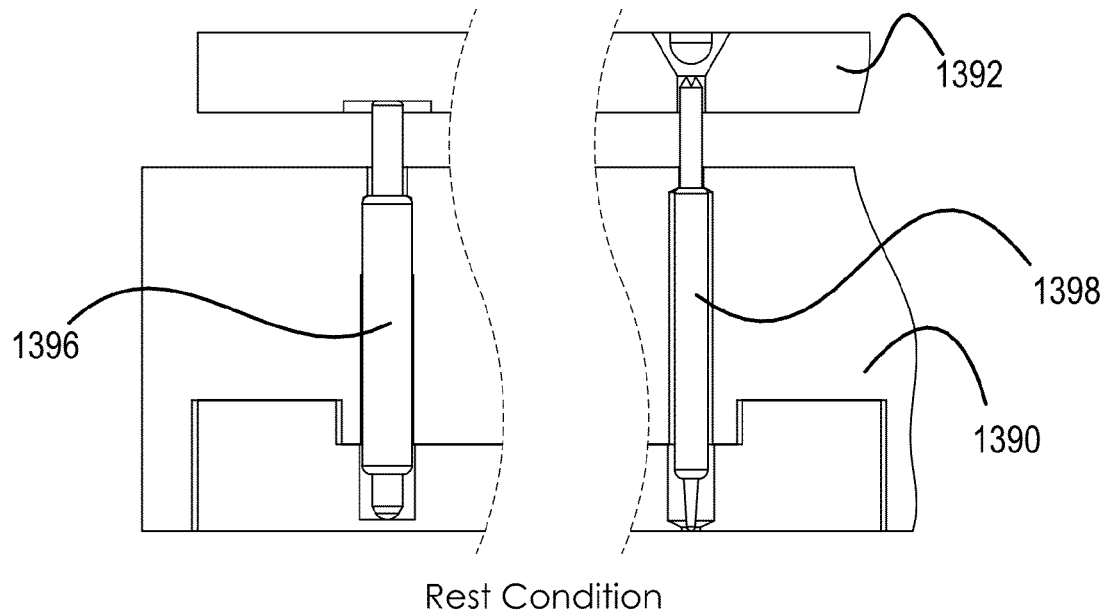
FIGS. 13F and 13G are cross-sectional views illustrating a suspension pin and a test pin for the embodiment of FIG. 13A, in rest condition and test condition, respectively.
Figure 13G:
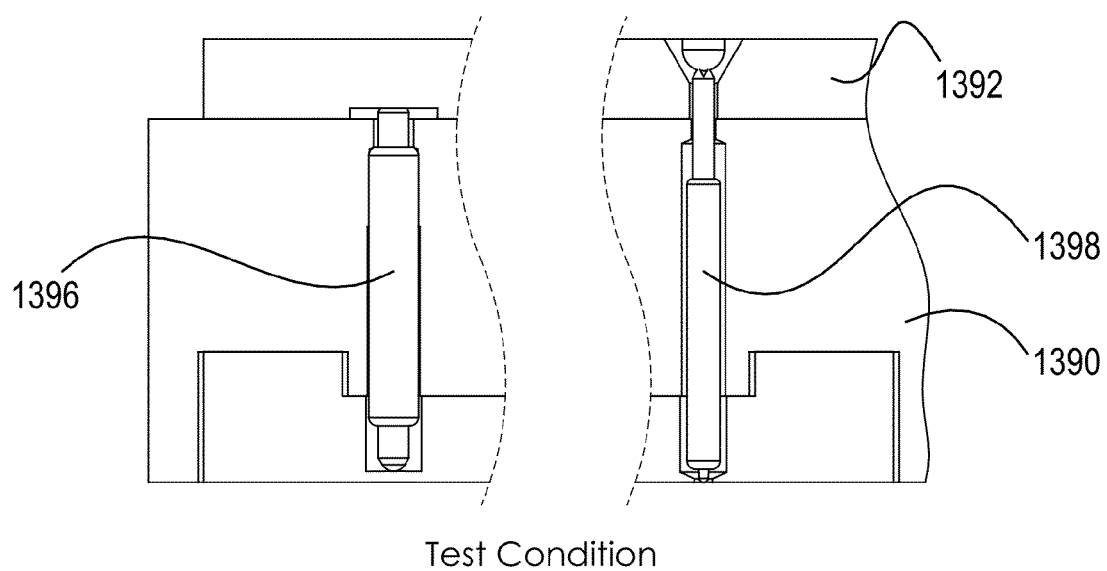

FIG. 13E is a perspective view of test socket 1390 and test socket insert 1392 showing a plurality of suspension support pins 1396, while FIGS. 13F and 13G are cross-sectional views illustrating a rest condition and a test condition, respectively. In this embodiment, there are four support pins 1396 along each of the four sides of insert 1392 (totaling sixteen support pins) supporting and stabilizing socket insert 1396.

Suspension support pins 1396 support socket insert 1392 in an elevated position (see FIG. 13F) above the recess surface of test socket 1390 and ensures that the one or more spring-loaded test pins 1398 do not protrude above the top surface of socket insert 1392 during the rest condition. As a result, the top surface of the socket insert 1392 is substantially smooth and free of any obstructive protrusions, thereby facilitating the proper alignment and placement of the device 1380 with respect to the test socket 1390 and the socket insert 1392.

Subsequently, as illustrated by FIG. 13G, during the test condition, after the device 1380 has been properly seated with respect to the socket insert 1392 and the test socket 1390, the test pin(s) 1398 are exposed to and come into contact with the corresponding pad(s) located at the substrate bottom device 1380.

Note that typical DUTs include square DUTs ranging from approximately 14 mm square to 50 mm square, and rectangular DUTs ranging from approximately 22 mm×25 mm to 24 mm×42 mm. Curvature of a typical DUT depends on factors such as the size, thicknesses, and/or aspect ratio of the substrate and the die. For example, a 50 mm square substrate has a profile that is about 250 mils higher in the middle of the substrate than the sides of the substrate. In this example, the corresponding socket insert should have a profile that is about 120 mils higher in the middle than the sides, thereby substantially reducing the flattening problem while allowing the test pins to function within their operational compression and expansion range during testing.

Many modifications and additions to the device testers described above are also possible. For example, the thickness and/or profile of different portions of the test socket insert may be varied enabling the socket insert to flex and conform in a manner (e.g., differentially across the socket insert) thereby generating substantially less overall stress, i.e., less flattening effect, on the DUTs (see the exaggerated cross-sectional view of FIGS. 13C and 13D). Test socket inserts may also be made from materials with a variety of stiffness and/or flexibility depending on the DUTs.

It may also possible to fabricate the socket inserts using two or more bonded materials that substantially match the temperature-related profile changes of the DUTs, in a manner similar to a bi-metallic strip, thereby reducing overall stress on the DUTs. Further, test sockets may also be heated and/or cooled to minimize temperature differences.

Figure 14A:
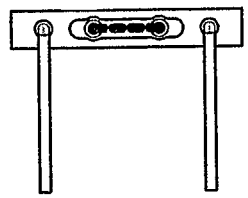
FIGS. 14A-14D are a front view, a top view, a perspective view and a blown-up view illustrating an exemplary fused heater in accordance with some embodiments of the present invention.
Figure 14B:
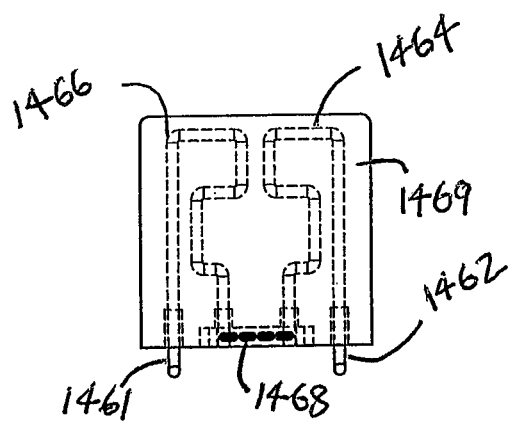
Figure 14C:
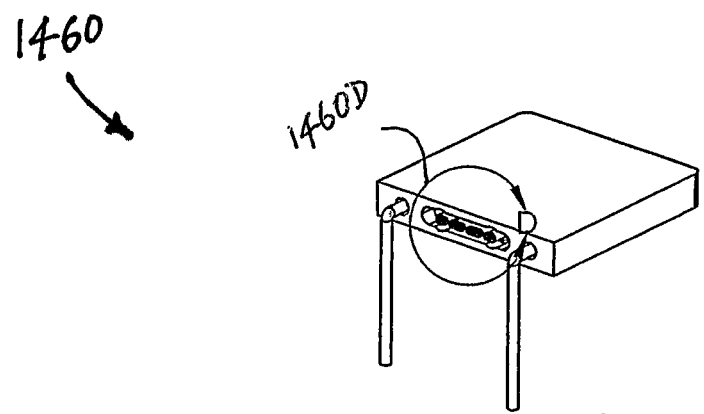
Figure 14D:
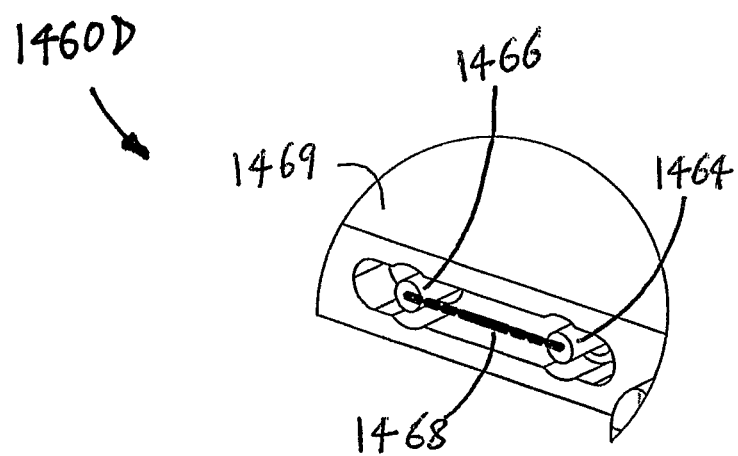

Referring now to FIGS. 14A-14D, are a front view, a top view, a perspective view and a blown-up view illustrating an exemplary heater 1460 for some embodiments of the device testers described above. Heater 1460 is configured to be operatively coupled to the pedestal of the device tester. Heater 1460 may be fused, thermally and/or electrically. For example, as shown in FIG. 14B, heater elements 1464, 1466 are linked by a fuse 1468, thereby completing a fuse circuit comprising of conductive lead 1461, heater element 1466, fuse 1468, heater element 1464, and conductive lead 1462. Fuse 1468 is located along an open edge of heater body 1469 and hence can be readily accessed during assembly, reconfiguration and/or maintenance. Exemplary fuse 1468 can be made from a material with a suitable melting point, approximately 300 degrees Celsius, thereby substantially reducing the risk of tester damage and/or fire hazards, such as spontaneous combustion.

In sum, the above embodiments exemplify systems and methods for testing of IC devices such as packaged semiconductor chips while preserving the devices' original specifications. The advantages include minimizing deformation of IC devices under test (DUTs) thereby reducing losses due to physical damage and/or poor contact alignment during subsequent assembly with motherboards.

It will be apparent to those of ordinary skill in the art that the invention may be embodied in various forms. For example, the materials used for fabricating the components of the thermal control unit would be readily apparent to persons skilled in the art upon review of the disclosure contained herein to ensure that the proper component functioning under the forces and temperatures required for IC device testing. Similarly, those of ordinary skill in the art, upon review of the disclosure contained herein and through routine experimentation, will be able to distinguish optional versus critical elements of the invention for different contexts. For example, those of ordinary skill in the art will recognize that the invention may require only one pusher in some instances, but may require a plurality of pushers in other.

It is to be understood that the foregoing description is intended to illustrate and not limit the scope of the invention. For example, while the above description has focused on a TCU for IC devices with bare die packaging, the invention is not limited to such packaging. Accordingly, the above-described pistons, swivelable inlet and outlet arms, and condensation abating means as described above may be used for TCUs constructed for testing lidded die packages as well as bare die packages. In addition, the invention is not limited to force-providing means having a construction as shown in the drawing. Those of ordinary skill in the art, upon review of the disclosure contained herein may devise various differ force-providing means for receiving a total z-axis force and controllably distributing the total z-axis force on different parts of IC packages. In any case, aspects of different embodiments of the invention may be included or excluded from other embodiments. Other aspects, advantages and modifications within the scope of the invention will be apparent to those skilled in the art to which the invention pertains.

Figure 15A:
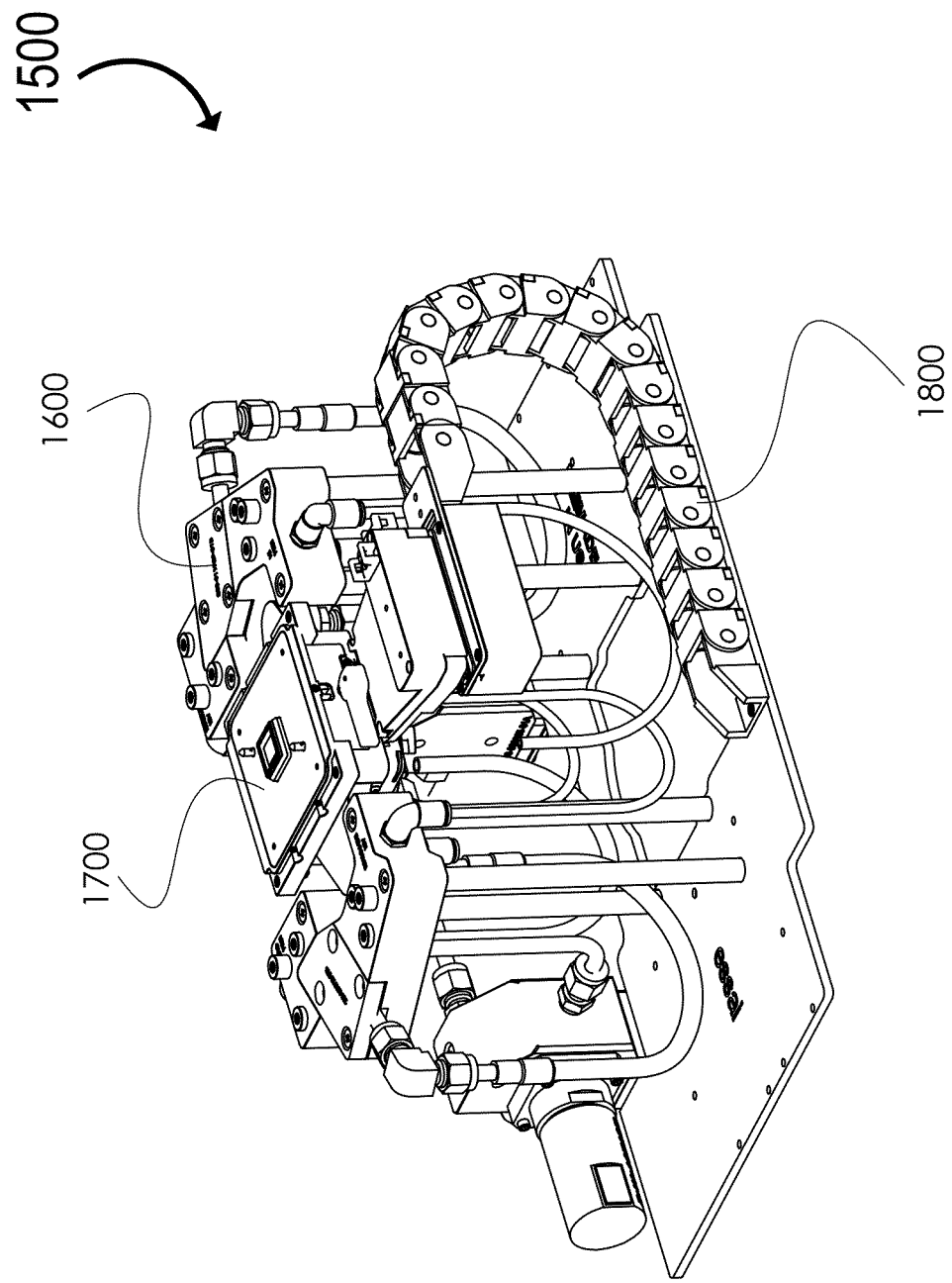
FIGS. 15A and 15B are perspective and exploded views of another exemplary embodiment of a thermal control unit (TCU) in accordance with the present invention.
Figure 15B:
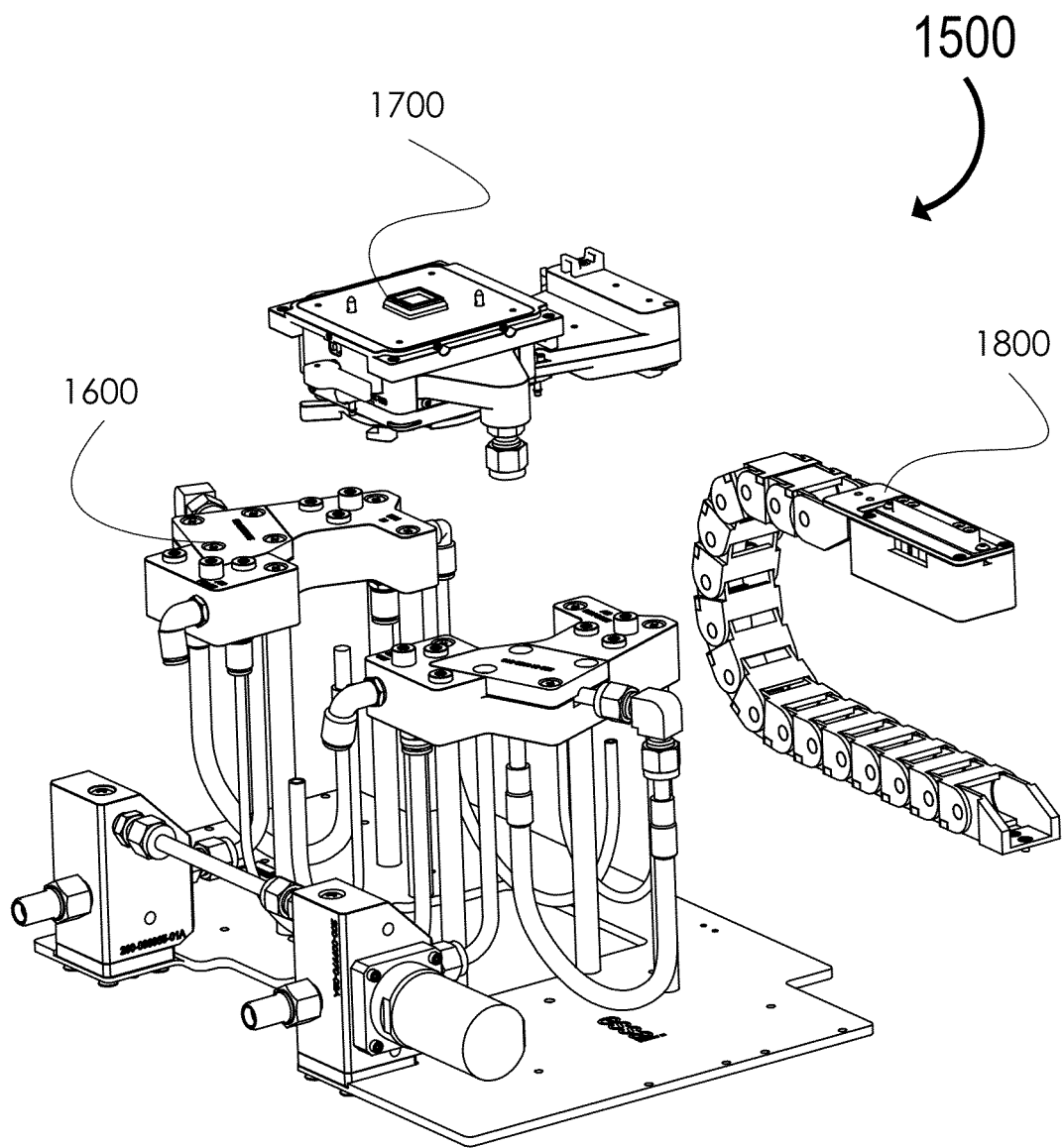

An exemplary embodiment of a thermal control unit (TCU) 1500 in accordance with the present invention is illustrated in FIGS. 15A and 15B. Advantages of this embodiment include a fast thermal response of approximately 40° C./second for an IC device under test (DUT), having a test surface area of approximately 30 mm×30 mm, and capable of testing over the temperature range of about −60° C. to 160° C.

Another important feature of this embodiment is the use of feedback mechanism to control the temperature of the device under test (DUT) and keep it fixed at a substantially stable temperature through out the duration of the testing using the TCU.

As illustrated in FIGS. 15A and 15B, the thermal control unit (TCU) 1500 comprises of three main subsystems, namely the fluid management system (FMS) 1600, the thermal head unit (THU) 1700, and the flexible cable chain assembly 1800. The fluid management system (FMS) 1600 provides the support and connections to the thermal head unit (THU) 1700 supplying it with fluid (liquid and gas) for the pneumatic actuation, cooling and temperature control, and condensation abating. The flexible cable chain assembly 1800 integrates the cables providing the electrical connections to the thermal head unit 1700 with the needed cables housed in a flexible chain. The subsystems 1600, 1700, and 1800 are described in detail below.

Figure 16A:
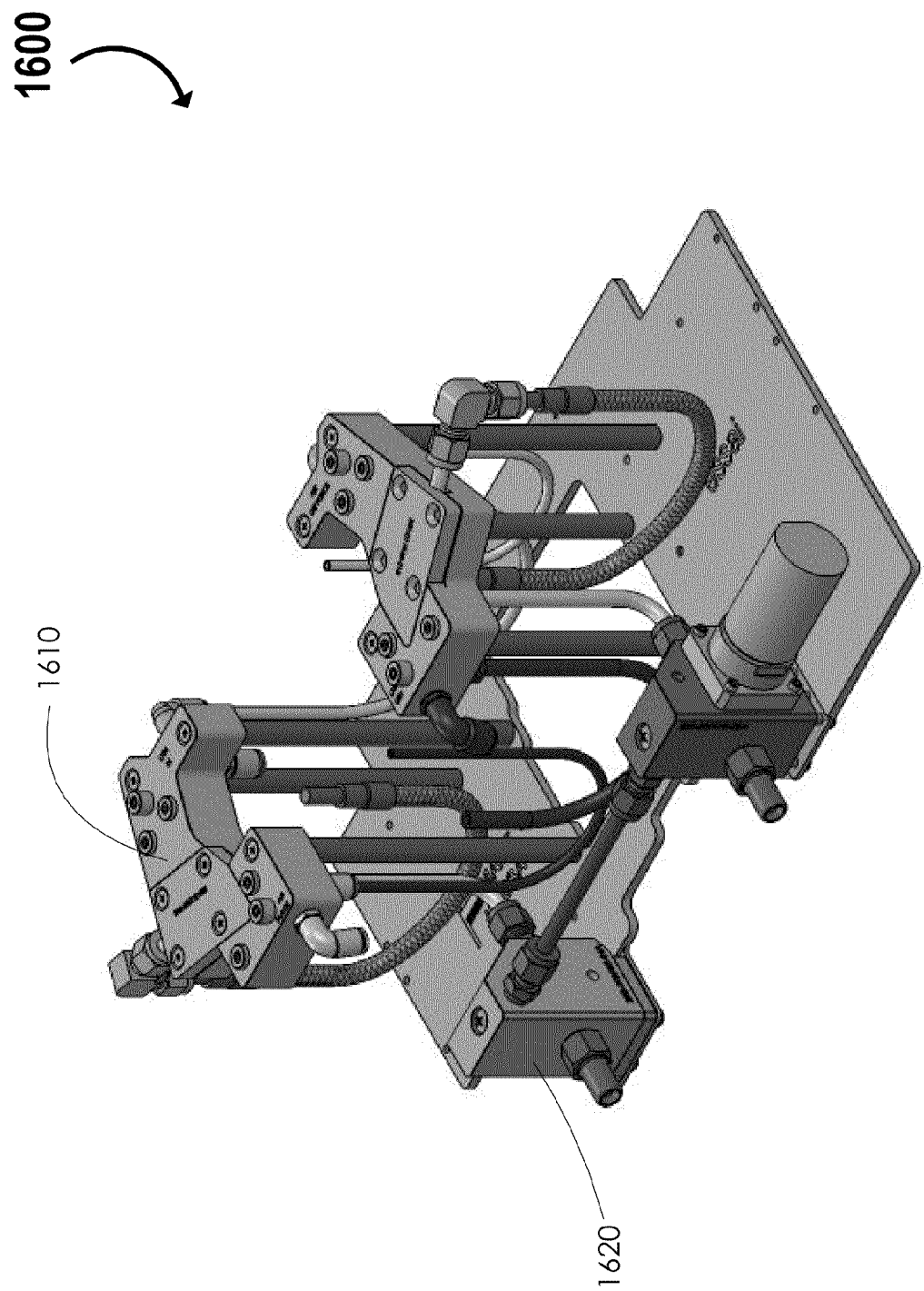
FIGS. 16A and 16B are perspective and exploded views of the Flow Management System (FMS) in accordance with the present invention.
Figure 16B:
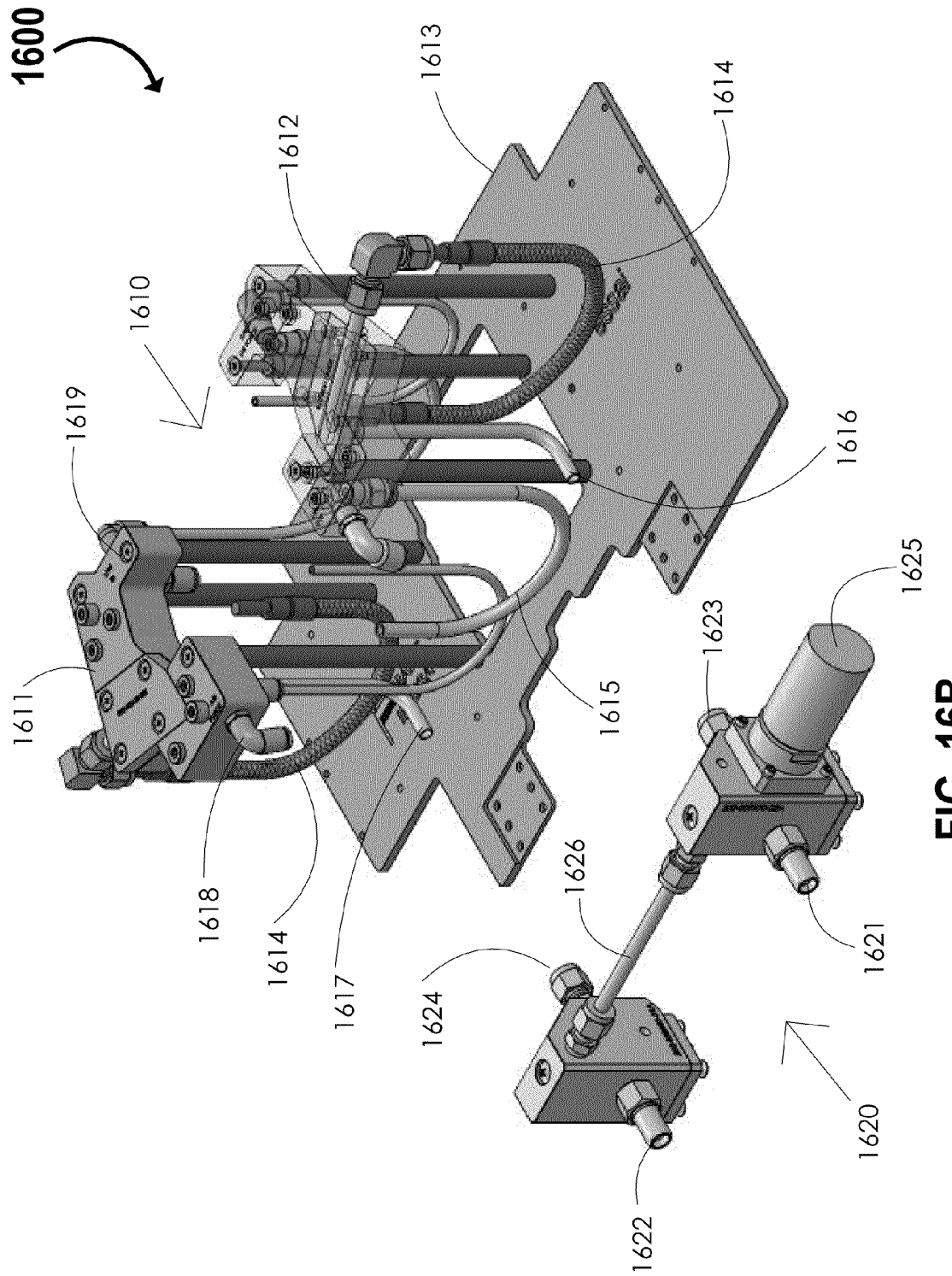

The fluid management subsystem 1600 is depicted in FIGS. 16A and 16B. It is comprised of the inner manifold 1610 and the outer manifold 1620. The mounting towers 1611 provide the mount for the thermal head unit 1700. Each of the mounting towers is supported on three supporting columns 1612 which are securely fastened to the TCU base 1613. The U-shaped hoses 1614 carry the chilled cooling fluid and are shaped in a U-shape to avoid destabilizing the thermal head unit (THU) 1700 during testing. Tubes 1615 carry the Liquid Thermal Interface Material (LTIM) to the thermal head unit 1700. The function of the LTIM is discussed later when the details of the thermal head unit 1700 is given. The tubes 1616 and 1617 are hooked to the outer manifold 1620. The chilled fluid enters through 1616 and leaves the inner manifold 1610 through the tube 1617 to the outer manifold 1620. The connector 1618 provides an auxiliary inlet port for providing dry gas for condensation abating. The connector 1619 provides the auxiliary outlet port for the dry gas.

In the outer manifold 1620, the port 1621 is the inlet for the chilled fluid and 1622 is the outlet for the chilled fluid. The port 1623 hooks to the tube 1616 providing the flow of the chilled fluid to the inner manifold. The port 1624 hooks to the tube 1617 the chilled fluid flows outward from the inner manifold to the outer manifold 1620. The flow in the outer manifold 1620 is controlled by the solenoid valve 1625. The tube 1626 provides inlet-outlet bypass allowing the chilled fluid to flow directly from the inlet port to the outlet port to avoid having a stagnant flow in the inner manifold.

Figure 17A:
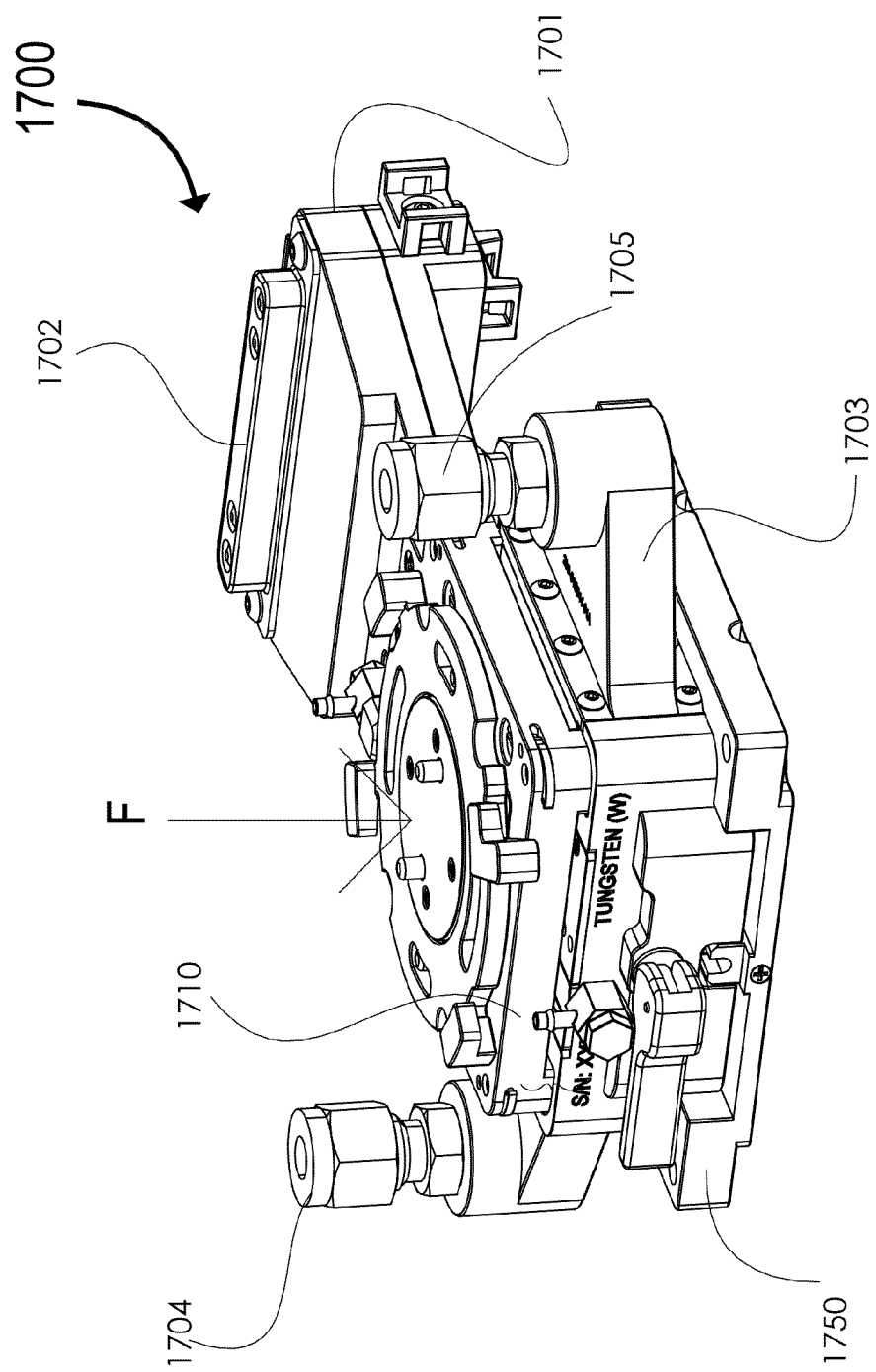
FIGS. 17A and 17B are perspective and exploded views of the Thermal Head Unit (THU)
Figure 17B:
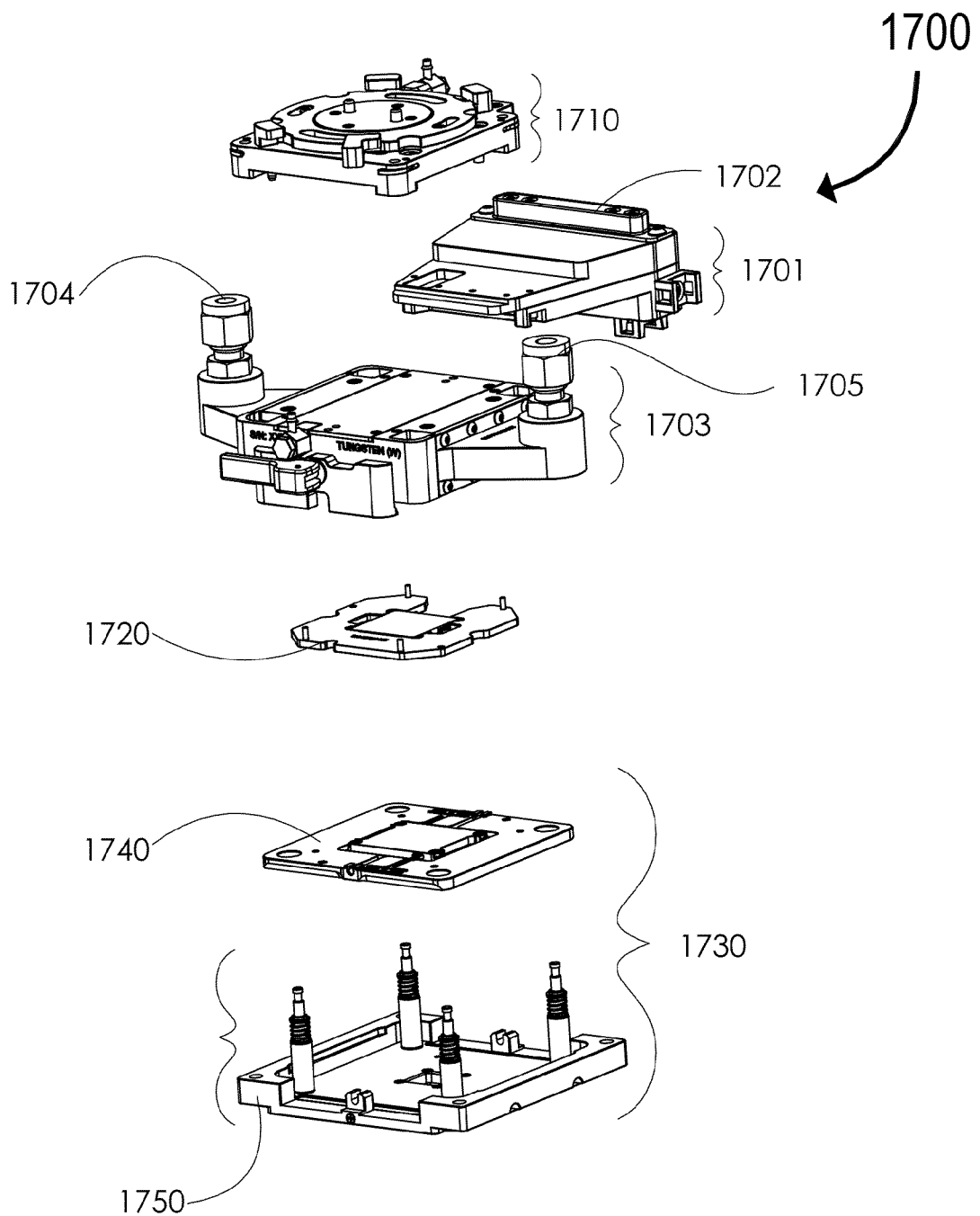

The thermal head unit (THU) 1700 is shown in a prospective view in FIG. 17A. An exploded view for the thermal head unit (THU) 1700 is depicted in FIG. 17B. The THU is comprised of the connector unit 1701, the fluid circulation block 1703, the gimbal module 1710, the heater assembly 1720, and the device kit module 1730 which is comprised of the pedestal assembly 1740 and the pusher assembly 1750.

The connector unit 1701 is attached to the fluid circulation block 1703. It transfers electrical signals coming from and propagating to the connector terminal 1702.

In some embodiment, fluid is introduced into and is evacuated from the fluid circulation block 1703 by fluid inlet and outlet connectors 1704 and 1705. In operation, the fluid connectors 1704 and 1705 are securely coupled to the U-shaped hoses 1614 (FIG. 16B) which carries the chilled cooling fluid to the thermal head unit (THU) 1700 during testing.

Figure 17C:
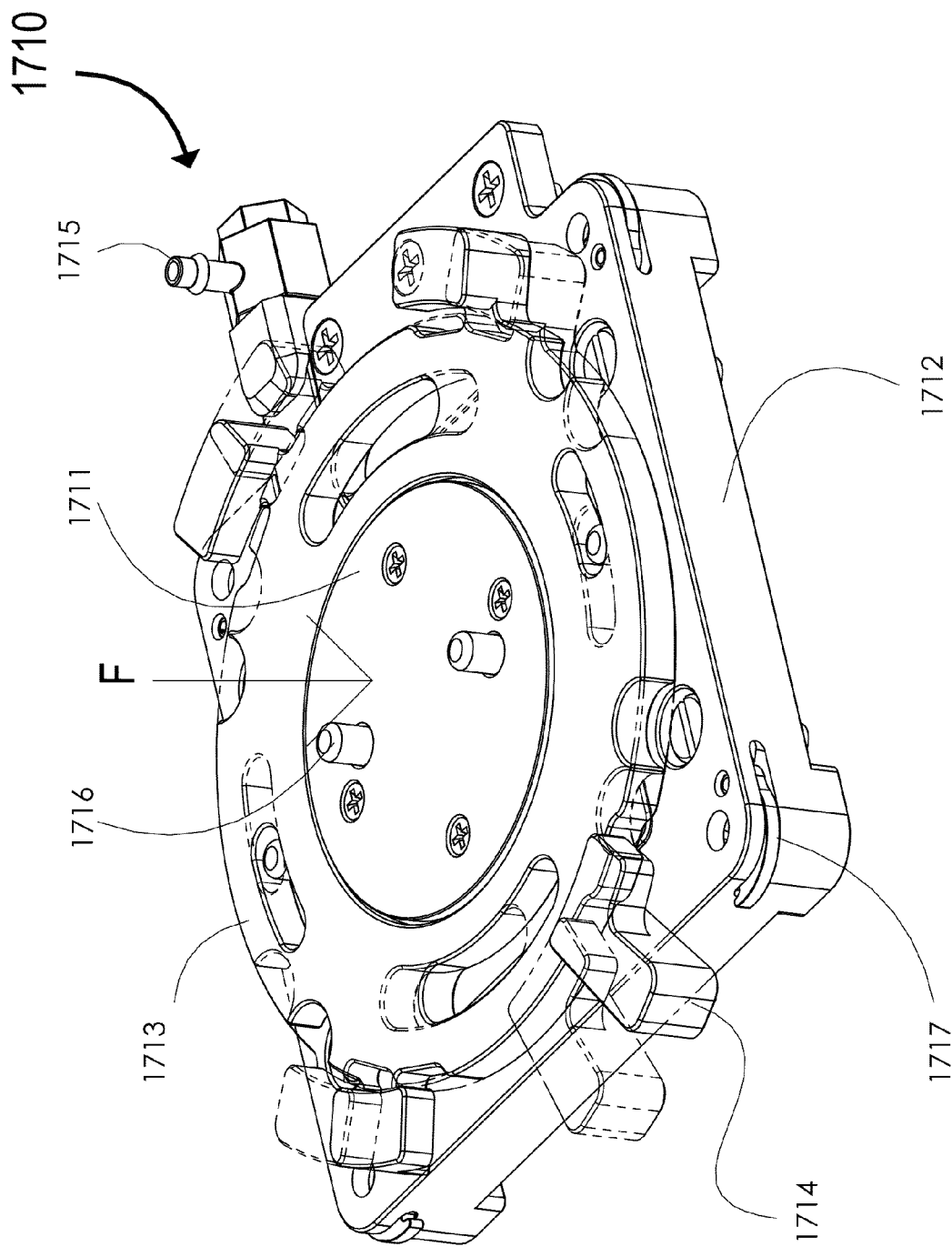
FIGS. 17C and 17D are perspective views of the gimbal module.

The gimbal module 1710 (also called the Gimbal) is shown in FIGS. 17C (top view) and 17D (bottom view), it which provides the z-axis force denoted by the arrow F that is transmitted to the pedestal assembly 1740 and the pusher assembly 1750. The gimbal adapter 1711 is mounted on the force distribution block 1712 and fits easily in place without the need to use any tools by utilizing the rotary coupler 1713 which is provided with the quick-release clips 1714. The inlet 1715 provides the pressured fluid to effect the pneumatic actuation in the gimbal module 1710. It may be connected to a source of pressured fluid. Although pressured air is typically used, the pressured fluid may be a gas other than air or a liquid. For example suitable oils, water, or aqueous solutions known to the skilled in the field, may be used for the pneumatic action. The pins 1716 ensure the accurate alignment of the gimbal adapter 1711 relative to the force distribution block 1712. The quick-release clips 1717 facilitate the mounting and dismounting of pusher assembly 1750 easily, in a short time, and without the need to use any tools.

Figure 17D:
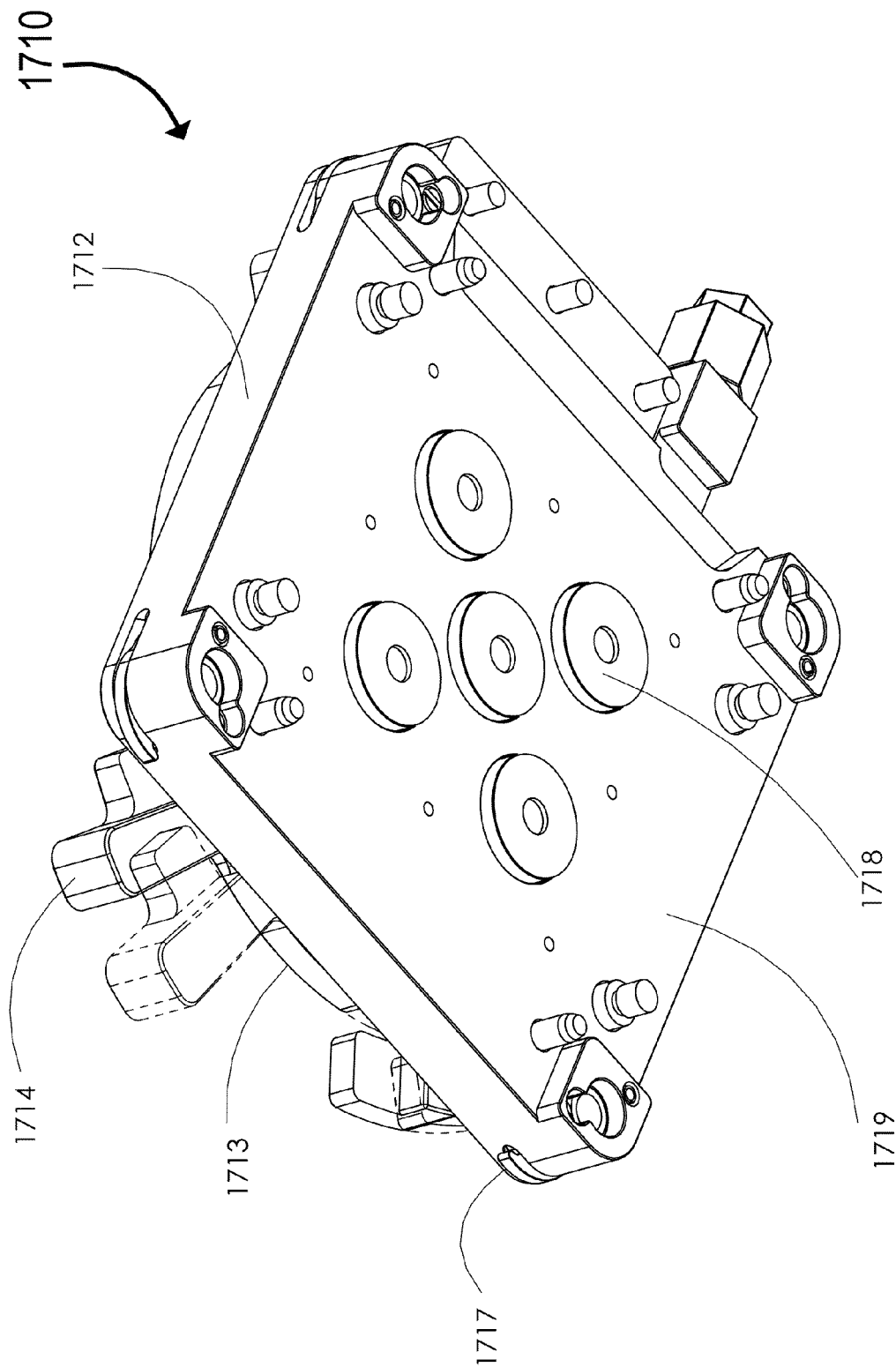

Referring to FIGS. 17C and 17D, the force changing actuator for the force distribution block can be provided in the form of at least one and preferably a plurality of pistons 1718 nested in bottom surface 1719 of the z-axis force distribution block 1712. Pistons 1718, which are preferably evenly spaced in a grouping centered in the bottom to the force distribution block 1712, and can be actuated in the z-axis direction by altering fluid pressure behind the pistons. Fluid pressure is provided to the pistons from inlet 1715.

Figure 17E:
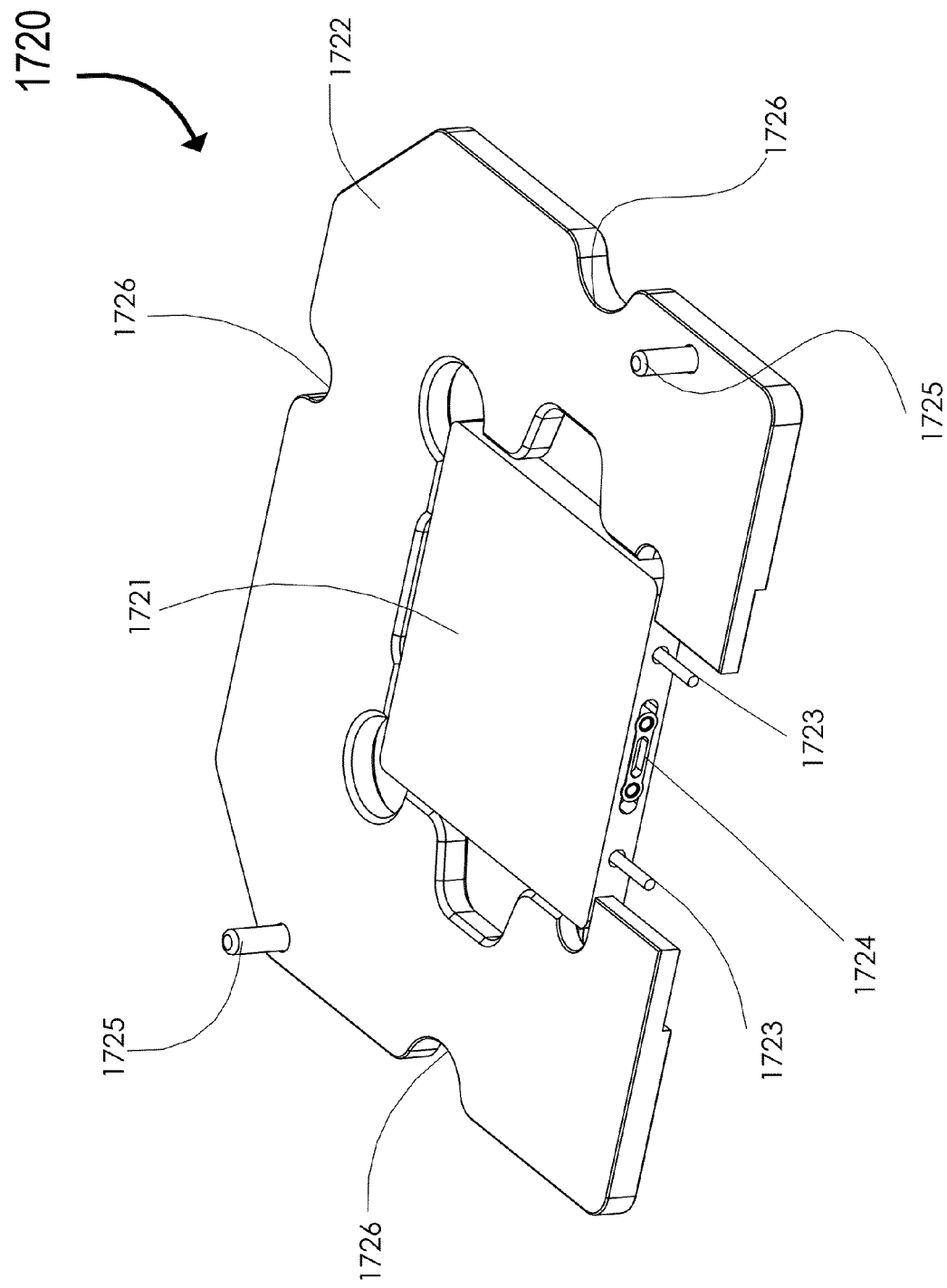
FIG. 17E is a perspective views of the heater assembly.
Figure 17F:
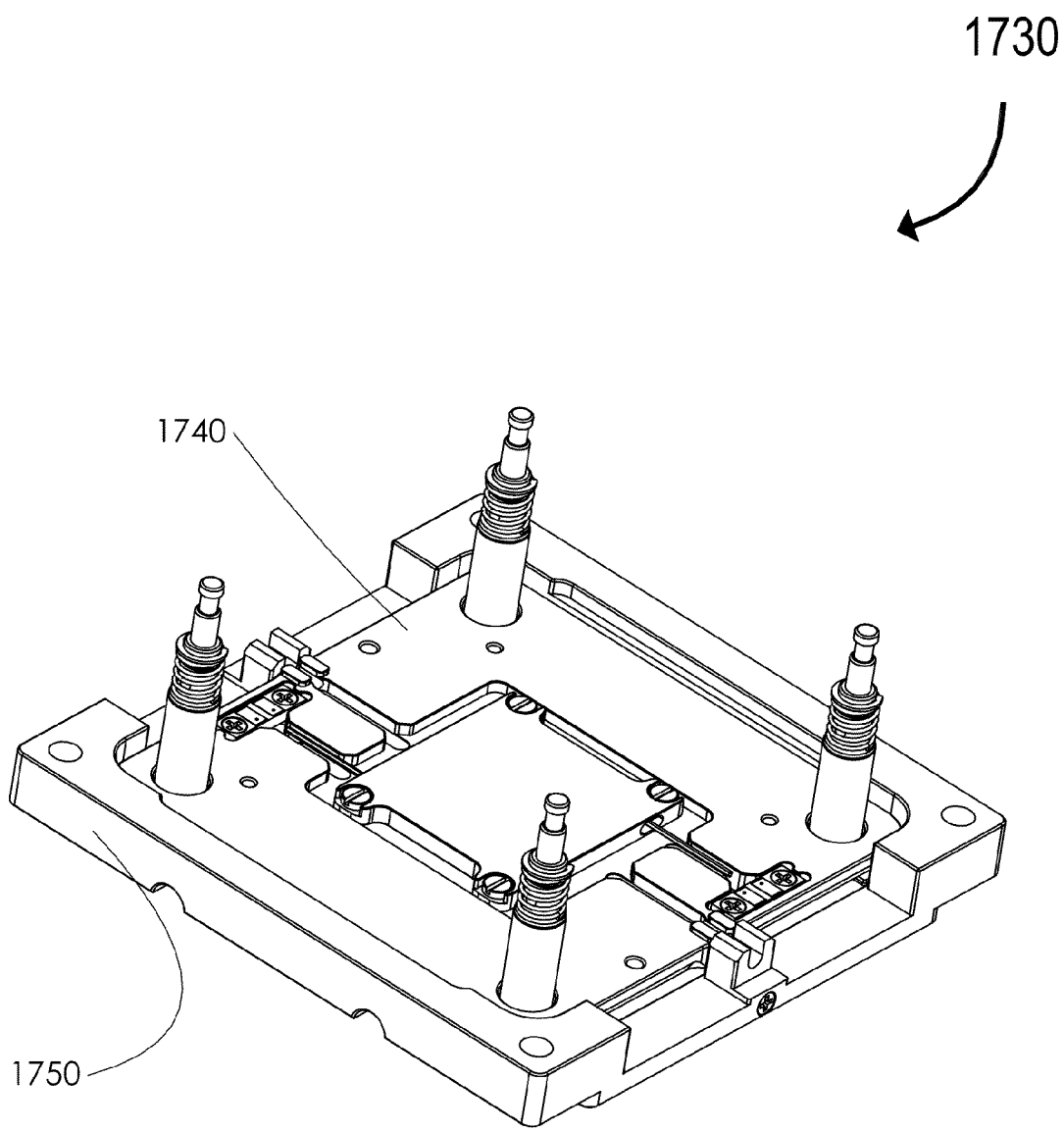
FIGS. 17F, 17G, and 17H are perspective and exploded views of the Device Kit Module.
Figure 17G:
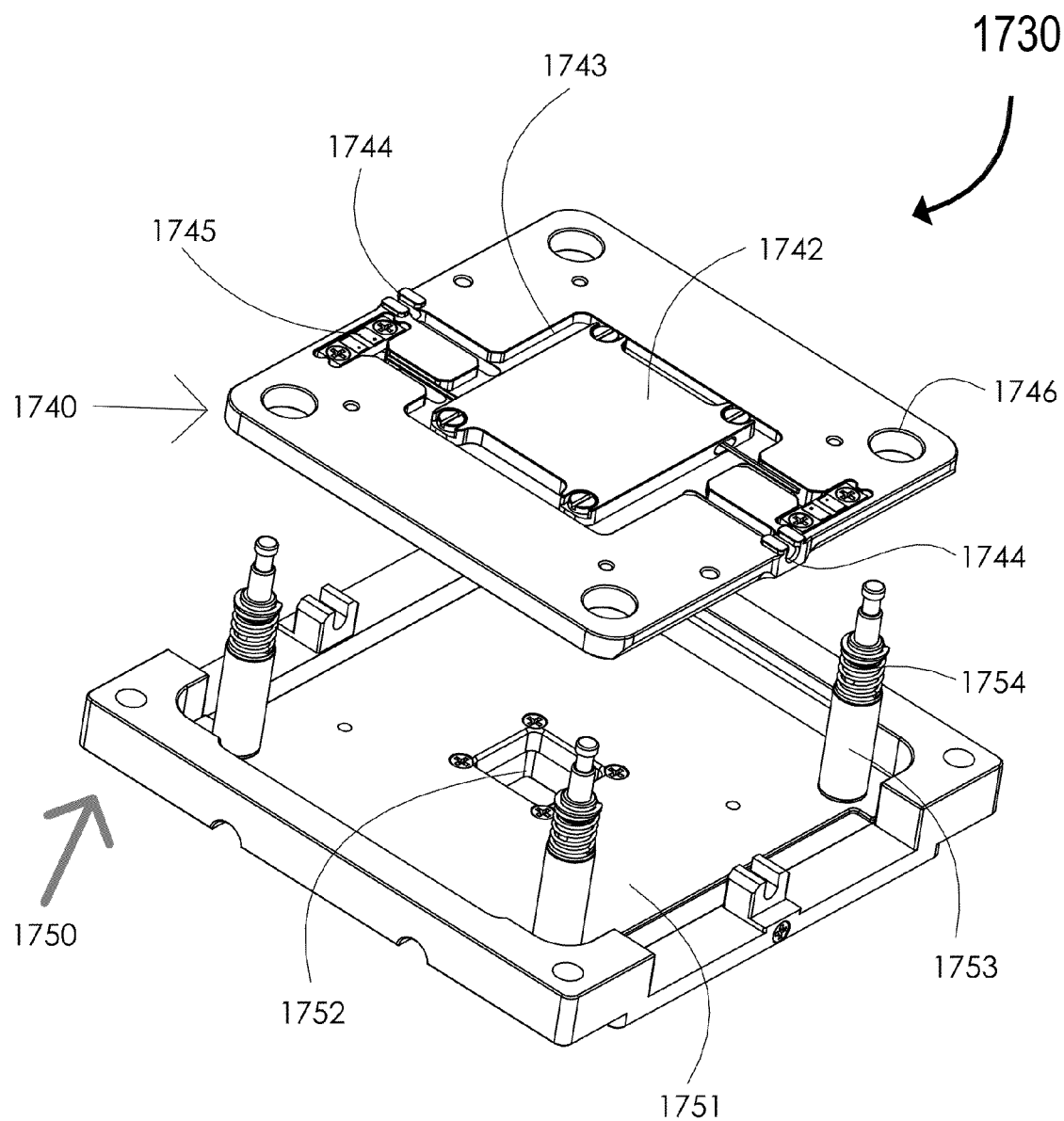
Figure 17H:
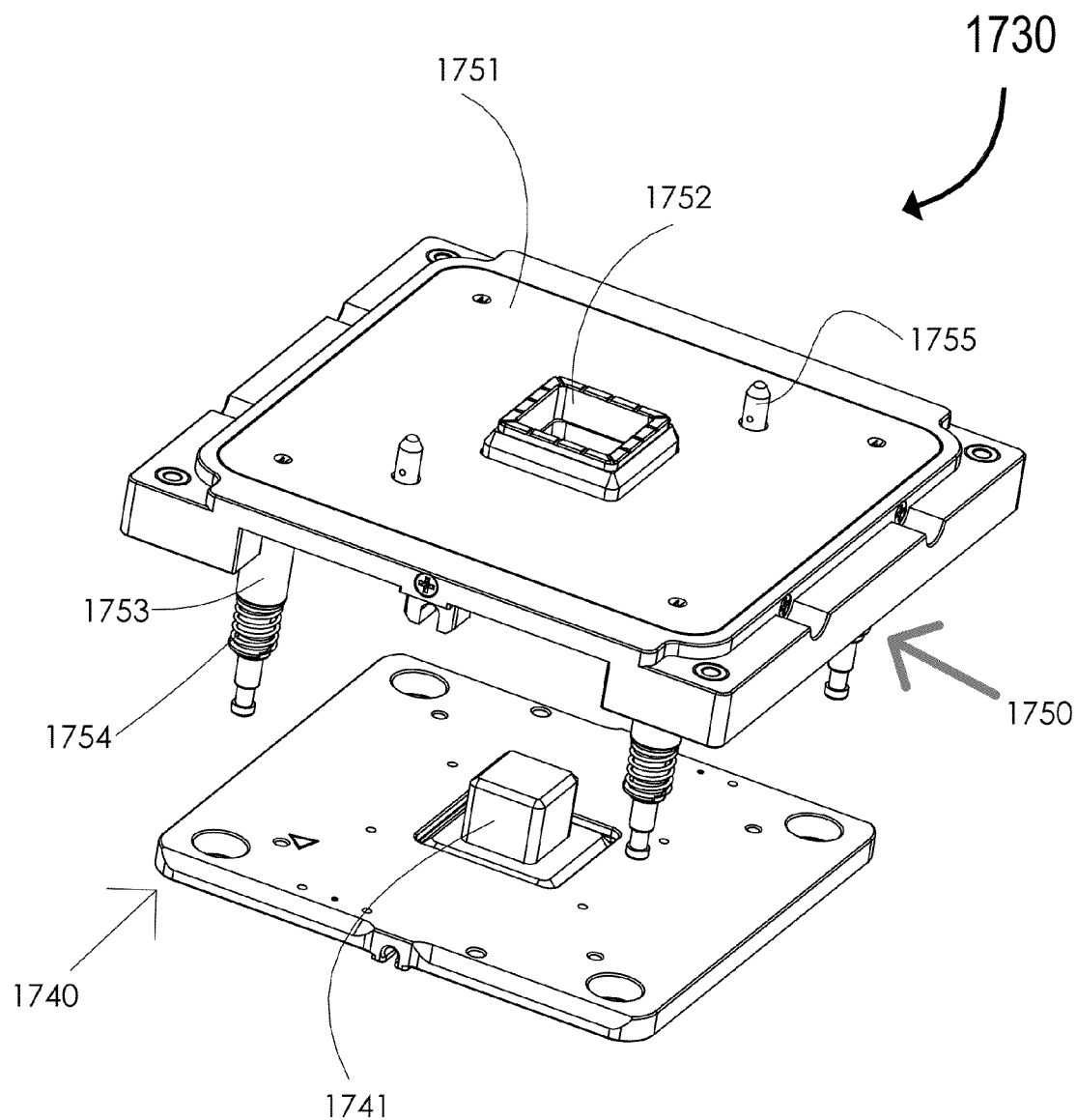

The heater assembly 1720 is shown in FIG. 17E. The heater 1721 is supported within the isolator plate 1722. The heater is an electro-thermal heater where the heat is generated as a result of the flow of electric current flows through a resistance embodied in a suitable material including a ceramic such as aluminum nitride (AlN) which has suitable thermally-conductive properties. The current is supplied through the heater electrical leads 1723. A fuse 1724 is inserted in the resistance circuit. It can be made of a material having a relatively low temperature melting point such as lead. It protects against temperature runaway. The pins 1725 ensure the alignment of the heater assembly within the thermal head unit 1700. The isolator plate 1722 may be made of a material with low thermal conductivity such as plastics. The furrows 1726 are provisions for alignments with the device kit module 1730.

FIGS. 17 G, 17F, and 17H illustrate the device kit module 1730 and its two components; the pedestal assembly 1740 and the substrate pusher assembly 1750. The pedestal assembly 1740 comprises a heat-conductive pedestal 1741 which is having a bottom end configured to contact the die of the DUT. The top side of the pedestal is in direct contact with the heat exchange plate, known as the cold plate, 1742 which is a thin plate made of copper for its superior thermal conductivity. The cooper in the cold plate 1742 is plated with nickel for durability and oxidation protection. The cold plate 1742 is surrounded by channels 1743 that carry the Liquid Thermal Interface Material (LTIM) to enhance the thermal conductivity between the cold plate 1742 and the heater 1721 and between the cold plate 1742 and the heat-conductive pedestal 1741. The LTIM are fluidly communicated to the channels 1743 through the ports 1744.

In operation the cold plate 1742 is configured to be in direct contact with the heater 1721 on one side and in direct contact with the heat-conductive pedestal 1741 on the other side. The resistive thermal devices (RTDs) 1745 are the temperature sensors that detect the temperature of the cold plate 1742 and feed back the detected temperature to an external temperature control system (not shown).

The substrate pusher assembly 1750 is configured to contact the substrate of the DUT. This pusher assembly 1750 includes a rigid pusher plate 1751 and is suitably fabricated of a metal material, such as aluminum, for rigidity. The bottom pusher plate has a center opening 1752 to allow the pusher end of the heat-conductive pedestal 1741 to project through the pusher plate. The pusher assembly 1750 is spring loaded for exerting a z-axis compliant force F to the die of the DUT through the heat-conductive pedestal 1741 and to the substrate of the DUT by the rigid pusher plate 175. The pins 1753 hold substrate pusher assembly 1750, the pedestal assembly 1740, and the heater assembly 1720 tightly together using the preloaded springs 1754 which are typically kept under compression. The pins 1753 are aligned with the holes 1746 in the pedestal assembly 1740 to ensure proper alignment of the device kit module 1730. In operation, the pins 1755 align the device kit module 1730 to the socket assembly supporting the DUT.

Figure 17I:
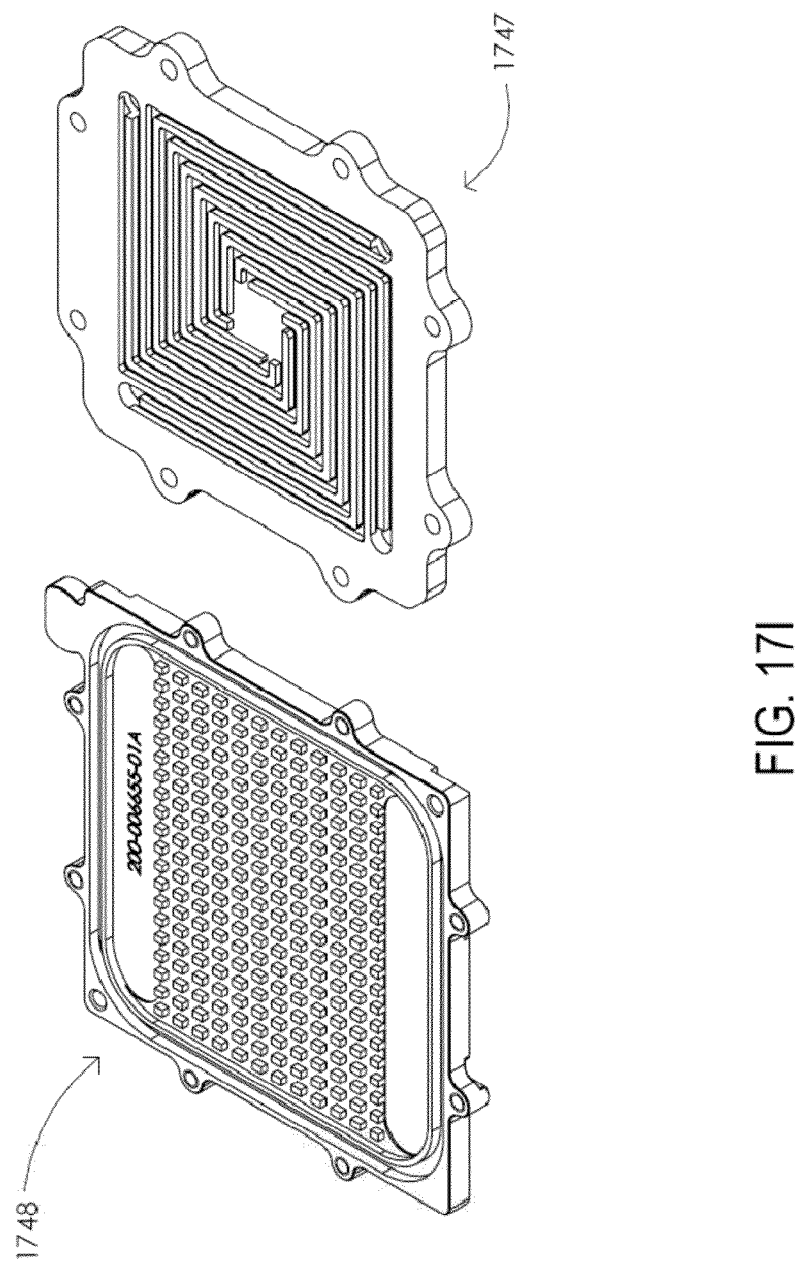
FIG. 17I is a perspective view of the inner structure of the heat exchanger plate (cold plate)
Figure 17J:
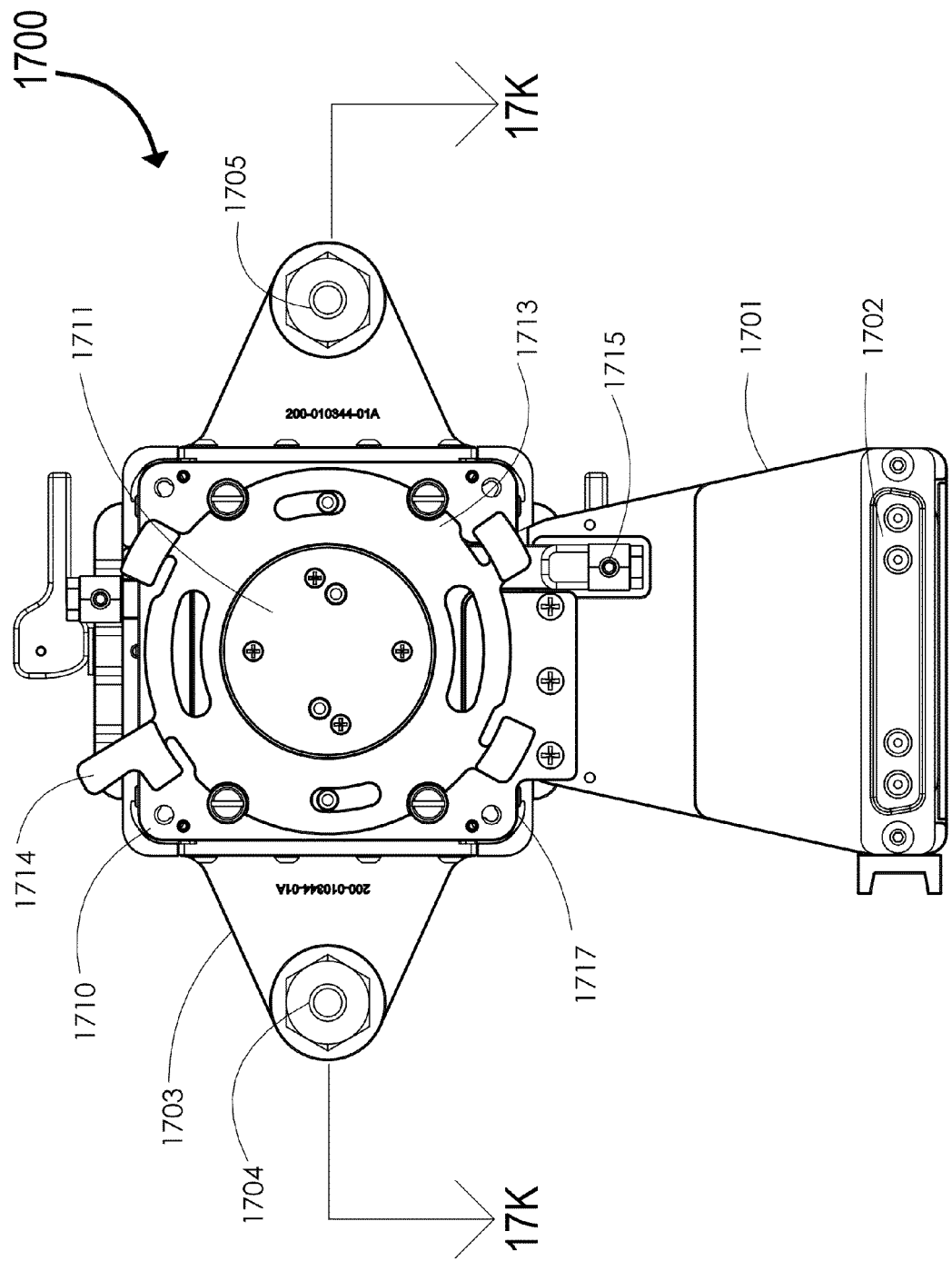
FIGS. 17J and 17K are top view and a cross-sectional view along the line 17K-17K for the thermal head unit (THU)

FIG. 17I shows two different configurations for the inner structure of the cold plate 1742. To enhance the heat exchange efficiency of the cold plate 1742. In the configuration 1747, the inner structure follows the pattern of a spiral of parallel channels. In the configuration 1748, the inner structure is composed of arrays of micro-channels.

Figure 17K:
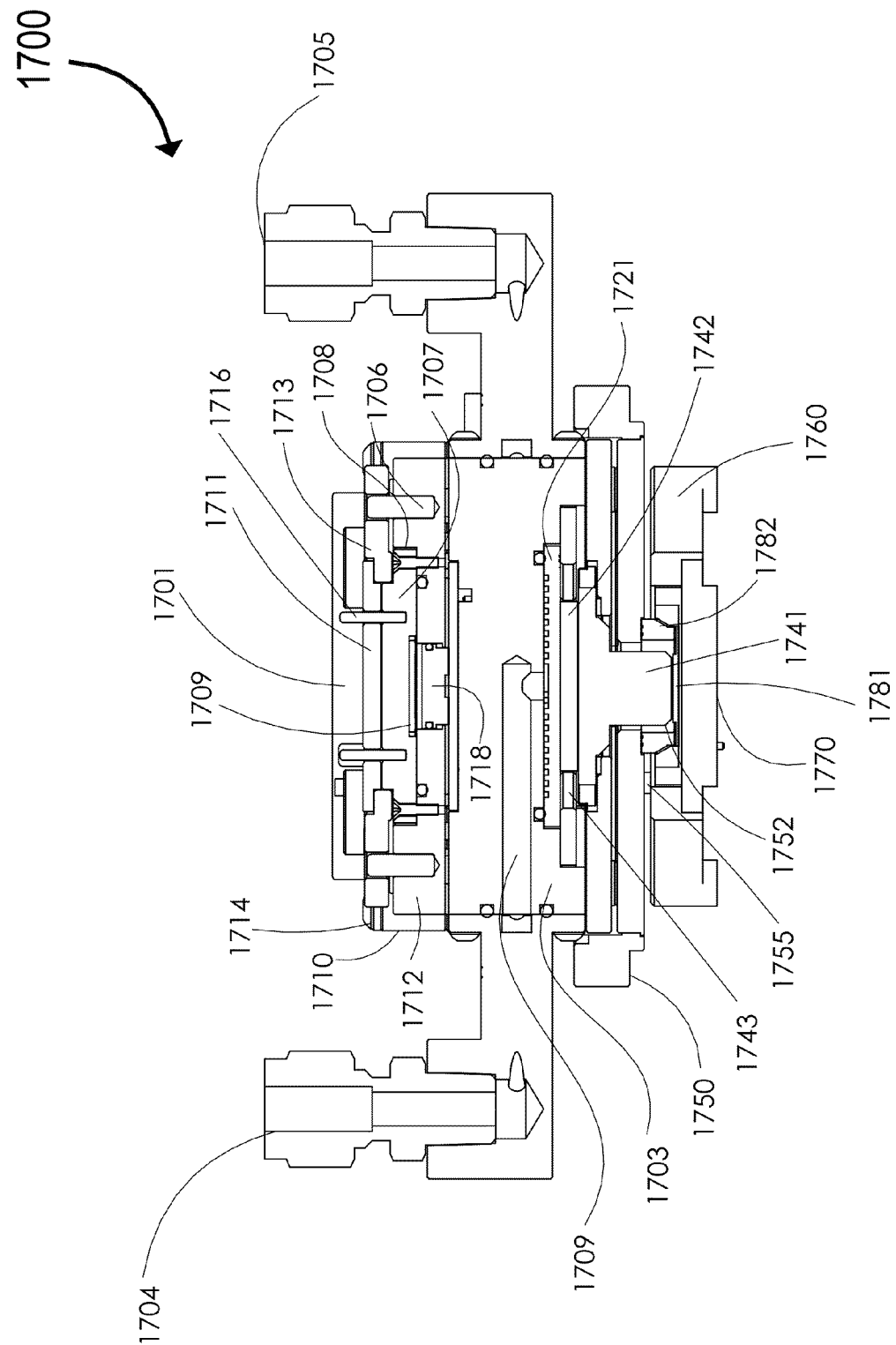

FIG. 17K shows the sectioned 17K-17K (FIG. 17J) through the components comprising the thermal head unit (THU) 1700 in stacked relationship along a z-axis together with the socket assembly 1760 and the socket insert 1770 that supports the DUT. The projection of the cables connector unit 1701 is followed by the gimbal adapter 1711. The pins 1716 ensure the alignment of the gimbal adaptor 1711 in the rotary coupler 1713. The gimbal adapter 1711 is mounted on the force distribution block 1712 and fits easily and uniquely in place without the need to use any tools by utilizing the rotary coupler 1713 which is provided with the quick-release clips 1714. The pins 1706 provide a hard-stop to the gimbal adapter 1711 in the rotary coupler 1713. The force distribution block 1712 has the top cover 1707 that fits in a recess 1708. The channel 1709 is a passageway for the pressured fluid to effect the pneumatic actuation in the pistons 1718. The piston 1718 is centered in the bottom to the force distribution block 1712. Connectors 1704 and 1705 are the inlet and outlet to the fluid circulation block 1703. The chilled fluid is transformed through the fluid passageway 1719 imbedded in the fluid circulation block 1703. The heater 1721 is in direct contact on top of the cold plate 1742 which firmly stacked over the heat-conductive pedestal 1741. The bottom pusher plate has to allow the pusher end of the heat-conductive pedestal 1741 project through the center opening 1752 in pusher plate 1751. The pusher assembly 1750 is spring loaded for exerting a z-axis compliant force F to the die of the DUT through the heat-conductive pedestal 1741 contacting and pushing against a thermally active central portion of an IC chip, such as the die of the DUT 1781 and to the substrate of the DUT 1782 by the rigid pusher plate 1751.

In operation, the temperature of the DUT is maintained at a test specified value utilizing a temperature feedback mechanism. The RTD sensor 1745, in the thermal control unit (TCU) 1500, sends the value of the detected temperature to an external controller which controls both temperatures of the heater 1721 and the flow of the chilled fluid. The temperature of the heater 1721 is changed by adjusting the electrical current flowing into the heater 1721 through the heater electrical leads 1723. The flow of the chilled fluid is controlled by changing the electrical current flowing into the solenoid valve 1625.

Figure 18:
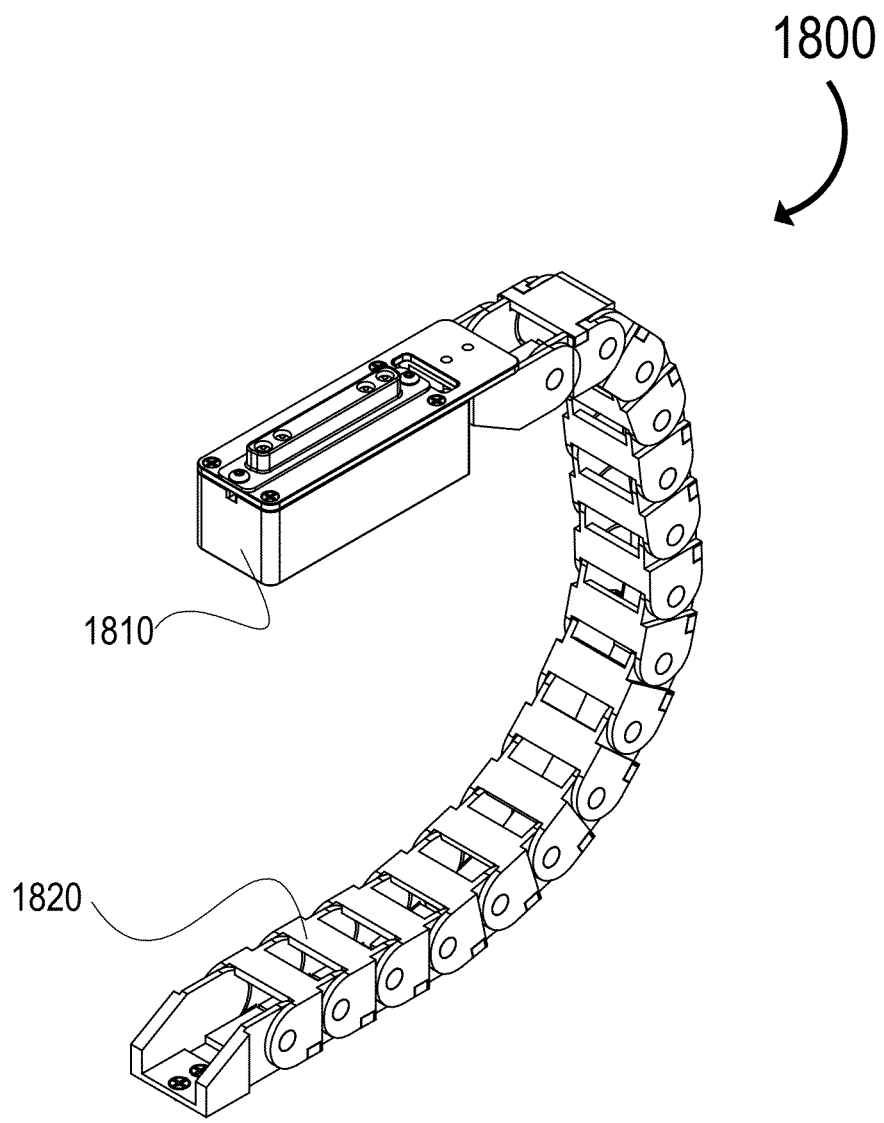
FIG. 18 is a perspective view of the flexible cable chain assembly.

FIG. 18 shows the flexible cable chain assembly 1800, within which the electrical cables connecting to the thermal head unit (THU) 1700 through the electrical connector 1810 having a quick-release feature to connect without the use of tools to the connector 1702. Accordingly, the chain can be an assembly of attached separate segments 1812 to provide flexibility of the chain and thereby substantially enhancing the stability of the thermal head unit (THU) 1700 during testing.

Figure 19A:
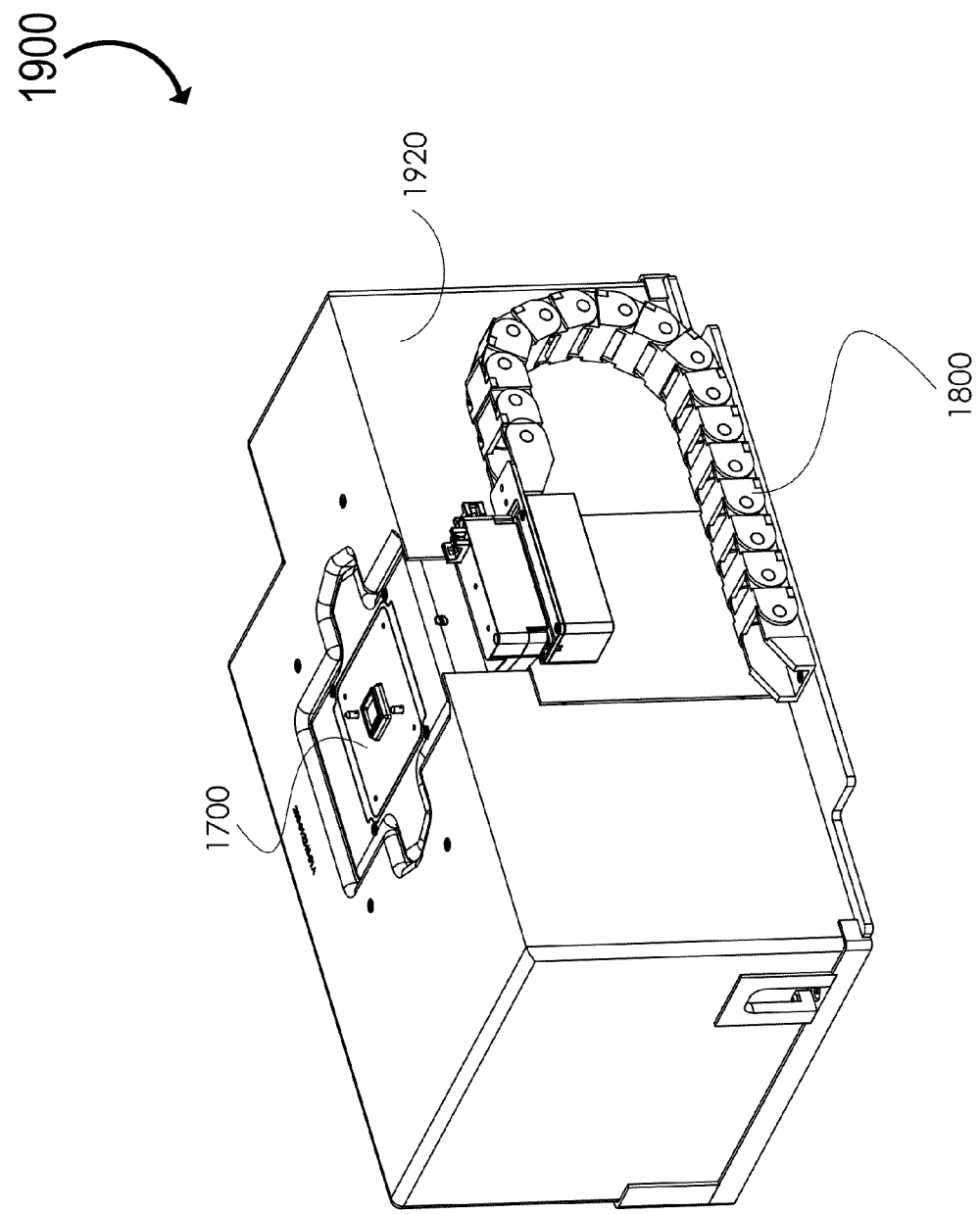
FIGS. 19A and 19B are perspective and exploded views of the thermal control unit (TCU) with the dry boxes for condensation abatement.
Figure 19B:
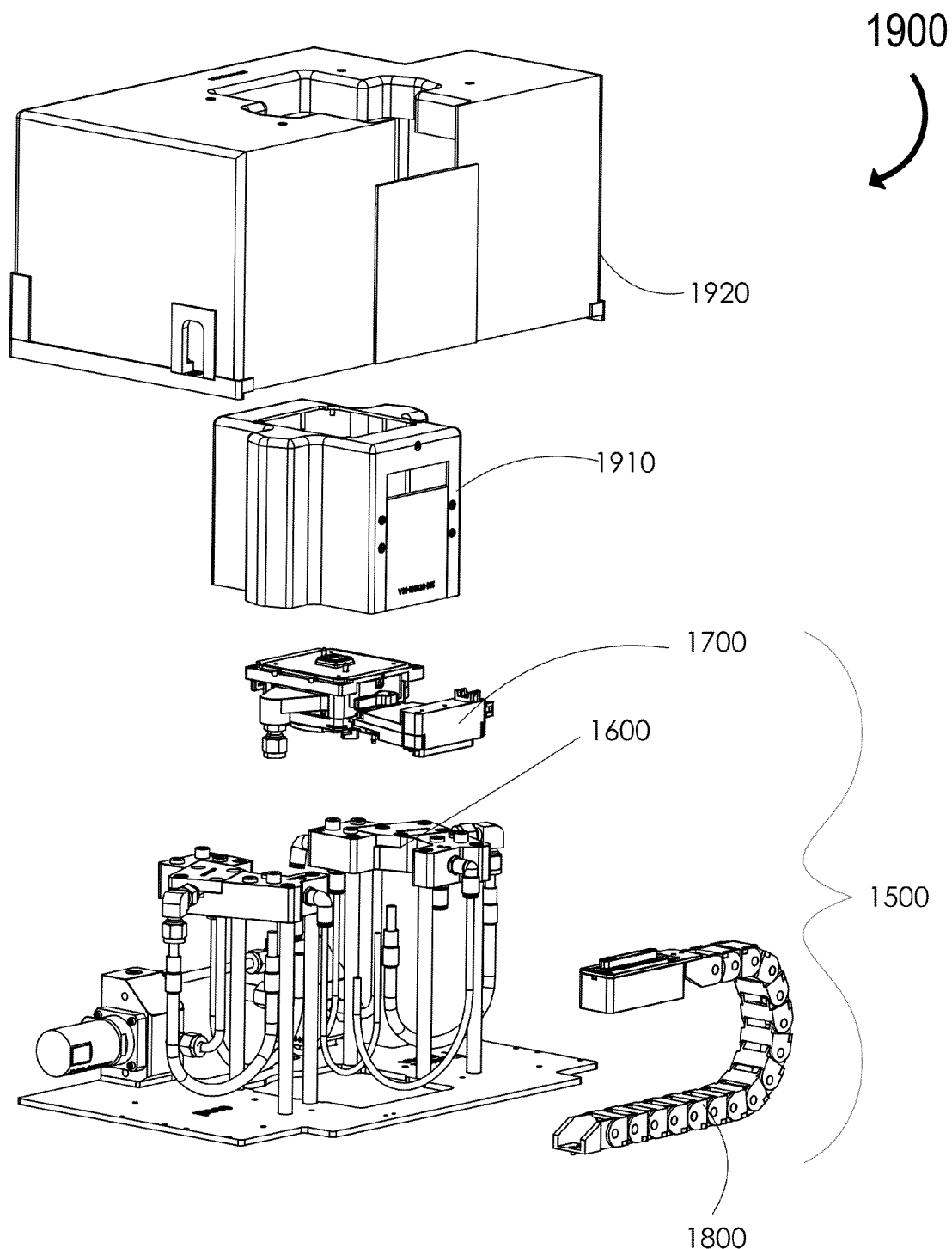

Yet in another embodiment, schemes for abating condensation are provided. Such methods include a condensation-abating gas inlet and condensation-abating gas transporting passageways in the thermal head unit (THU) 1700 near surfaces of the thermal control unit (TCU) 1500 on which condensation may occur. Another means for abating condensation 1900 is depicted in FIGS. 19A and 19B. The thermal control unit (TCU) 1500 is enclosed in two dry boxes 1910 and 1920 they provide a contained dry environment filled with condensation-abating gas. The smaller box 1910 covers the thermal head unit (THU) 1700 and the larger box 1920 contains the dry environment around the fluid management system 1600.

It is be noted that in testing integrated circuit (IC) the device under test (DUT) can be a substrate having multiple IC chips having different heights and testing requirements in terms of forces applied and temperatures of testing. One embodiment of a compliant pedestal is herein described.

Figure 20:
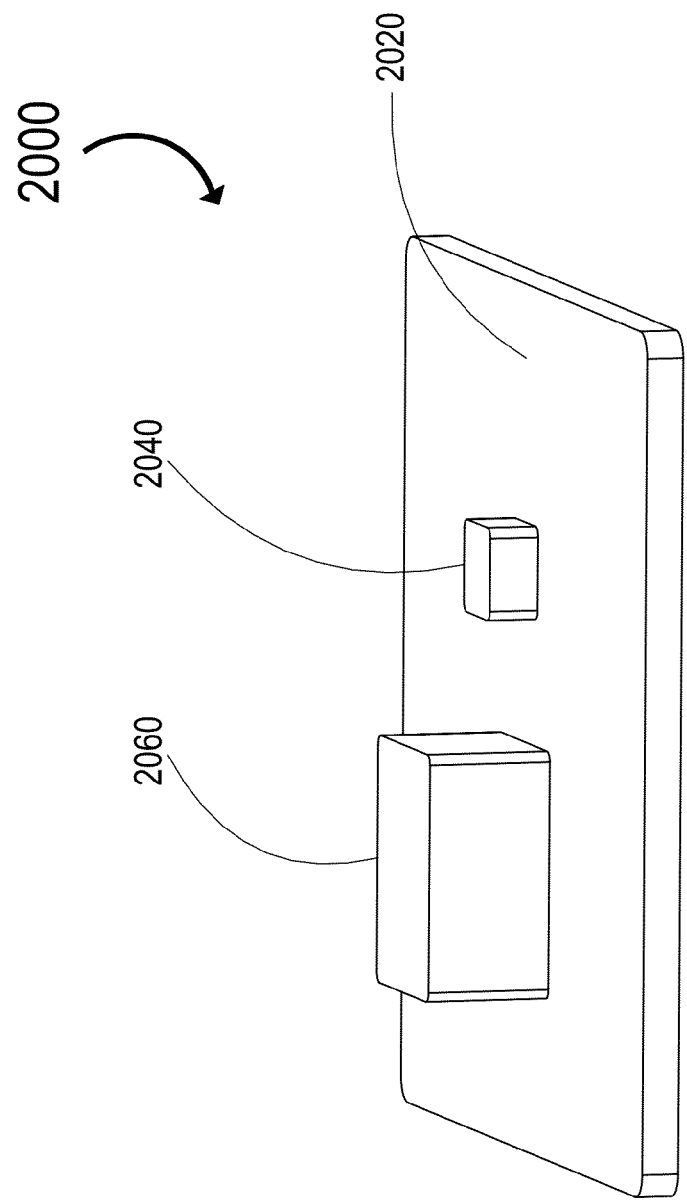
FIG. 20 shows a simplified multi-chip substrate having two IC chips.
Figure 21:
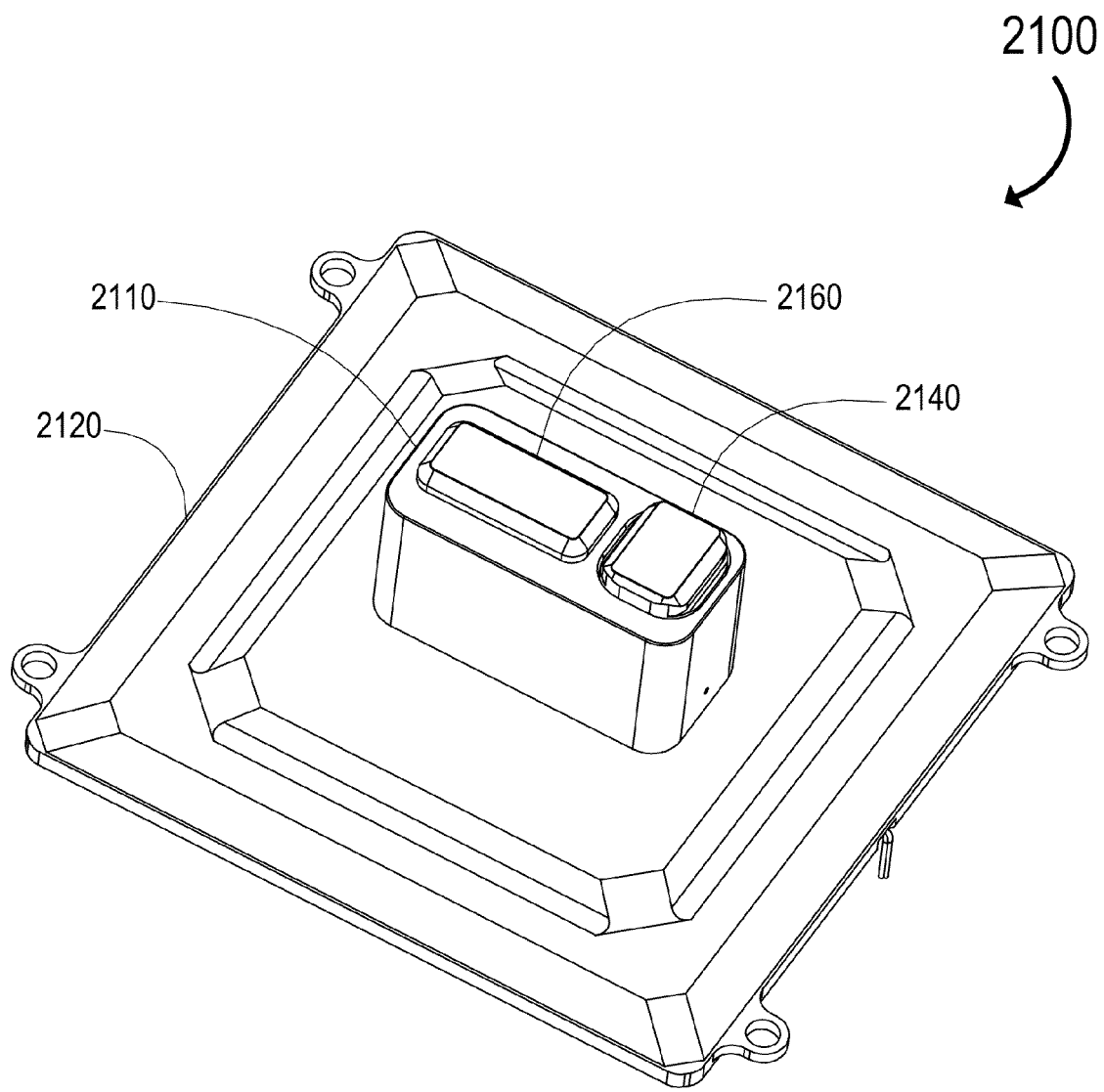
FIG. 21 is a perspective view of a pedestal assembly.

As shown in FIG. 20, a DUT 2000 has at least two IC chips 2040 and 2060 on a multi-chip substrate 2020, An IC chip 2040 has testing requirements in forces applied and temperatures of testing that are different form testing requirements in forces applied and temperatures of testing of an IC chip 2060 which is on the same multi-chip substrate 2020. For this reason a pedestal assembly 2100 shown in FIG. 21, would be beneficial in testing the multi-chip substrate 2020. The pedestal assembly 2100 has at least two separate pedestals: a compliant pedestal 2140 and a stationary pedestal 2160, housed in a pedestal support 2110 which is founded upon a pedestal base 2120. The compliant pedestal 2140 can be spring loaded or fluid actuated and configured to be contacting the IC chip 2040, while the stationary pedestal 2160 is of fixed height and is configured to contact the IC chip 2060 during simultaneous testing of both the IC chips 2040 and 2060.

Figure 22:
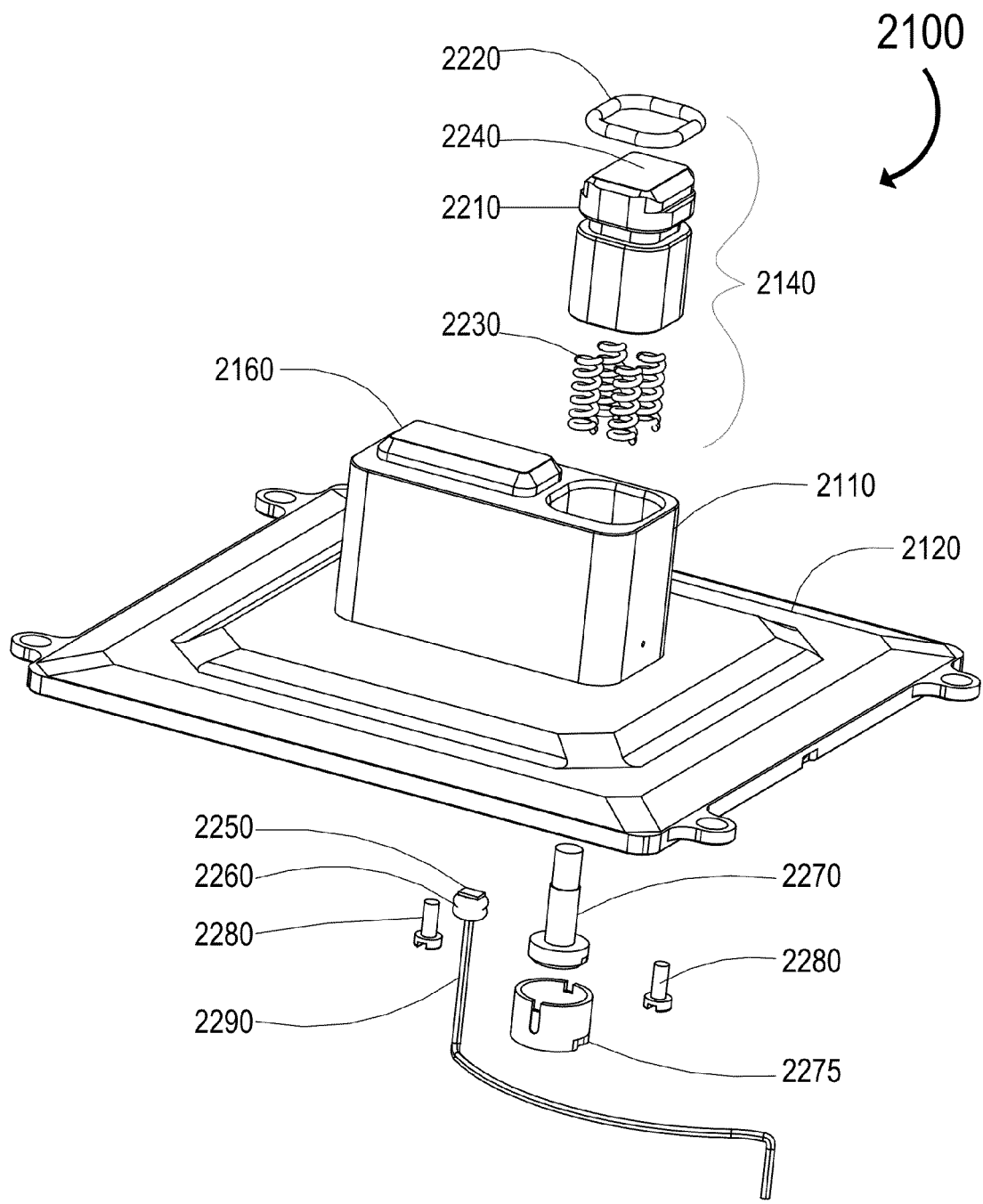
FIG. 22 is an exploded view of a compliant pedestal.

FIG. 22 shows the pedestal assembly 2100 with an exploded view of the compliant pedestal 2140. The compliant pedestal 2140 is comprised of a compliant pedestal head 2210 terminated by a contacting surface 2240 which is configured to be in direct contact with the DUT during testing, an O-ring 2220, and multiple coil springs 2230.

The O-ring 2220 keeps compliant pedestal head 2210 aligned within the bore of the pedestal support 2110 and serves as a seal to keep any thermal compound used to enhance heat conduction in the compliant pedestal 2140 from leaking.

The multiple coil springs 2230 are configured to apply a specified force to the compliant pedestal 2140 to ensure that the force exerted by the compliant pedestal 2140 to an IC chip, it is configured to contact, is the required force for this specific IC chip. The spring action of the multiple coil springs 2230 ensures that the compliant pedestal 2140 returns to its unloaded position after the test is completed.

The temperature of both the compliant pedestal 2140 and the stationary pedestal 2160 is controlled by an external temperature control system (not shown). A resistive thermal device (RTD) 2250 is a temperature sensor that detects the temperature of the pedestal assembly 2100 and feeds back the detected temperature to the external temperature control system.

The RTD 2250 is surrounded by an O-ring 2260 which helps center the RTD in its receptacle hole (not shown) in the pedestal assembly 2100 and protects the RTD 2100 from unnecessary strain from thermal expansion of the potting material. The signal from the RTD is transmitted through a cable 2290.

The compliant pedestal 2140 is supported by a screw 2270. The screw 2270 travels with the compliant pedestal 2140. Another function for the screw 2270 is to define the unloaded position of the compliant pedestal 2140 after the test is completed. This position is determined by choosing the precise length of the screw 2270.

The screw 2270 is situated in a screw cover 2275, which is fastened into the pedestal base 2120 using at least two retaining screws 2280.

In order to clarify the details of the pedestal assembly 2100 further, we include FIGS. 23, 24A, 24B, and 24C.

Figure 23:
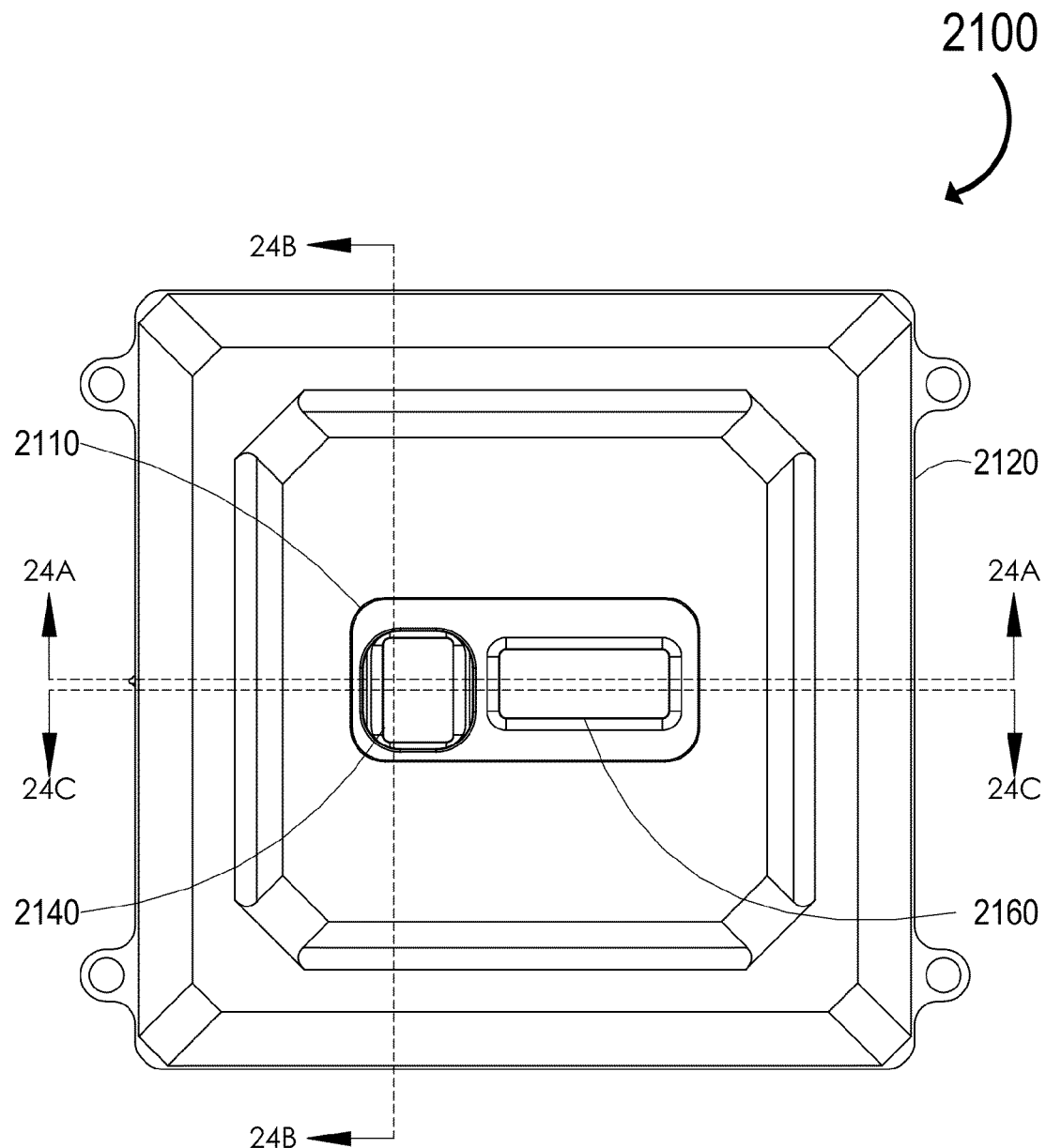
FIG. 23 shows a top view of the pedestal assembly.
Figure 24A:
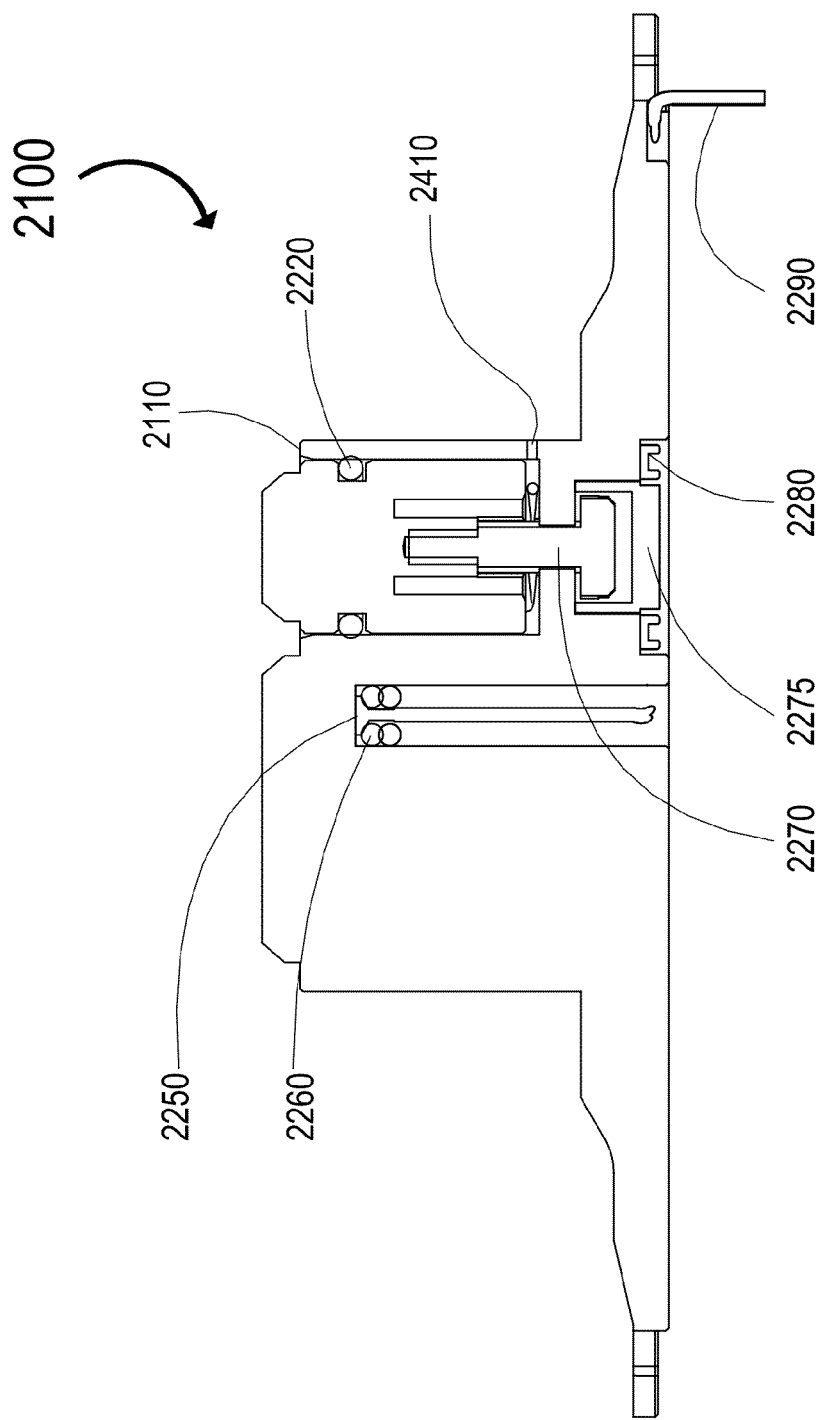
FIG. 24A is a cross-sectional view of the pedestal assembly along the line 24A-24A in FIG. 23.

FIG. 24A shows detailed view of a section into the pedestal assembly 2100 along the line 24A-24A in FIG. 23. A hole 2410 in the pedestal support 2110 provides a path for a fluid such as compressed gas to actuate the motion of the compliant pedestal 2140. A tight space exists (not shown) between the outer surface of the compliant pedestal 2140 and the inner surface of the pedestal support 2110. To ensure good thermal conduction and smooth movement of the compliant pedestal 2140, a thermal compound (not shown) can be provided in this tight space. An example of the thermal compound that can be used is thermal grease.

Figure 24B:
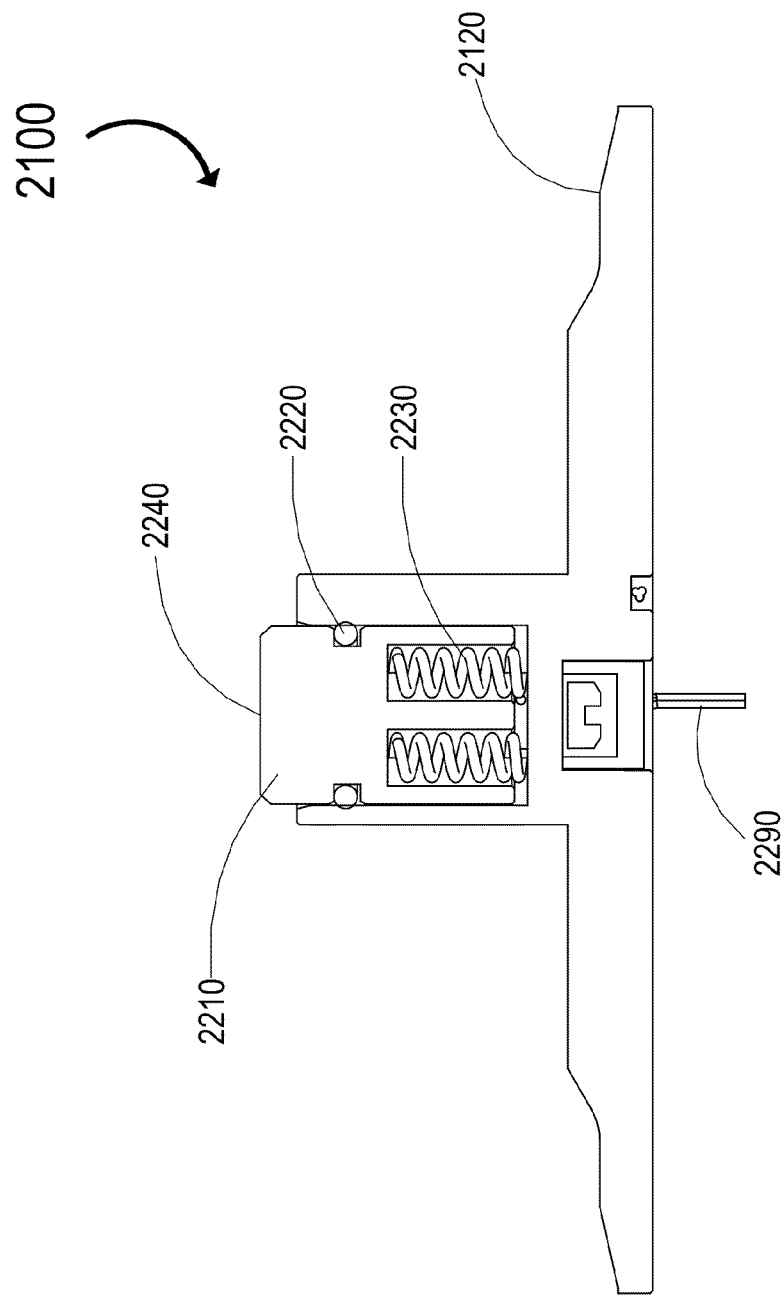
FIG. 24B is a cross-sectional view of the pedestal assembly along the line 24B-24B in FIG. 23.

FIG. 24B shows detailed view of a section into the pedestal assembly 2100 along the line 24B-24B in FIG. 23. Two of the coil springs 2230 are shown in the unloaded position (rest position). Also shown in FIG. 24B, is the external part of the cable 2290 which transmits the signal from the RTD to the external temperature control system (not shown).

Figure 24C:
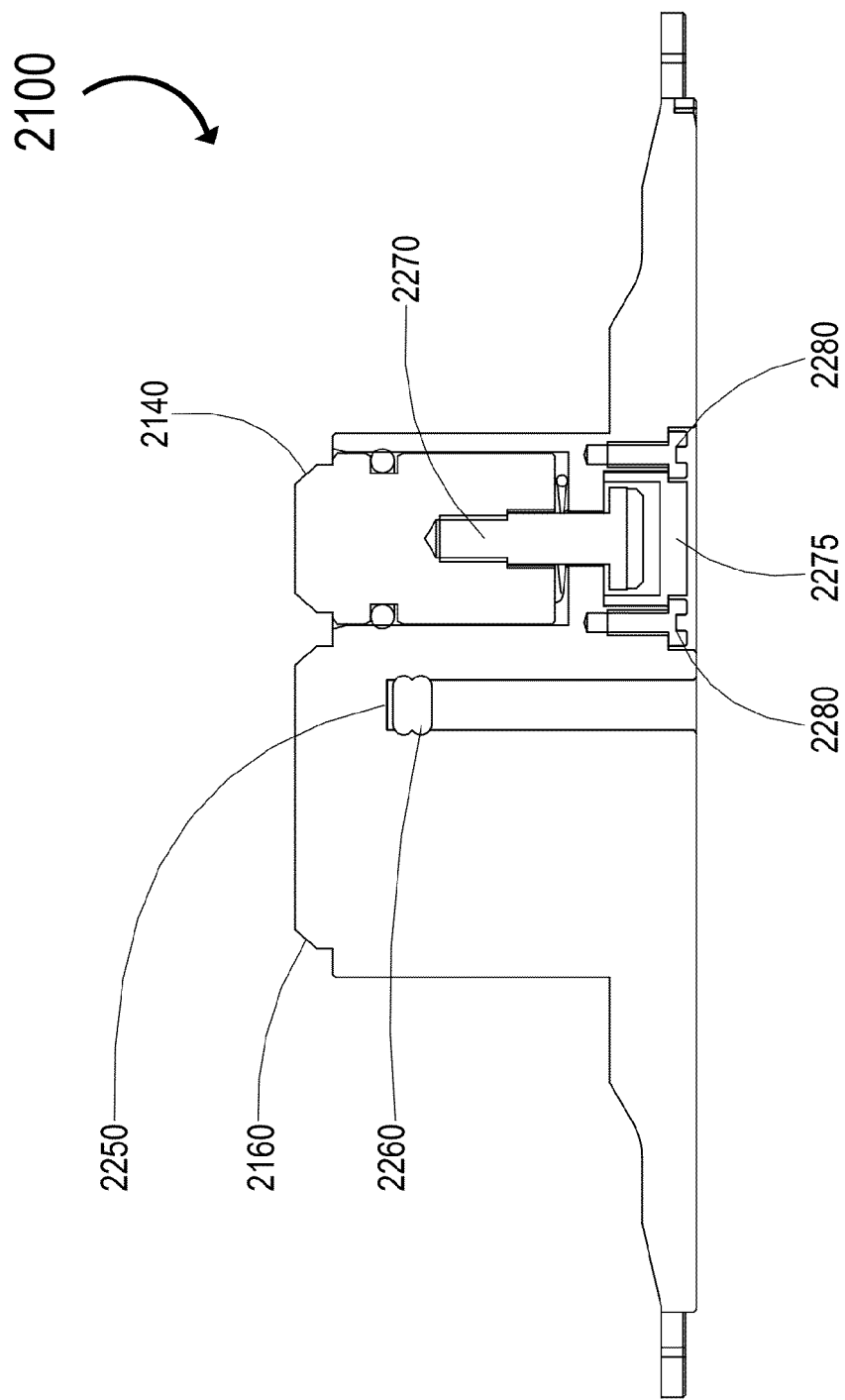
FIG. 24C is a cross-sectional view of the pedestal assembly along the line 24C-24C in FIG. 23.

FIG. 24C shows detailed view of a section into the pedestal assembly 2100 along the line 24C-24C in FIG. 23. This cross-section cuts into both the compliant pedestal 2140 and the stationary pedestal 2160. FIG. 24C illustrates how the screw 2270 is situated in the screw cover 2275, which is fastened into the pedestal base 2120 by the least two retaining screws 2280.

It is to be noted that the in some IC testing, the temperature requirements of testing different IC chips on the same multi-chip substrate can be different. In the exemplar case described above, the at least two IC chips 2040 and 2060 on the multi-chip substrate 2020 can have different testing temperature requirements. For this reason, the compliant pedestal 2140 can have a temperature control system separate from the temperature control for the stationary pedestal 2160. A beneficial alternative to the embodiment of the pedestal assembly 2100, described above is to have separate RTD's for each of the pedestals, the compliant and the stationary.

It is to be noted that because the pedestal is kept in contact with an IC during testing, the contact surfaces of the pedestal and the IC may adhere to each other and present some difficulty in disengaging at the end of testing. This adhesion between the contacting pedestal and the IC can result in from the fact that some tests require the application of a force during testing, e.g., to ensure reliable electrical contact(s). Moreover, some IC tests are done at elevated temperatures which can exacerbate any surface adhesion problem. Condensation due to rapid temperature changes of the pedestal and IC may also contribute to the adhesion problem.

Accordingly, in order to make the disengagement of the device under test (DUT) easier, additional pins can be added to the pedestal assembly. These pins can be actuated at the end of the test to push the substrate of the DUT away from the pedestal, thus facilitating the disengagement and minimizing the risk of damage to the DUT. Actuation of the pins can be automated, e.g., the pins can be spring-loaded.

Other mechanisms that can be used to facilitate the ejection of the DUT, and can include the use of a pressurized fluid such as compressed air, mechanical vibration and/or the use of electromagnets that can be activated to push the substrate of the DUT away, thus facilitating the disengagement in a relatively controlled manner.

Hence, while this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A test pedestal assembly useful in association with a thermal control unit (TCU) configured to maintain a set point temperature and a set force on an IC device under test (DUT), the test pedestal assembly comprising:
   a pedestal support;
   a pedestal assembly base configured to provide support to and to be coupled to the pedestal support;
   a stationary pedestal and at least one compliant pedestal configured to be housed inside the pedestal support and operatively coupled to the pedestal assembly base;
   a substrate pusher configured to contact the substrate of the DUT;
   a controllable force distributor configured to receive a z-axis force and controllably distribute such z-axis force between the test pedestal assembly and the substrate pusher and;
   wherein the test pedestal assembly is configured to test a DUT having a substrate and a plurality of IC chips with different heights and testing force requirements, and wherein the stationary pedestal and the at least one compliant pedestal are configured to provide the plurality of IC chips with at least one set force; and
   wherein the test pedestal assembly is configured to provide the plurality IC chips with a set point temperature.

2. The test pedestal assembly of claim 1 wherein the at least one compliant pedestal is spring-loaded or fluid actuated.

3. The test pedestal assembly of claim 1 wherein the at least one compliant pedestal has an O-ring that keeps the compliant pedestal head aligned within the bore of a pedestal support and serves as a seal to keep any thermal compound used in the compliant pedestal from leaking.

4. The test pedestal assembly of claim 1 wherein the temperature of both the stationary pedestal and the at least one compliant pedestal is controlled by an external temperature control system.

5. The test pedestal assembly of claim 1 wherein the at least one compliant pedestal and the stationary pedestal are further configured to provide the plurality of IC chips with at least two set forces.

6. The test pedestal of claim 4 wherein the external temperature control system includes a resistive thermal device (RTD) sensor configured to detect and feedback a temperature of the stationary pedestal and the at least one compliant pedestal.

7. An integrated circuit (IC) device tester configured to maintain a set point temperature and a set force on an IC device under test (DUT) having a die attached to a substrate, the tester comprising:
   a thermal control unit including:
      a test pedestal assembly comprising:
         a pedestal support;
         a pedestal assembly base configured to provide support to and to be coupled to the pedestal support;
         a stationary pedestal and at least one compliant pedestal configured to be housed inside the pedestal support and operatively coupled to the pedestal assembly base;
         wherein the test pedestal assembly is configured to test a DUT having a substrate and a plurality of IC chips with different heights and testing force requirements, and wherein the stationary pedestal and the at least one compliant pedestal are configured to provide the plurality of IC chips with at least one set force; and
         wherein the test pedestal assembly is configured to provide the plurality IC chips with a set point temperature; and
      a heat exchange plate facilitating the heat conduction to and from the heat-conductive test pedestal assembly and having an attached temperature sensor for monitoring the temperature;
      a temperature-control fluid circulation block having a fluid inlet and a fluid outlet configured to circulate a fluid therethrough, the block in stacked relationship along a z-axis with the heat conductive test pedestal assembly;
      a thermally-conductive heater between the heat exchange plate and the fluid circulation block configured to provide heat to the test pedestal assembly through heat exchange plate;
      a substrate pusher configured to contact the substrate of the DUT; and
      a controllable force distributor configured to receive a z-axis force and controllably distribute such z-axis force between the test pedestal assembly and the substrate pusher.

8. The tester of claim 7 wherein the at least one compliant pedestal is spring-loaded or fluid actuated.

9. The tester of claim 7 wherein the at least one compliant pedestal has an O-ring that keeps the compliant pedestal head aligned within the bore of a pedestal support and serves as a seal to keep any thermal compound used in the compliant pedestal from leaking.

10. The tester of claim 7 wherein the temperature of both the stationary pedestal and the at least one compliant pedestal is controlled by an external temperature control system.

11. The tester of claim 10 wherein the external temperature control system includes a resistive thermal device (RTD) sensor configured to detect and feedback a temperature of the stationary pedestal and the at least one compliant pedestal.

12. The tester of claim 7 wherein the at least one compliant pedestal and the stationary pedestal are further configured to provide the plurality of IC chips with at least two set forces.

* * * * *